US009613285B2

(12) United States Patent
Gardiner et al.

(10) Patent No.: US 9,613,285 B2
(45) Date of Patent: Apr. 4, 2017

(54) COMPRESSIVE SENSING WITH LOCAL GEOMETRIC FEATURES

(71) Applicants: THE CHARLES STARK DRAPER LABORATORY, INC., Cambridge, MA (US); MASSACHUSETTS INSTITUTE OF TECHNOLOGY, Cambridge, MA (US)

(72) Inventors: Brian Gardiner, Washington, DC (US); Rishi Gupta, Cupertino, CA (US); Yaron Rachlin, Newton, MA (US); Christopher C. Yu, Belmont, MA (US); Piotr Indyk, Cambridge, MA (US); Eric Price, Cambridge, MA (US)

(73) Assignees: THE CHARLES STARK DRAPER LABORATORY, INC., Cambridge, MA (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 89 days.

(21) Appl. No.: 14/695,709

(22) Filed: Apr. 24, 2015

(65) Prior Publication Data

US 2016/0203382 A1    Jul. 14, 2016

Related U.S. Application Data

(63) Continuation of application No. 14/660,434, filed on Mar. 17, 2015, now abandoned, which is a
(Continued)

(51) Int. Cl.
*G06K 9/00* (2006.01)
*G06K 9/46* (2006.01)
(Continued)

(52) U.S. Cl.
CPC ............. *G06K 9/46* (2013.01); *G06K 9/60* (2013.01); *G06T 9/00* (2013.01); *H03M 7/3062* (2013.01); *H04N 19/90* (2014.11)

(58) Field of Classification Search
None
See application file for complete search history.

(56) References Cited

U.S. PATENT DOCUMENTS 6,525,722 B1    2/2003 Deering
7,076,104 B1    7/2006 Keith et al.
(Continued)

FOREIGN PATENT DOCUMENTS

WO    2010144259 A1    12/2010
WO    2011090798 A1    7/2011

OTHER PUBLICATIONS

Gilbert et al., "One sketch for all: Fast algorithms for Compressed Sensing", STOC'07, Jun. 11-13, 2007, San Diego, California, USA. Copyright 2007 ACM 978-1-59593-631-8/07/000, pp. 1-10, available online at http://web.eecs.umich.edu/~martinjs/papers/hhs-stoc.pdf.
(Continued)

*Primary Examiner* — Hadi Akhavannik
(74) *Attorney, Agent, or Firm* — Lando & Anastasi, LLP

(57) ABSTRACT

Methods and apparatuses for compressive sensing that enable efficient recovery of features in an input signal based on acquiring a few measurements corresponding to the input signal. One method of compressive sensing includes folding an image to generate first and second folds, and recovering a feature of the image based on the first and second folds without reconstructing the image. One example of a compressive sensing apparatus includes a lens, a focal plane array coupled to the lens and configured to generate first and second folds based on the image, and a decoder configured to receive the first and second folds and to recover a feature
(Continued)

of the image without reconstructing the image. The feature may be a local geometric feature or a corner. Compressive sensing methods and apparatuses for determining translation and rotation between two images are also disclosed.

21 Claims, 47 Drawing Sheets

Related U.S. Application Data continuation of application No. 13/800,332, filed on Mar. 13, 2013, now Pat. No. 8,983,198, said application No. 14/660,434 is a continuation of application No. 13/800,375, filed on Mar. 13, 2013, now Pat. No. 9,213,916, application No. 14/695,709, which is a continuation of application No. 14/659,164, filed on Mar. 16, 2015, now abandoned, which is a continuation of application No. 13/800,332, and a continuation of application No. 13/800,375, application No. 14/695,709, which is a continuation of application No. 13/800,375.

(60) Provisional application No. 61/734,165, filed on Dec. 6, 2012, provisional application No. 61/676,413, filed on Jul. 27, 2012, provisional application No. 61/614,193, filed on Mar. 22, 2012, provisional application No. 61/734,165, filed on Dec. 6, 2012, provisional application No. 61/676,413, filed on Jul. 27, 2012, provisional application No. 61/614,193, filed on Mar. 22, 2012.

(51) Int. Cl.
  *G06K 9/60* (2006.01)
  *G06T 9/00* (2006.01)
  *H04N 19/90* (2014.01)
  *H03M 7/30* (2006.01)

(56) References Cited

U.S. PATENT DOCUMENTS

| | | | |
|---|---|---|---|
| 7,145,556 | B2 | 12/2006 | Pettersson |
| 7,271,747 | B2 | 9/2007 | Baraniuk et al. |
| 7,991,196 | B2 | 8/2011 | Tener et al. |
| 8,199,244 | B2 | 6/2012 | Baraniuk et al. |
| 2004/0190762 | A1* | 9/2004 | Dowski, Jr. ............ G02B 5/284 382/128 |
| 2007/0086544 | A1 | 4/2007 | Fudge et al. |
| 2007/0245119 | A1 | 10/2007 | Hoppe |
| 2008/0226064 | A1 | 9/2008 | Douguet et al. |
| 2008/0253665 | A1 | 10/2008 | Mitarai et al. |
| 2009/0003707 | A1 | 1/2009 | Fukuda et al. |
| 2010/0027686 | A1* | 2/2010 | Zuo ........................ G06T 9/00 375/240.29 |
| 2010/0195901 | A1 | 8/2010 | Andrus et al. |
| 2010/0246651 | A1 | 9/2010 | Baheti et al. |
| 2010/0254572 | A1 | 10/2010 | Tener et al. |
| 2011/0142339 | A1 | 6/2011 | Singh et al. |
| 2011/0293158 | A1* | 12/2011 | Popescu ................ A61B 5/055 382/131 |
| 2012/0002890 | A1 | 1/2012 | Mathew |
| 2012/0185177 | A1 | 7/2012 | Hannon et al. |
| 2013/0088723 | A1 | 4/2013 | Feldkhun |
| 2014/0193031 | A1 | 7/2014 | Gardiner et al. |
| 2014/0193076 | A1 | 7/2014 | Gardiner et al. |

OTHER PUBLICATIONS

Candés, Emmanuel J., et al., "An Introduction to Compressive Sampling", IEEE Signal Processing Magazine, Mar. 2008.
Gupta, Rishi, "Fast Recovery for Compressive Sensing", Final Presentation, Dec. 6, 2010.
Oike, Yusuke et al., "CMOS Image Sensor With Per-Column åD ADC and Programmable Compressed Sensing", IEEE Journal of Solid-State Circuits, vol. 48, No. 1, Jan. 2013.

* cited by examiner

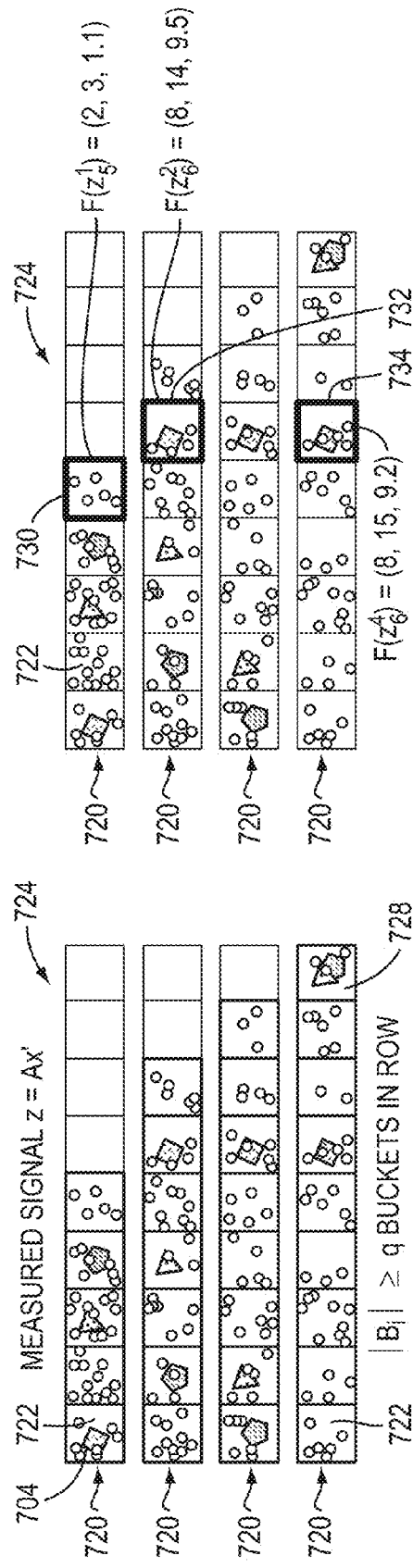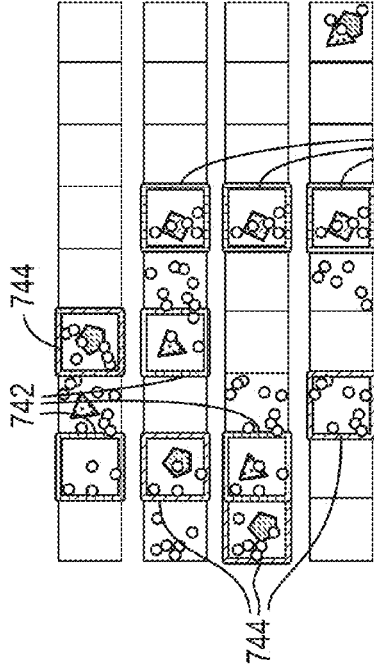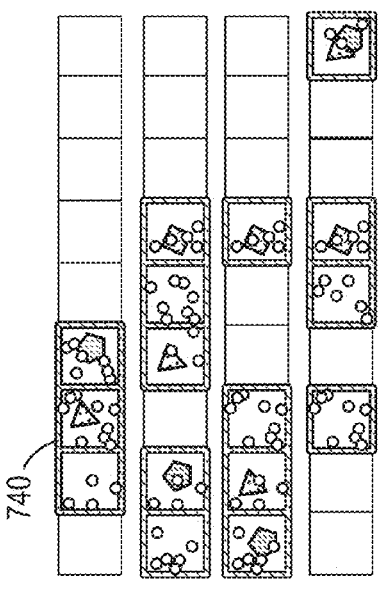
FIG. 7E
FIG. 7F
FIG. 7G
FIG. 7H

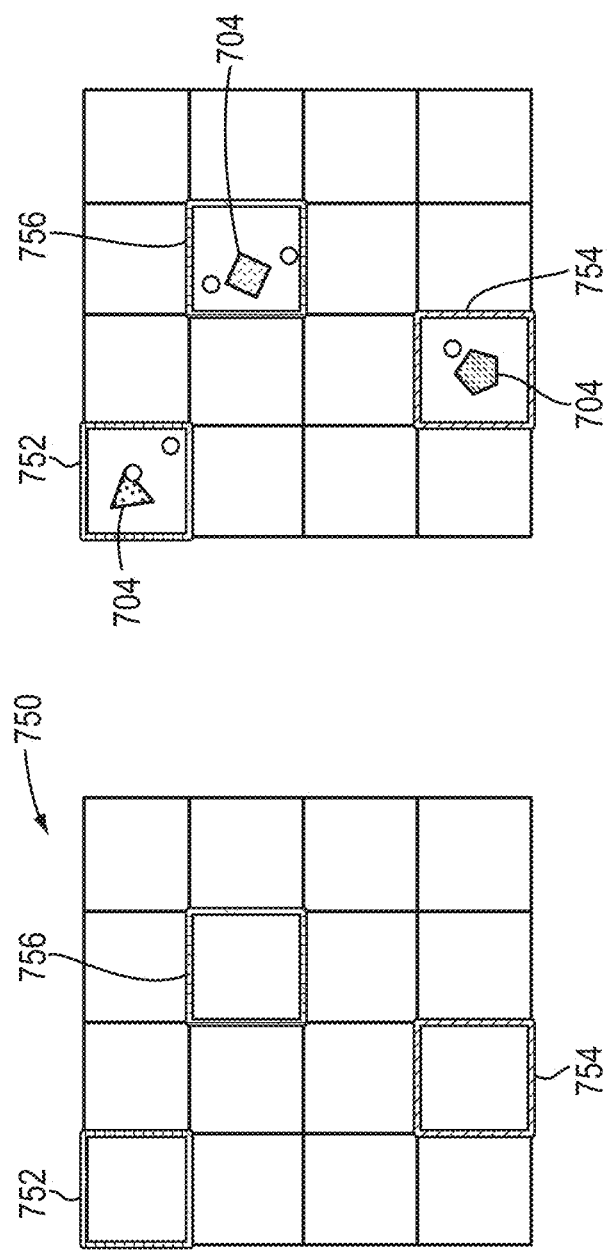

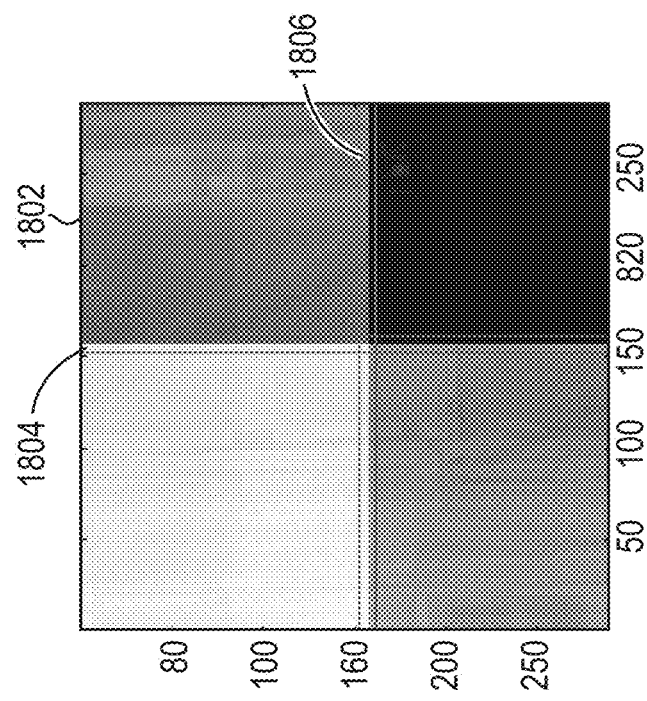
FIG. 18

| $p_{1a} == p_{1b}$ | $p_{2a} == p_{2b}$ | COMPRESSION RATIO |
|---|---|---|
| 101 | 104 | 0.0200 |
| 143 | 147 | 0.0401 |
| 176 | 179 | 0.0601 |
| 203 | 207 | 0.0802 |
| 227 | 231 | 0.1000 |
| 249 | 253 | 0.1202 |
| 269 | 273 | 0.1401 |
| 287 | 291 | 0.1593 |
| 305 | 309 | 0.1798 |
| 322 | 325 | 0.1996 |
| 338 | 341 | 0.2198 |
| 353 | 357 | 0.2404 |
| 367 | 371 | 0.2597 |
| 382 | 385 | 0.2805 |
| 395 | 399 | 0.3006 |
| 409 | 412 | 0.3214 |
| 421 | 424 | 0.3405 |
| 433 | 436 | 0.3601 |
| 445 | 448 | 0.3803 |
| 459 | 457 | 0.4001 |

FIG. 21

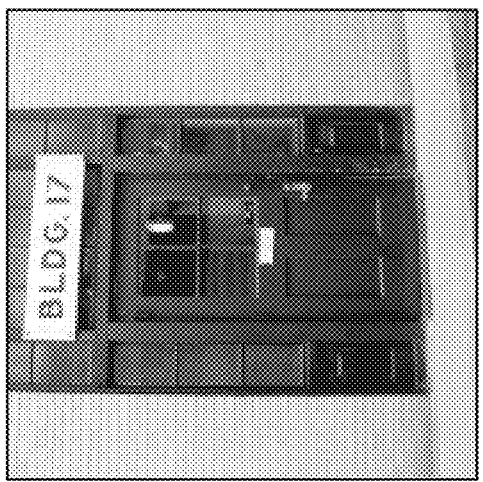
FIG. 22 A  IMAGE 1
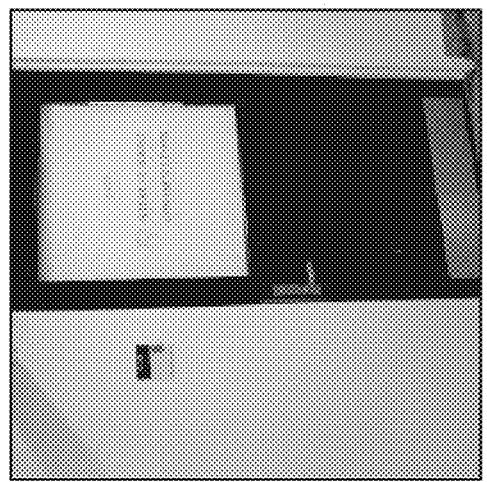
FIG. 22 B  IMAGE 2
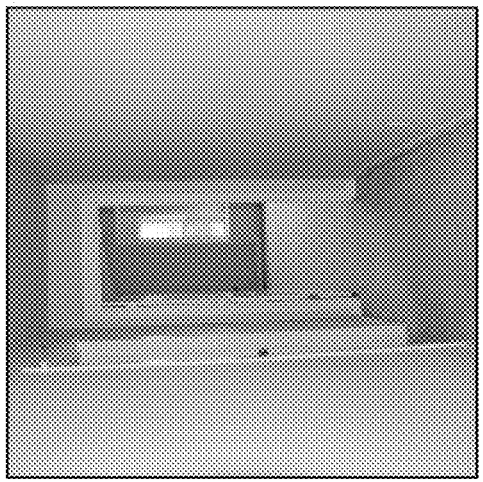
FIG. 22 C  IMAGE 3
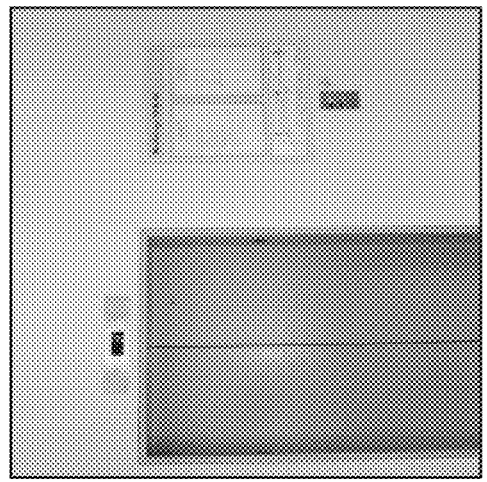
FIG. 22 D  IMAGE 4

FIG. 26 A  IMAGE 1
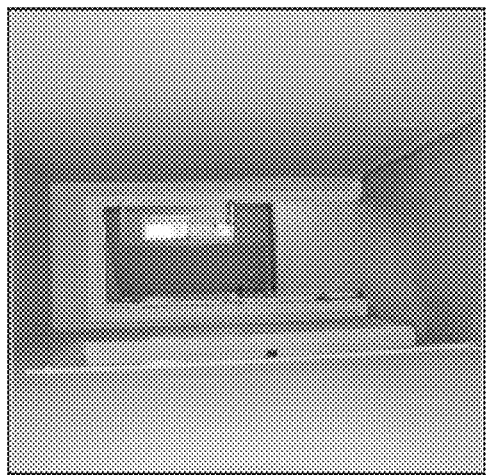
FIG. 26 C  IMAGE 3
FIG. 26 B  IMAGE 1 TRANSLATED
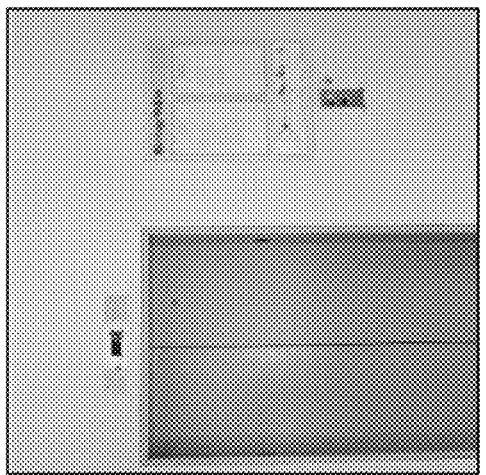
FIG. 26 D  IMAGE 3 ROTATED

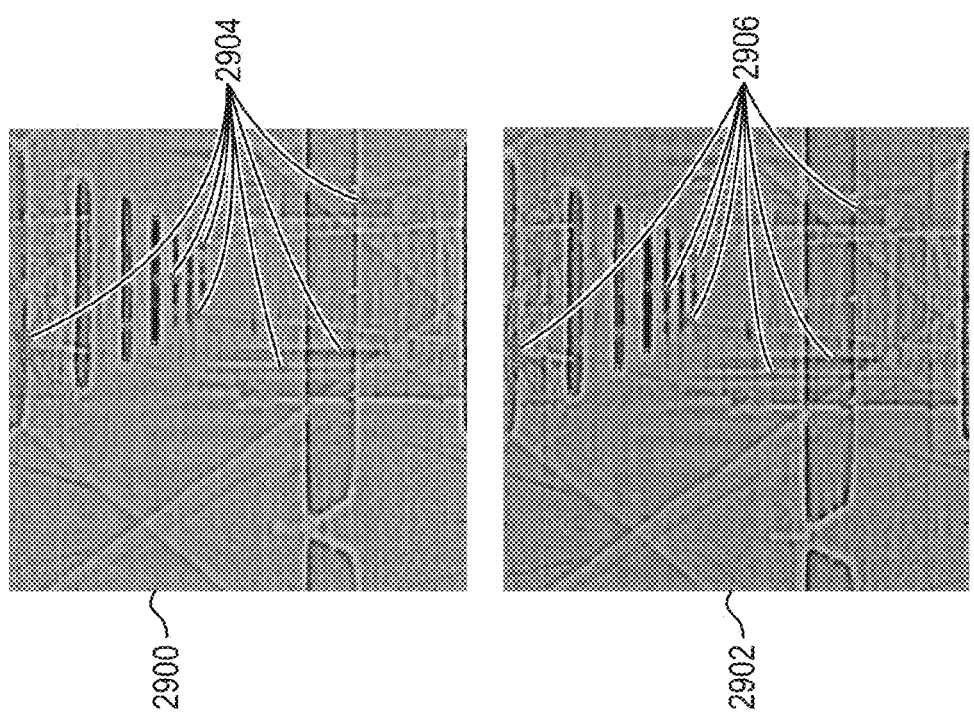
FIG. 29

| FOLD SIZES | COMPRESSION RATIO | FOLDING ESTIMATE | TRADITIONAL CS ESTIMATE |
|---|---|---|---|
| [11, 12] | 0.000253 | [100, 100] | [31, 182] |
| [17, 18] | 0.000585 | [100, 100] | [981, 629] |
| [23, 24] | 0.001054 | [100, 100] | [569, 620] |
| [33, 34] | 0.002141 | [100, 100] | [845, 131] |
| [46, 47] | 0.004125 | [100, 100] | [20, 0] |
| [57, 58] | 0.006307 | [100, 100] | [0, 370] |
| [65, 66] | 0.008183 | [100, 100] | [0, 98] |
| [73, 74] | 0.010304 | [100, 100] | [101, 100] |
| [81, 82] | 0.012670 | [100, 100] | [100, 100] |
| [89, 90] | 0.015279 | [100, 100] | [100, 100] |
| [96, 97] | 0.017762 | [100, 100] | [100, 100] |
| [103, 104] | 0.020432 | [100, 100] | [100, 100] |
| [126, 127] | 0.030522 | [100, 100] | [100, 100] |
| [162, 163] | 0.050366 | [100, 100] | [100, 100] |
| [229, 230] | 0.100461 | [100, 100] | [100, 100] |

FIG. 36

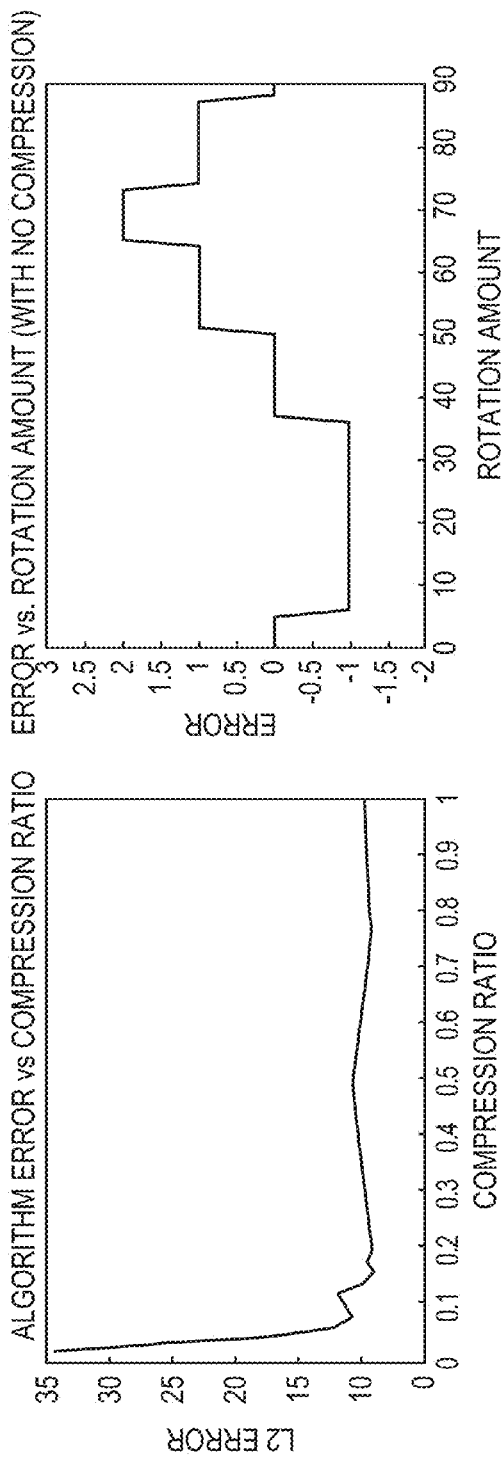
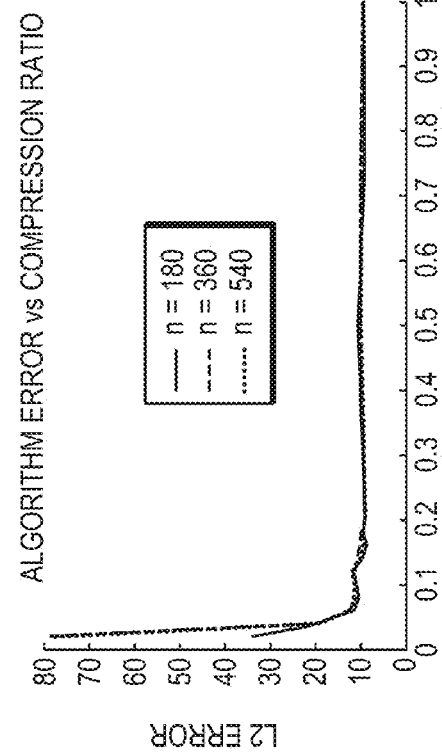
FIG. 43A
FIG. 43B
FIG. 43C

COMPRESSIVE SENSING WITH LOCAL GEOMETRIC FEATURES

CROSS REFERENCE TO RELATED APPLICATIONS

This application claims priority under 35 U.S.C. §120 to U.S. patent application Ser. No. 14/660,434 filed on Mar. 17, 2015 and titled "COMPRESSIVE SENSING WITH LOCAL GEOMETRIC FEATURES," and to U.S. patent application Ser. No. 14/659,164 filed on Mar. 16, 2015 and titled "COMPRESSIVE SENSING WITH LOCAL GEOMETRIC FEATURES," both of which claim priority under 35 U.S.C. §120 to U.S. patent application Ser. No. 13/800,332, filed on Mar. 13, 2013 and titled "COMPRESSIVE SENSING WITH LOCAL GEOMETRIC FEATURES," now U.S. Pat. No. 8,983,198, and to U.S. patent application Ser. No. 13/800,375, filed on Mar. 13, 2013 and titled "COMPRESSIVE SENSING WITH LOCAL GEOMETRIC FEATURES," both of which in turn claim priority under 35 U.S.C. 119(e) to U.S. Provisional Patent Application No. 61/614,193, filed on Mar. 22, 2012 and titled "COMPRESSIVE SENSING FOR LOCAL GEOMETRIC FEATURES," to U.S. Provisional Patent Application No. 61/676,413, filed on Jul. 27, 2012 and titled "COMPRESSIVE SENSING WITH LOCAL GEOMETRIC FEATURES," and to U.S. Provisional Patent Application No. 61/734,165, filed on Dec. 6, 2012 and titled "COMPRESSIVE SENSING FOR LOCAL GEOMETRIC FEATURES," all of which are herein incorporated by reference in their entireties. This application further claims priority under 35 U.S.C. §120 to U.S. patent application Ser. No. 13/800,375 filed on Mar. 13, 2013 and titled "COMPRESSIVE SENSING WITH LOCAL GEOMETRIC FEATURES."

FEDERALLY SPONSORED RESEARCH

This invention was made with government support under Grant No. CCF-0728645 awarded by the National Science Foundation. The U.S. government has certain rights in this invention.

BACKGROUND

1. Field of the Invention

The present disclosure generally relates to signal processing, and more specifically to compressive signal processing to efficiently identify geometric features of a signal.

2. Description of Background

Traditional approaches to identification of geometric features typically acquire the entire signal via uniform sampling, and then scan the entire signal to identify features. Standard compressive sensing based approaches recover the entire signal from compressive samples, and then identify features by scanning the reconstructed signal. Optical superposition or multiplexing methods superimpose different parts of a scene to enable wide field of view cameras for target detection and tracking.

The conventional approaches described above have several disadvantages. For example, uniform sampling based methods expend significant energy acquiring the entire signal, even though only small parts of the signal contain the features of interest. Standard compressive sensing based approaches require a computationally expensive algorithm to recover the signal; the recovered signal is then used as an input to feature identification. Furthermore, even the most sparse compressive sensing encoding matrices have a number of nonzeros per column that is a logarithmic function of signal length and sparsity. Such matrices may be challenging to instantiate in hardware. Optical superposition methods superimpose different parts of the image in such a way that the recovery of the target position in the original scene is ambiguous, and requires additional knowledge about the target object such as a dynamic model.

SUMMARY OF INVENTION

Aspects and embodiments of the present disclosure are directed to efficiently acquiring geometric features of a signal using few linear measurements. In contrast to conventional approaches, various embodiments of compressive sensing systems and methods disclosed herein enable acquiring or recovering features without reconstructing the signal. In one example, methods and apparatuses disclosed herein may be used for recovering features in images or signals that consist of a small number of local geometric objects, for example, muzzle flash or star images. Algorithms and processes disclosed herein for recovering these features in the original scene are efficient—their complexity, for at least some applications, is sub-linear in the size of the underlying signal.

Embodiments of methods and apparatuses of the present disclosure may generally apply to any application where local objects in an image need to be efficiently identified and localized. Some examples of applications include, but are not limited to, star cameras and systems for efficiently identifying stars in a star-field image, wide field of view cameras for surveillance and environment awareness for soldiers, detection and localization of localized targets/objects of interest in a wide field of view camera, and cameras for vision aided navigation. In other examples, embodiments of the methods and apparatuses disclosed herein may be used for acquiring or detecting corners from an image, such as for vision-based navigation. Embodiments may also be used for acquiring macro-statistics about an image, such as a dominant edge orientation. Embodiments may be used for determining rotation based on the dominant edge orientation.

According to one embodiment, a method of compressive sensing comprises folding an image to generate a first fold and a second fold, and recovering a feature of the image, using a processor, based on the first fold and the second fold without reconstructing the image.

In one example of the method the feature is a local geometric feature. Each of the first fold and the second fold may be a compressed representation of the image. In one example folding the image includes receiving an analog image and folding the analog image to generate the first fold and the second fold, and the method further includes digitizing the first fold and the second fold. Recovering the feature may then be based on the digitized first and second folds. In another example in which the image includes N pixels and k features, folding the image includes acquiring a plurality of measurements corresponding to the image, the plurality of measurements being O(k log kN) and being less than N, wherein N is a positive integer. Recovering may include recovering a plurality of features of the k features based on the plurality of measurements in a time sublinear in N. In one example folding includes applying a hashing function. In one example in which the image includes a plurality of cells, applying the hashing function includes applying a pairwise independent hashing function to a numbering of the plurality of cells. Folding may include applying an error correcting code. The error correcting code may include one of a Chinese Remainder Theorem code and a Reed Solomon code.

In another example of the method recovering includes calculating a plurality of feature vectors based on the first fold and the second fold, thresholding the plurality of feature vectors, clustering the plurality of thresholded feature vectors to generate a plurality of clusters, and decoding a cluster of the plurality of clusters to recover the feature. In one example recovering includes recovering a plurality of features of the image and decoding includes decoding the plurality of clusters to recover the plurality of features. In another example folding includes encoding based on a Chinese Remainder Theorem code and decoding a cluster includes decoding based on the Chinese Remainder Theorem code.

In one example the first fold has a first size and the second fold has a second size, the first size being different from the second size, each of the first size and the second size being less than a size of the image. In one example the first size and the second size are coprime and folding includes applying a Chinese Remainder Theorem code.

In another example the feature is a corner and recovering the feature includes applying corner detection to each of the first fold and the second fold to generate a first plurality of corners based on the first fold and to generate a second plurality of corners based on the second fold. Recovering the feature may further include detecting an artificial edge created by the folding in at least one of the first fold and the second fold, and eliminating a subset of at least one of the first plurality of corners and the second plurality of corners based on the artificial edge. In one example eliminating includes generating a first plurality of pruned corners and a second plurality of pruned corners and recovering the feature further includes matching a first corner of the first plurality of pruned corners with a corresponding second corner of the second plurality of pruned corners. In another example recovering the feature further includes matching a first corner of the first plurality of corners with a corresponding second corner of the second plurality of corners, and decoding to recover the feature based on the first corner and the second corner. The matching may further include calculating a plurality of cross correlation values, each respective cross correlation value corresponding to a respective first window and a respective second window, the respective first window being associated with a respective first corner of the first plurality of corners and the respective second window being associated with a respective second corner of the second plurality of corners, pruning a candidate match based on a cross correlation value of the plurality of cross correlation values, and matching each respective corner of the first plurality of corners with a respective second corner of the second plurality of corners. The method may further including thresholding the plurality of cross correlation values and wherein pruning the candidate match includes pruning the candidate match based on a thresholded cross correlation value. Recovering may include recovering a plurality of features of the image, the plurality of features being a plurality of corners, and decoding includes decoding to recover each feature of the plurality of features in response to matching each respective corner of the first plurality of corners with a respective second corner of the second plurality of corners.

According to another embodiment, an apparatus for compressive sensing comprises a lens, a focal plane array coupled to the lens so as to receive an image, the focal plane array being configured to generate a first fold and a second fold based on the image, and a decoder configured to receive the first fold and the second fold and to recover a feature of the image without reconstructing the image.

In one example the feature is a local geometric feature. In another example each of the first fold and the second fold is a compressed representation of the image. The apparatus may further include a digitizer configured to receive the first fold and the second fold and to output a digitized first fold and a digitized second fold, wherein the decoder is configured to receive the digitized first fold and the digitized second fold and to output the feature of the image based on the digitized first fold and the digitized second fold without reconstructing the image. In one example the image includes N pixels and k features and the focal plane array is configured to acquire a plurality of measurements corresponding to the image, the plurality of measurements being less than N. In one example the plurality of measurements are O(k log kN).

In another example, the apparatus is configured to recover a plurality of features of the k features based on the plurality of measurements in a time sublinear in N. In another example, the focal plane array is configured to apply a hashing function. The hashing function may be a pairwise independent hashing function. In another example, the focal plane array is configured to apply an error correcting code. The error correcting code may be one of a Chinese Remainder Theorem code and a Reed Solomon code. In another example the decoder is further configured to calculate a plurality of feature vectors based on the first fold and the second fold, threshold the plurality of feature vectors, cluster the plurality of thresholded feature vectors to generate a plurality of clusters, and decode a cluster of the plurality of clusters to recover the feature. The decoder may be further configured to recover a plurality of features of the image and to decode the plurality of clusters to recover the plurality of features.

In one example the focal plane array is configured to generate the first fold and the second fold by encoding based on a Chinese Remainder Theorem code and the decoder is configured to decode based on the Chinese Remainder Theorem code. In another example the first fold has a first size and the second fold has a second size, the first size being different from the second size, each of the first size and the second size being less than a size of the image. The first size and the second size may be coprime, and the focal plane array may be configured to apply a Chinese Remainder Theorem code. In another example the feature is a corner and the decoder is configured to apply corner detection to each of the first fold and the second fold to generate a first plurality of corners based on the first fold and to generate a second plurality of corners based on the second fold. The decoder may be further configured to identify an artificial edge in at least one of the first fold and the second fold, and eliminate a subset of at least one of the first plurality of corners and the second plurality of corners based on the artificial edge. In one example the decoder is further configured to generate a first plurality of pruned corners and a second plurality of pruned corners and to match a first corner of the first plurality of pruned corners with a corresponding second corner of the second plurality of pruned corners. In another example the decoder is further configured to match a first corner of the first plurality of corners with a corresponding second corner of the second plurality of corners, and decode to recover the feature based on the first corner and the second corner. The decoder may be further configured to calculate a plurality of cross correlation values, each respective cross correlation value corresponding to a respective first window and a respective second window, the respective first window being associated with a respective first corner of the first plurality of corners and the respective second window being associated with a respective second corner of the second plurality of corners, prune a candidate match based on a cross correlation value of the plurality of cross correlation values, and match each respective corner of the first plurality of corners with a respective second corner of the second plurality of corners. In one example the decoder is configured to threshold the plurality of cross correlation values and to prune the candidate match based on a thresholded cross correlation value. In another example the decoder is configured to recover a plurality of features of the image, the plurality of features being a plurality of corners, in response to matching each respective corner of the first plurality of corners with a respective second corner of the second plurality of corners.

According to another embodiment, a method of compressive sensing comprises folding a first image to generate a first fold and a second fold, folding a second image to generate a third fold and a fourth fold, and determining a translation between the first image and the second image, using a processor, based on the first fold, the second fold, the third fold and the fourth fold, without reconstructing each of the first image and the second image.

In one example each of the first fold and the third fold has a first size and each of the second fold and the fourth fold has a second size, the second size being different from the first size. In another example determining the translation includes calculating a first phase correlation function based on the first fold and the third fold, calculating a second phase correlation function based on the second fold and the fourth fold, determining a first peak based on the first phase correlation function, determining a second peak based on the second phase correlation function, and decoding to determine the translation based on the first peak and the second peak. In another example folding each of the first image and the second image includes encoding based on a Chinese Remainder Theorem code and wherein decoding includes decoding based on the Chinese Remainder Theorem code.

According to another embodiment, a method of compressive sensing comprises folding a first image to generate a first fold, folding a second image to generate a second fold, and determining a rotation between the first image and the second image, using a processor, based on the first fold and the second fold, without reconstructing each of the first image and the second image.

In one example, determining the rotation includes calculating a first distribution of gradient angles based on the first fold, calculating a second distribution of gradient angles based on the second fold, and correlating the first distribution and the second distribution.

According to another embodiment, an apparatus for compressive sensing comprises an encoder configured to receive a first image and a second image, to generate a first fold and a second fold based on the first image and to generate a third fold and a fourth fold based on the second image, and a decoder configured to determine a translation between the first image and the second image, based on the first fold, the second fold, the third fold and the fourth fold, without reconstructing each of the first image and the second image.

In one example the encoder includes a focal plane array. In another example, each of the first fold and the third fold has a first size and each of the second fold and the fourth fold has a second size, the second size being different from the first size. The decoder may be further configured to calculate a first phase correlation function based on the first fold and the third fold, calculate a second phase correlation function based on the second fold and the fourth fold, determine a first peak based on the first phase correlation function, determine a second peak based on the second phase correlation function, and determine the translation based on the first peak and the second peak.

According to another embodiment, an apparatus for compressive sensing, comprises an encoder configured to receive a first image and a second image, to generate a first fold based on the first image and to generate a second fold based on the second image, and a processor configured to determine a rotation between the first image and the second image, based on the first fold and the second fold, without reconstructing each of the first image and the second image.

In one example the encoder includes a focal plane array. In another example, the processor is further configured to calculate a first distribution of gradient angles based on the first fold, calculate a second distribution of gradient angles based on the second fold, and correlate the first distribution and the second distribution.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIGS. 7A to 7J illustrate one example of an application of a method of compressive sensing according to aspects of the present invention;

FIG. 18 illustrates one example of artificial edges created by folding and corresponding regions of the fold that are ignored according to aspects of the present invention;

FIG. 21 is a table of fold sizes and corresponding compression ratios for an input image size of 1024 by 1024 according to aspects of the present invention;

FIGS. 22A to 22D illustrate a plurality of test images used in simulations according to aspects of the present invention;

FIG. 26A to 26D illustrate decoded corners for two different scenes according to aspects of the present invention;

FIG. 29 illustrate one example of pruning to reduce false positives according to aspects of the present invention;

FIG. 36 is a table of results of applying an embodiment of a compressive sensing method for translation determination to the test image of FIG. 34 according to aspects of the present invention;

FIGS. 43A to 43C illustrate additional results of applying an embodiment of a compressive sensing method for rotation determination to the test image of FIG. 41 according to aspects of the present invention;

DETAILED DESCRIPTION

Figure 1:
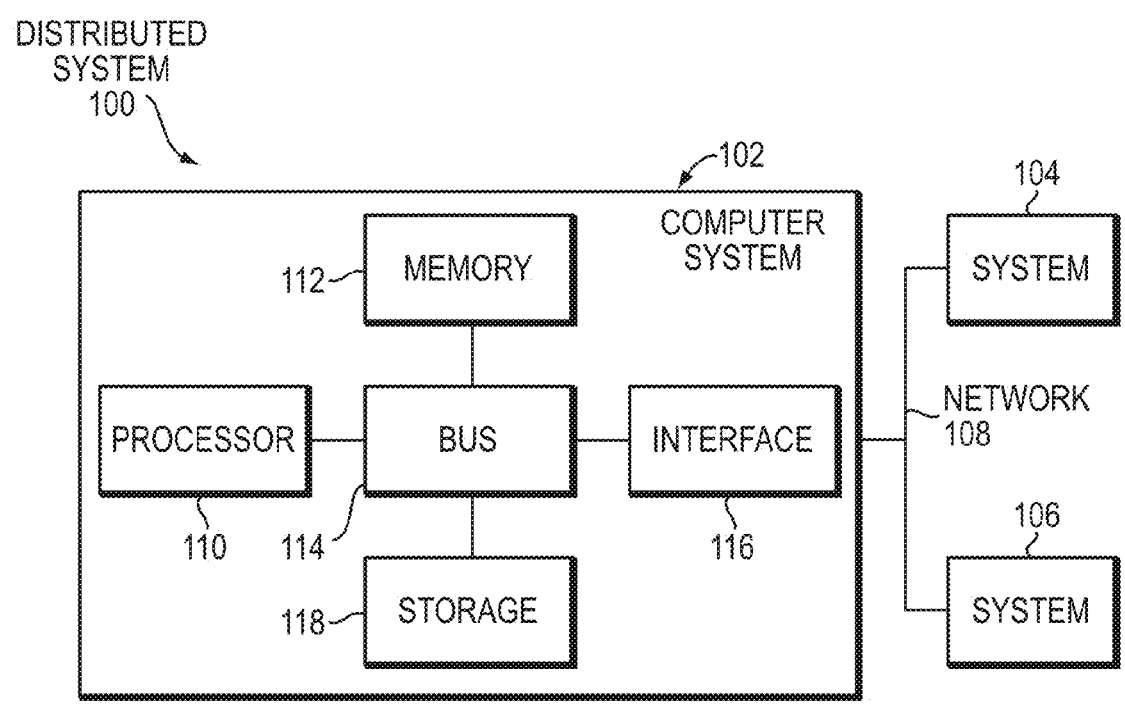
FIG. 1 illustrates one example of a computer system upon which various aspects of the present embodiments may be implemented.

Compressive sensing methods and systems disclosed herein enable efficiently recovering features of a signal without reconstructing the signal. As used herein, a signal may include for example an image, a video signal or other data. The features may be local geometric features. In some applications, the number of measurements acquired to recover the features by various embodiments disclosed herein is linearly proportional to the number of features, as opposed to linearly proportional to the signal dimension.

Various embodiments of compressive sensing systems may include an encoder and a corresponding decoder. Various embodiments of compressive sensing methods may include applying encoding and decoding algorithms, for example using one or more computer systems or processors. According to one embodiment, an image may be processed as follows. Consider an image x including k local geometric objects. As used herein, an object may refer to a feature in the image. One example of a method includes replicating x several times, and folding each replica according to a particular discrete frequency, thereby generating multiple folded replicas. Each folded replica is quantized, and provides partial information about the location of each local geometric object in the original scene. By fusing the position information obtained from the folded replicas, positions of the objects in the image can be determined precisely and in a computationally efficient manner. Some embodiments may include using an error correcting code at the encoder to increase robustness. Some embodiments may include using gradient as an additional processing step to increase sparsity. Some embodiments may include taking a single fold, rather than multiple folds, for acquiring macro-statistics about an image. In one example, a rotation between a first image and a second image may be determined based on a single fold for each of the first image and the second image. These and other embodiments and aspects are discussed further below.

Various embodiments of the methods disclosed herein differ from the traditional uniform sampling approach by combining multiple parts of the signal in analog, for example by folding the signal, thereby enabling digitization at a much lower rate. Digitization at a lower rate requires less power. Therefore, these embodiments require less power compared to the traditional uniform sampling approach.

In contrast to standard compressive sensing approaches, disclosed methods for combining different parts of the signal in analog, for example by folding the signal, preserve local geometric structure, and enable recovering features without signal reconstruction. This allows for sublinear as opposed to superlinear algorithmic complexity. In addition, certain embodiments enable a reduction in the number of compressive measurements in comparison to conventional approaches. For example, the number of measurements required to recover the features by various embodiments may be linearly proportional to the number of features, as opposed to linearly proportional to the signal dimension. The reduction in the number of compressive measurements results in an ultra-sparse encoding matrix that is amenable to hardware implementation.

Various embodiments also differ from the conventional optical superposition or folding methods discussed above, for example by encoding the image multiple times, as opposed to once, and by encoding to instantiate an error correcting code for some applications.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

One or more features of the systems and methods disclosed herein may be implemented on one or more computer systems coupled by a network (e.g., the Internet). Example systems upon which various aspects may be implemented, as well as examples of methods performed by those systems, are discussed in more detail below.

1. COMPUTER SYSTEM

Various aspects and functions described herein in accord with the present invention may be implemented as hardware, software, or a combination of hardware and software on one or more computer systems. There are many examples of computer systems currently in use. Some examples include, among others, network appliances, personal computers, workstations, mainframes, networked clients, servers, media servers, application servers, database servers, web servers, and virtual servers. Other examples of computer systems may include mobile computing devices, such as cellular phones and personal digital assistants, and network equipment, such as load balancers, routers and switches. Additionally, aspects in accord with the present invention may be located on a single computer system or may be distributed among a plurality of computer systems connected to one or more communication networks.

For example, various aspects and functions may be distributed among one or more computer systems configured to provide a service to one or more client computers, or to perform an overall task as part of a distributed system. For example, the distributed system may be a cloud computing system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accord with the present invention may be implemented within methods, acts, systems, system placements and components using a variety of hardware and software configurations, and the invention is not limited to any particular distributed architecture, network, or communication protocol. Furthermore, aspects in accord with the present invention may be implemented as specially-programmed hardware and/or software.

FIG. 1 shows a block diagram of a distributed computer system 100, in which various aspects and functions in accord with the present invention may be practiced. The distributed computer system 100 may include one more computer systems. For example, as illustrated, the distributed computer system 100 includes three computer systems 102, 104 and 106. As shown, the computer systems 102, 104 and 106 are interconnected by, and may exchange data through, a communication network 108. The network 108 may include any communication network through which computer systems may exchange data. To exchange data via the network 108, the computer systems 102, 104 and 106 and the network 108 may use various methods, protocols and standards including, among others, token ring, Ethernet, Wireless Ethernet, Bluetooth, TCP/IP, UDP, HTTP, FTP, SNMP, SMS, MMS, SS7, JSON, XML, REST, SOAP, CORBA HOP, RMI, DCOM and Web Services. To ensure data transfer is secure, the computer systems 102, 104 and 106 may transmit data via the network 108 using a variety of security measures including TSL, SSL or VPN, among other security techniques. While the distributed computer system 100 illustrates three networked computer systems, the distributed computer system 100 may include any number of computer systems, networked using any medium and communication protocol.

Various aspects and functions in accord with the present invention may be implemented as specialized hardware or software executing in one or more computer systems including the computer system 102 shown in FIG. 1. As depicted, the computer system 102 includes a processor 110, a memory 112, a bus 114, an interface 116 and a storage system 118. The processor 110, which may include one or more microprocessors or other types of controllers, can perform a series of instructions that manipulate data. The processor 110 may be a well-known, commercially available processor such as an Intel Pentium, Intel Atom, ARM Processor, Motorola PowerPC, SGI MIPS, Sun UltraS-PARC, or Hewlett-Packard PA-RISC processor, or may be any other type of processor or controller as many other processors and controllers are available. As shown, the processor 110 is connected to other system placements, including a memory 112, by the bus 114.

The memory 112 may be used for storing programs and data during operation of the computer system 102. Thus, the memory 112 may be a relatively high performance, volatile, random access memory such as a dynamic random access memory (DRAM) or static memory (SRAM). However, the memory 112 may include any device for storing data, such as a disk drive or other non-volatile storage device, such as flash memory or phase-change memory (PCM). Various embodiments in accord with the present invention can organize the memory 112 into particularized and, in some cases, unique structures to perform the aspects and functions disclosed herein.

Components of the computer system 102 may be coupled by an interconnection element such as the bus 114. The bus 114 may include one or more physical busses (for example, busses between components that are integrated within a same machine), and may include any communication coupling between system placements including specialized or standard computing bus technologies such as IDE, SCSI, PCI and InfiniBand. Thus, the bus 114 enables communications (for example, data and instructions) to be exchanged between system components of the computer system 102.

Computer system 102 also includes one or more interface devices 116 such as input devices, output devices and combination input/output devices. The interface devices 116 may receive input, provide output, or both. For example, output devices may render information for external presentation. Input devices may accept information from external sources. Examples of interface devices include, among others, keyboards, mouse devices, trackballs, microphones, touch screens, printing devices, display screens, speakers, network interface cards, etc. The interface devices 116 allow the computer system 102 to exchange information and communicate with external entities, such as users and other systems.

Storage system 118 may include a computer-readable and computer-writeable nonvolatile storage medium in which instructions are stored that define a program to be executed by the processor. The storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. A medium that can be used with various embodiments may include, for example, optical disk, magnetic disk or flash memory, among others. In operation, the processor 110 or some other controller may cause data to be read from the nonvolatile recording medium into another memory, such as the memory 112, that allows for faster access to the information by the processor 110 than does the storage medium included in the storage system 118. The memory may be located in the storage system 118 or in the memory 112. The processor 110 may manipulate the data within the memory 112, and then copy the data to the medium associated with the storage system 118 after processing is completed. A variety of components may manage data movement between the medium and the memory 112, and the invention is not limited thereto.

Further, the invention is not limited to a particular memory system or storage system. Although the computer system 102 is shown by way of example as one type of computer system upon which various aspects and functions in accord with the present invention may be practiced, aspects of the invention are not limited to being implemented on the computer system, shown in FIG. 1. Various aspects and functions in accord with the present invention may be practiced on one or more computers having different architectures or components than that shown in FIG. 1. For instance, the computer system 102 may include specially-programmed, special-purpose hardware, such as for example, an application-specific integrated circuit (ASIC) tailored to perform a particular operation disclosed herein. Another embodiment may perform the same function using several general-purpose computing devices running MAC OS System X with Motorola PowerPC processors and several specialized computing devices running proprietary hardware and operating systems.

The computer system 102 may include an operating system that manages at least a portion of the hardware placements included in computer system 102. A processor or controller, such as processor 110, may execute an operating system which may be, among others, a Windows-based operating system (for example, Windows NT, Windows 2000/ME, Windows XP, Windows 7, or Windows Vista) available from the Microsoft Corporation, a MAC OS System X operating system available from Apple Computer, one of many Linux-based operating system distributions (for example, the Enterprise Linux operating system available from Red Hat Inc.), a Solaris operating system available from Sun Microsystems, or a UNIX operating systems available from various sources. Many other operating systems may be used, and embodiments are not limited to any particular operating system.

The processor and operating system together define a computing platform for which application programs in high-level programming languages may be written. These component applications may be executable, intermediate (for example, C# or JAVA bytecode) or interpreted code which communicate over a communication network (for example, the Internet) using a communication protocol (for example, TCP/IP). Similarly, functions in accord with aspects of the present invention may be implemented using an object-oriented programming language, such as SmallTalk, JAVA, C++, Ada, or C# (C-Sharp). Other object-oriented programming languages may also be used. Alternatively, procedural, scripting, or logical programming languages may be used.

Additionally, various functions in accord with aspects of the present invention may be implemented in a non-programmed environment (for example, documents created in HTML, XML or other format that, when viewed in a window of a browser program, render aspects of a graphical-user interface or perform other functions). Further, various embodiments in accord with aspects of the present invention may be implemented as programmed or non-programmed placements, or any combination thereof. For example, a web page may be implemented using HTML while a data object called from within the web page may be written in C++. Thus, the invention is not limited to a specific programming language and any suitable programming language could also be used.

A computer system included within an embodiment may perform functions outside the scope of the invention. For instance, aspects of the system may be implemented using an existing product, such as, for example, the Google search engine, the Yahoo search engine available from Yahoo! of Sunnyvale, Calif.; the Bing search engine available from Microsoft of Seattle Wash. Aspects of the system may be implemented on database management systems such as SQL Server available from Microsoft of Seattle, Wash.; Oracle Database from Oracle of Redwood Shores, Calif.; and MySQL from Sun Microsystems of Santa Clara, Calif.; or integration software such as WebSphere middleware from IBM of Armonk, N.Y. However, a computer system running, for example, SQL Server may be able to support both aspects in accord with the present invention and databases for sundry applications not within the scope of the invention.

2. EXAMPLES OF SYSTEMS AND METHODS

Figure 2:
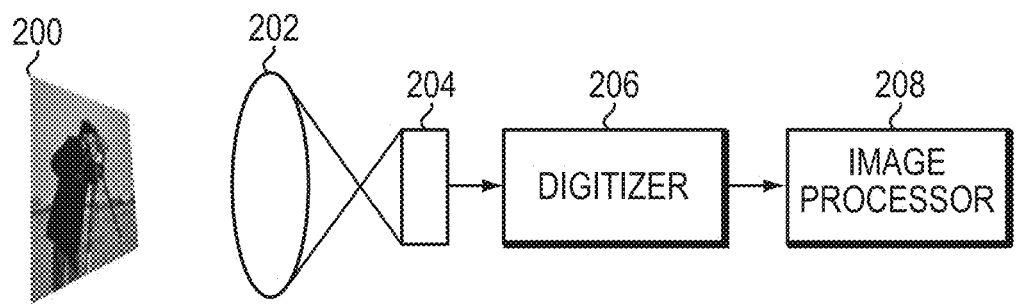
FIG. 2 illustrates the design of prior imaging architectures.

Most previous digital imaging architectures work as illustrated in FIG. 2. A scene 200 is focused via an optical lens 202 onto a focal plane array 204, typically using either CCD or CMOS technology. A digitizer 206 is then used to perform analog to digital conversion to convert image intensity values from the focal plane into digital pixel values. The image data may then be processed using an image processor 208. For most applications, the image data is compressed using one of many image coding methods, such as JPEG following digitization by the digitizer 206.

According to aspects of the present disclosure, it is appreciated that one disadvantage of the architecture of FIG. 2 is that there is considerable wasted power in the image acquisition phase. A significant amount of power is used to acquire data in the acquisition phase, only to be immediately discarded in the compression phase, since many of the compression techniques used are lossy. The system of FIG. 2 is less than ideal in numerous settings particularly where size, weight, and power are constrained. The ideal imager in these settings is as small as possible, as light as possible, and consumes as little power as possible. Moreover, the majority of power consumption in imagers is due to analog to digital conversions. The wasted power by the digitizer 206 and the image processor 208 in FIG. 2 is very costly.

As an example of the inefficiency of the system of FIG. 2, consider a small unmanned aerial vehicle (UAV) in a GPS constrained environment. An approach in such a setting is to rely on visual imagery for navigation purposes. This involves some sort of image feature tracking from frame to frame. The inefficiency with previous imaging architectures is that the information rate or the feature information is usually much less than the data rate or the digitized values at every pixel location.

Accordingly, aspects of the present disclosure are directed to providing systems and methods that reduce the data rate closer to the information rate, for example by digitizing fewer aggregate image measurements than a standard imager while still extracting the desired image properties. Aspects of the present disclosure are directed to compressive sensing, wherein compressive sensing includes directly acquiring the information or image in a compressed representation. In some embodiments, the compressive acquisition and digitization may be performed in a single step or may overlap. This achieves the desired result of pushing some of the compression phase performed by the image processor 208 in FIG. 2 into the image acquisition and digitization phase.

Figure 3:
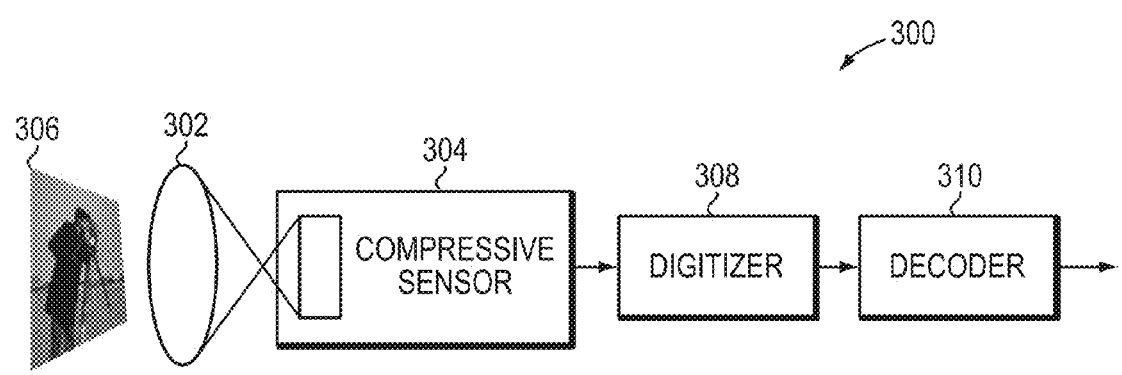
FIG. 3 illustrates one example of an embodiment of a compressive sensing apparatus according to aspects of the present invention.

FIG. 3 illustrates one example of an embodiment of a compressive sensing apparatus 300 according to aspects disclosed herein. The compressive sensing apparatus includes a lens 302 and a focal plane array 304 coupled to the lens so as to receive an image of a scene 306. The focal plane array 304 may include a CCD or CMOS sensor. The focal plane array 304 is a compressive sensor, being configured to directly acquire a compressed representation of the image of the scene 306. The focal plane array 304 may include an encoder configured to encode the image of the scene 306. The compressive sensing apparatus 300 further includes a digitizer 308 configured to receive and to digitize a compressed representation of the image of the scene 306. In some embodiments, the focal plane array 304 may include the digitizer 308.

The compressive sensing apparatus 300 further includes a decoder 310 configured to receive a compressed representation of the image of scene 306 and to recover one or more features of the image without reconstructing or recovering the image. In various embodiments disclosed herein, functions performed to recover the one or more features may be performed by the decoder 310 or by one or more other modules of a compressive sensing apparatus. In some embodiments, the decoder 310 may include one or more modules configured to perform various functions to recover the one or more features. In yet other embodiments, the focal plane array 304 may include both an encoder configured to acquire and to digitize a compressed representation of an image of the scene 306 and a decoder configured to recover one or more features of the image based on the compressed representation.

Figure 4:
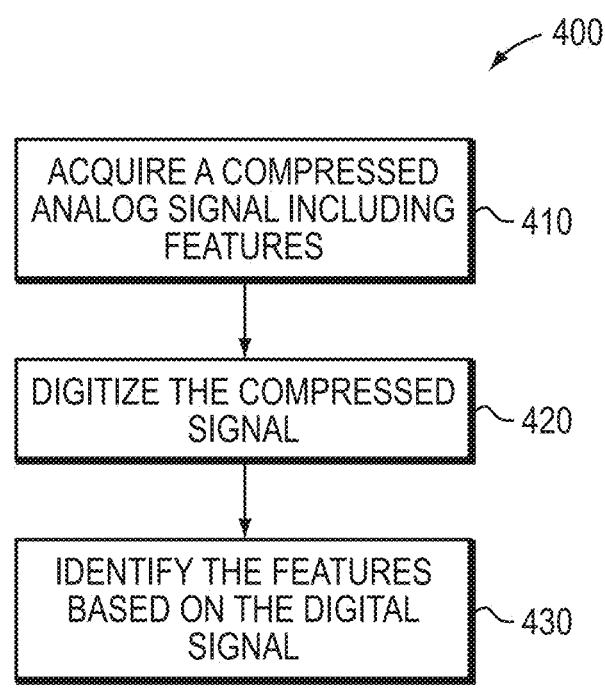
FIG. 4 illustrates one example of a method of compressive sensing according to aspects of the present invention.

FIG. 4 illustrates one example of an embodiment of a method 400 of compressive sensing according to aspects disclosed herein. Method 400 includes an act 410 of acquiring a compressed analog signal including features. For example, the signal may be an image of a scene such as the scene 306 of FIG. 3. Method 400 further includes an act 420 of digitizing the compressed signal and an act 430 of identifying or recovering one or more features of the signal based on the digital, compressed signal. In one embodiment, acts 410 and 420 may be performed in a single step, substantially simultaneously or may overlap. Further details regarding the various acts of method 400 are disclosed herein in relation with various embodiments. In one embodiment, the method 400 may be performed by the compressive sensing apparatus 300 of FIG. 3. For example, acts 410, 420 and 430 may be performed by the focal plane array 304, the digitizer 308 and the decoder 310 respectively.

In various embodiments, a compressed representation of a signal or image may be a folded representation. Aspects and embodiments are directed to acquiring one or more features of an image from its folded representation. This can be viewed as a particular manifestation of the problem of acquiring characteristics about a signal from an undersampled or lower dimensional representation. In some embodiments, the signals are two-dimensional images, and the undersampling process to create the lower-dimensional representations is folding.

Figure 5:
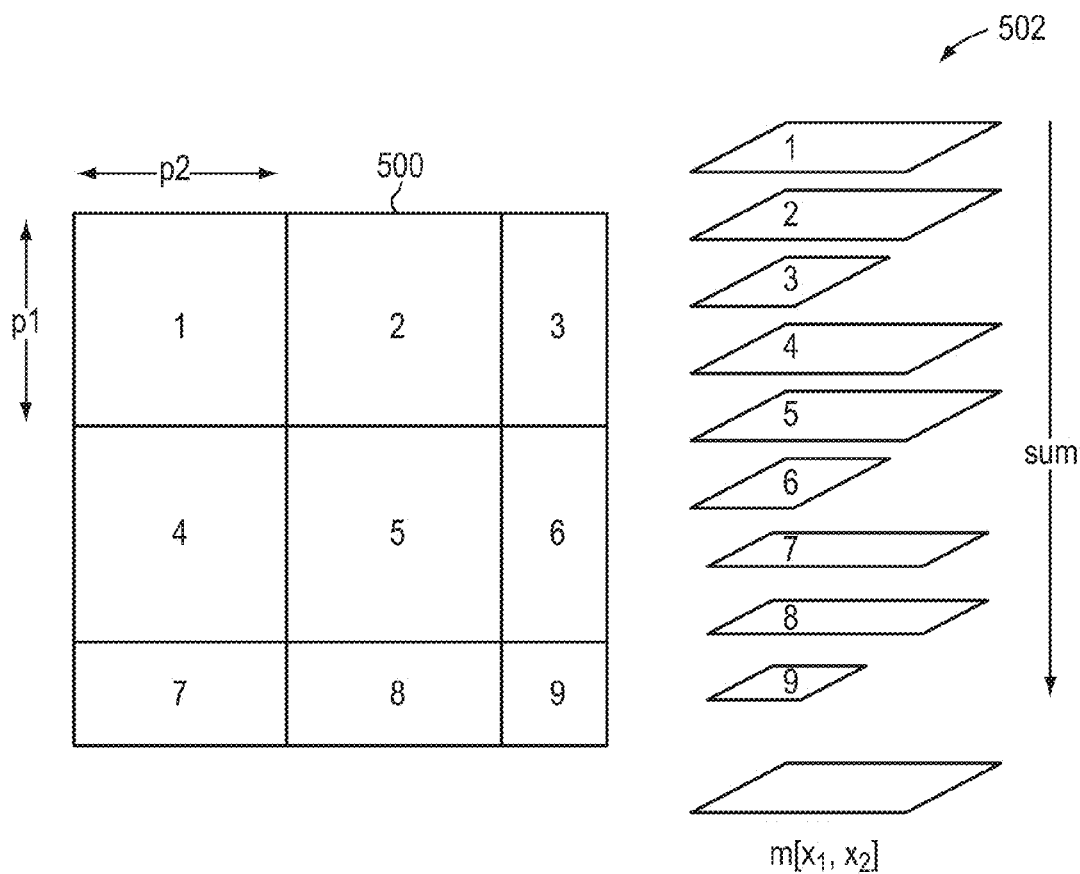
FIG. 5 illustrates one example of folding according to aspects of the present invention.

FIG. 5 illustrates one example of a folding process according to aspects disclosed herein. An image 500 is folded by $p_1$ in the first dimension and $p_2$ in the second dimension. Folding may include superposition of non-overlapping subsections 502 of the image 500 as shown in FIG. 5. Formally, if $I[x_1,x_2]$ is the image 500, the output from folding the image 500 by $p_1$ in the first dimension and $p_2$ in the second dimension is:

$$\text{FOLD}(I, p_1, p_2) = m[y_1, y_2] = \sum_{\substack{y_1 \equiv x_1 (\bmod p_1) \\ y_2 \equiv x_2 (\bmod p_2)}} I[x_1, x_2]$$

It is to be appreciated that the horizontal and vertical orientation flipping that would occur in folding a piece of paper may not occur in this folding process.

Folding offers a number of advantages as a method of undersampling. For example, folding tends to preserve local features. In various embodiments, folding may allow recovering local features of an image. According to one aspect of the present disclosure, it is shown that folding preserves local geometric features such as references of star positions in night sky images. In other examples, corners and gradient direction are local in nature. The preservation of a number of different image features under a dimensionality reducing process of folding is disclosed. Examples of features explored are image corners, rotation, and translation. Furthermore, folding is amenable to hardware implementation, as described in further detail below.

Figure 6:
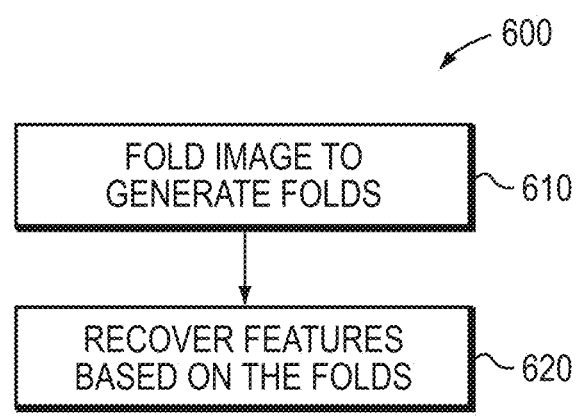
FIG. 6 illustrates one example of a method of compressive sensing according to aspects of the present invention.

FIG. 6 illustrates one example of a method 600 of compressive sensing including an act 610 of folding an image to generate one or more folds and an act 620 of recovering one or more features of the image based on the one or more folds. Each of the acts 610 and 620 may include various other acts. Further details regarding the various acts of method 600 are disclosed herein in relation with various embodiments. For example, methods of folding and recovering various features based on folds are disclosed along with various applications and simulation results. In one embodiment, the method 600 may be performed by the compressive sensing apparatus 300 of FIG. 3. For example, act 610 may be performed by the focal plane array 304 and the digitizer 308 and act 620 may be performed by the decoder 310.

In contrast to traditional approaches to image acquisition that first capture an entire N-pixel image and then process it for compression, transmission, or storage as shown for example in FIG. 2, compressive sensing includes obtaining a compressed representation directly, for example by acquiring a small number of nonadaptive linear measurements of the signal in hardware as shown for example in FIG. 3. For example, if an N-pixel image is represented by a vector x, then the compressed representation is equal to Ax, where A is an m×N matrix. An advantage of this architecture is that it may use fewer sensors, and therefore may be cheaper and use less energy than a conventional camera.

Compressive sensing is a recent direction in signal processing that examines how to reconstruct a signal from a lower-dimensional sketch under the assumption that the signal is sparse. For example, in order to reconstruct the image x from a compressed representation or lower-dimensional measurement vector (or sketch) Ax, assume that the image x is k-sparse for some k (i.e., it has at most k non-zero coordinates) or at least be well-approximated by a k-sparse vector. Then, given Ax, $\hat{x}$ (an approximation to x) may be found by performing sparse recovery. The latter problem may be defined as follows: construct a matrix A such that, for any signal x, a vector $\hat{x}$ can be recovered or reconstructed from Ax satisfying the error bound:

$$\|x-\hat{x}\|_1 \leq C \cdot Err_k^1(x)$$

where $Err_k^1(x)$ is the minimum L−1 error between x and x', $\|x-x''\|_1$, over all k-sparse vectors x' and C is an approximation factor. Note that if x is k-sparse, then $Err_k^1(x)=0$ and therefore $\hat{x}=x$. Other $L_P$ norms may be used and particular measurement matrices A and recovery algorithms for signal x may be optimal depending on the application. In particular, it may be desirable to design matrices A and corresponding recovery algorithms that produce $\hat{x}$ with a good compression rate (i.e., low values of m) as well as good algorithmic properties (i.e., low encoding and recovery times). There exist binary matrices A and associated recovery algorithms that produce approximations $\hat{x}$ satisfying the above error bound with constant approximation factor C and sketch length m=O(k log (N/k)). In particular, a random Bernoulli matrix or a random binary matrix with column sparsity O(log(N/k)) has this property with overwhelming probability. This sketch length is asymptotically optimal. Any deterministic scheme with guarantee as provided by the error bound above requires column sparsity of $\Omega(\log(N/k))$. In the randomized case, where A is a random variable, and the above error bound is required to hold only with constant probability over the choice of A, any binary matrix A must have column sparsity as stated. Some aspects of the present disclosure are directed to overcoming these limitations of previous approaches.

Differences that separate aspects and embodiments disclosed herein from the standard class of compressive sensing problems include feature recovery and hardware implementable solutions, as described further below.

While previous work on compressive sensing has focused on reconstructing the signal (attempting to recover signal x or generating $\hat{x}$), aspects and embodiments disclosed herein are directed to recovering one or more features of the signal based on a compressed representation of the signal, such as folds, without reconstructing the signal. The methods of recovering features may thus differ significantly from the $L_p$ minimization methods typical of compressive sensing techniques. Various embodiments garner information about a signal from a lower-dimensional sketch. Folding may be a linear operation and may correspond to a measurement matrix A for taking a sketch of an image. If a two-dimensional image is represented as a single vector, by concatenating all of the columns on top of each other, then folding may be represented as a simple matrix multiplication Ax, where A is a relatively sparse binary matrix with a particular structure corresponding to the folding process.

Furthermore, aspects and embodiments disclosed herein allow for sublinear as opposed to superlinear algorithmic complexity. In addition, certain embodiments enable a reduction in the number of compressive measurements in comparison to conventional approaches. For example, the number of measurements required to recover the features by various embodiments may be linearly proportional to the number of features, as opposed to linearly proportional to the signal dimension. Thus, various embodiments disclosed herein allow recovery of features with ultra-low encoding complexity, i.e., constant or substantially constant (almost-constant) column sparsity. The reduction in the number of compressive measurements results in an ultra-sparse encoding matrix that is amenable to hardware implementation.

Most of the research in compressive sensing is theoretical in nature, with implementation considerations largely not addressed. Many of the sketching matrices, A, that are ideal for recovery from a theoretical perspective, such as random Bernoulli or Gaussian matrices, do not have straight forward hardware implementations. Moreover, previous compressive sensing solutions do not provide power savings compared to the acquisition of the entire image when dealing for example with sensors for the visible light spectrum. In contrast, aspects and embodiments disclosed herein provide compressive sensing solutions that are amenable to efficient hardware implementations, thereby providing power savings. Various embodiments disclosed herein provide compressive sensing or compressive imaging apparatuses that acquire all the compressive measurements concurrently, for example by implementing the matrix multiply Ax. Binary matrices having entries that are either zero or one may be used in various embodiments.

In particular, folding or acquiring a plurality of measurements that form a compressed representation is amenable to hardware implementation. For example, folding based on structured binning in a focal plane array, such as the focal plane array 304 of the compressive sensing apparatus 300 in FIG. 3, provides an efficient hardware implementation. Folding is readily implementable on systems that use optically multiplexed imaging. For optical measurement architectures, due to the Poisson distributed shot noise affecting photon counting devices, splitting the signal in components of x can decrease the signal to noise ratio by as much as the square root of the column sparsity. Other potential advantages of ultra-low encoding complexity in electronic compressive imagers include reduced interconnect complexity, low memory requirements for storing the measuring matrix, and gain in image acquisition speed due to reduced operations.

FIGS. 7A to 7J illustrate an example of an application of one embodiment of a method of compressive sensing according to aspects disclosed herein. In particular, various embodiments of compressive sensing methods disclosed herein allow recovering one or more features of an image having local geometric features. As used herein, recovering a feature may include recovering a location of the feature. Recovering a feature may include recovering data associated with the feature.

Let $x \in R^N$ be an N-pixel image, where each pixel p has a value $x_p$. For example, FIG. 7A illustrates an image 700 having a total of $N=n^2$ pixels 702, each pixel p being represented by a square. In some embodiments, x consists of a small number (k) of local geometric objects. For example, the image 700 further includes a plurality of features or objects 704 to be recovered by compressive sensing. In this example, the image 700 includes k objects, wherein k=3. Each object 704 may span a plurality of pixels. For example, as shown in FIG. 7B, an object 704 fits in a w×w bounding box 708. Referring again to FIG. 7A, the image 700 further includes noise as illustrated by the dots 706 in the image. Therefore, a received signal or image may be represented by x'=x+μ, where μ represents noise. In one example, the image 700 may be an image of a sky including a plurality of stars as the objects.

An image x' is acquired by computing the measurement vector Ax', where A is an m×N measurement matrix for some m<<N. That is, instead of directly acquiring the image 700 as shown for example in FIG. 7A, a plurality of measurements, which may represent one or more folds corresponding to the image, are acquired. For example, FIG. 7E illustrates a measured signal z=Ax' corresponding to the image 700.

In various embodiments disclosed herein, a matrix A may be constructed and feature recovery methods may have several advantages, including: (i) the number of measurements m is $O(k \log_k N)$, which undercuts currently known schemes that achieve m=O(k log(N/k)); (ii) the matrix A is ultra-sparse, which is important for hardware considerations; and (iii) the recovery algorithm is fast and runs in time sub-linear in N. In some embodiments, the recovery guarantee may be relaxed, by requiring that only a constant fraction of the non-zero entries of the vector x are recovered correctly.

In some embodiments, a class of images that possesses additional geometric structure may be considered, as described further below.

Example of Class of Images

Figure 7C:
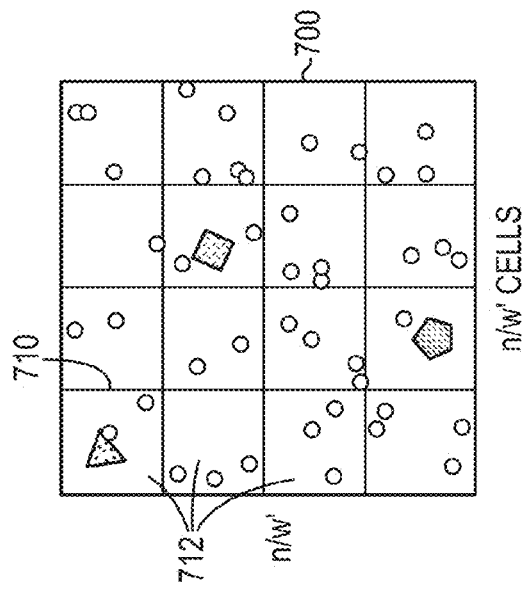
Figure 7B:
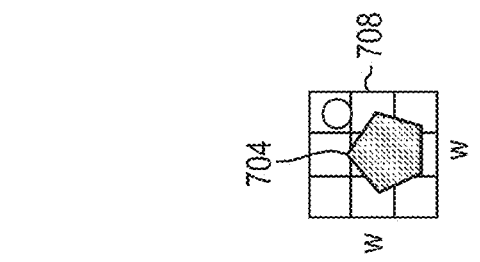
Figure 7A:
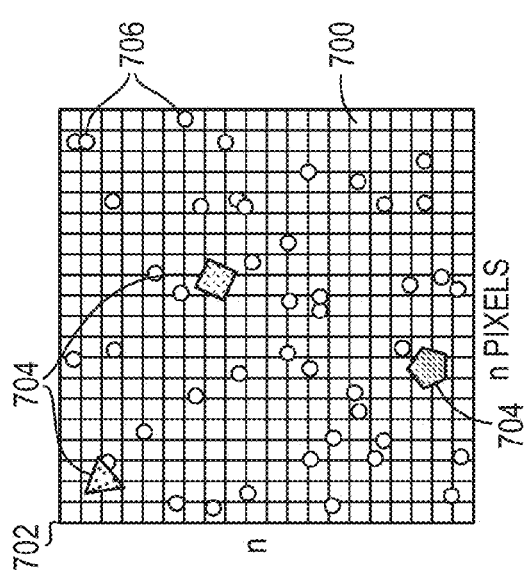

An example of an image is described herein with reference to FIGS. 7A to 7C. An example of a model of an image is a sparse image including a small number of distinguishable objects plus some noise. For example, in astronomical imaging, an image may include a small number of distinguishable stars plus some noise. Each object is modeled as an image contained in a small bounding box, for some constant w. For example, as shown in FIG. 7B, the object 704 fits in a w×w bounding box 708. The image, such as the image 700 of FIG. 7A, is constructed by placing k objects, such as objects 704, in the image in an arbitrary fashion, subject to a minimum separation constraint. The image is then modified by adding noise, as shown for example in image 700 including dots 706. Next, the notions of minimum separation constraint, distinguishability, and noise are formalized.

Let x by an N-dimensional real vector, and assume $N=n^2$ for an integer n. We will treat x both as a vector and as an n×n matrix, with entries x[i,j] for i,j∈[n]. An object o is a w×w real matrix, as shown for example in FIG. 7B. Let $O=\{o_1 \ldots o_k\}$ be a sequence of k objects, and let $T=\{t_1 \ldots t_k\}$ be a sequence of translations in x, i.e., elements from $[n-w]^2$. We say that T is valid if for any i≠j the translations $t_i$ and $t_j$ do not collide, i.e., we have $\|t_i - t_j\|_\infty \geq w'$ for some separation parameter w'=Ω(w). For o∈O and $t=(t_x, t_y) \in T$, we define t(o) to be a w×w matrix indexed by $\{t_x \ldots t_x+w-1\} \times \{t_y \ldots t_y+w-1\}$. The ground truth image is then defined as $x=\Sigma_i t(o_i)$.

In some embodiments, a grid G is imposed on the image with cells of size w'×w'. For example, as shown in FIG. 7C, a grid 710 is superimposed on the image 700, thereby dividing the image into a plurality of cells 712. For clarity, the pixel grid shown in FIG. 7A is not shown in FIG. 7C. The grid 710 may be a randomly shifted grid of cells of width w'=w/α. Each cell 712 has a size w'×w'. Thus, the image 700 includes n/w' cells in each dimension of the image and a total of $(n/w')^2$ cells. Let $x_c$ be the image (i.e., an $w'^2$-dimensional vector) corresponding to cell c. A projection F is then used that maps each sub-image $x_c$ into a feature vector $F(x_c)$. If $y \in x_c$ for some cell c, F(y) is used to denote $F(x_c)$ after the entries of $x_c \backslash y$ are set to 0. If y is not a cell and not contained in a cell, then F(y) is left undefined.

In some embodiments, the distinguishability property we assume is that for any two district o,o' from the objects $O \cup \{0\}$, and for any two translations t and t', we have $\|F(t(o))-F(t'(o'))\|_\Gamma > T$ (when it is defined) for some threshold T>0 and some norm $\|\cdot\|_\Gamma$. In other words, different objects need to look different under F. For concreteness, the feature vectors used in some examples provided herein are the magnitude (the sum of all pixels in the cell) and centroid (the sum of all pixels in the cell, weighted by pixel coordinates). In one example of an image including stars, calculating feature vectors includes calculating magnitude and centroid, because the magnitudes of stars follow a power law, and the centroid of a star can be resolved to 0.15 times the width of a pixel in each dimension. In some embodiments, the distinguishability constraint allows us to undercut the usual lower bound by a factor of log k.

The observed image x' is equal to x+μ, where μ is a noise vector, as shown for example in image 700. The threshold T determines the total amount of noise that the method of compressing sensing tolerates. Specifically, let $\|\mu\|_F = \Sigma_c \|F(\mu_c)\|_\Gamma$, where $\mu_c$ is the noise corresponding to cell c. We assume that $\|\mu\|_F < \gamma k T$ for some constant γ>0, and make no other assumptions about the noise.

Examples of Systems and Methods (Continued)

Referring again to the Figures, examples of methods of compressive sensing are further described herein with reference to FIGS. 7A to 7J. In some embodiments, our results assume sparsity parameter k≥C log N for some constant C. In some embodiments, a distribution is constructed over random binary m×N matrices A, such that given Ax' for x' described above, we recover (with constant probability) a set D of k cells, such that at least k/2 of the cells fully containing an object are included in D. Recovering features may include recovering cells corresponding to the features as shown for example in FIG. 7I. In some embodiments, we may recover an approximation to $x_c$ for any c∈D. For example, FIG. 7J shows recovered features including data corresponding to the cells recovered in FIG. 7I. The matrix has column sparsity $O(\log_k N)$. Note that if, for example, $k=N^{1/2}$, then the column sparsity is constant. Moreover, the matrix A has only $m=O(k \log_k N)$ rows.

Figure 7D:
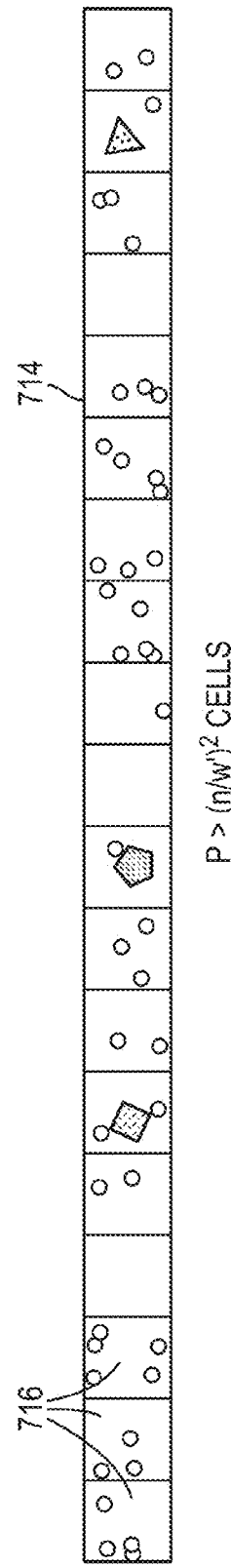

In some embodiments, acquiring a compressed representation of an image, such as image 700 of FIG. 7A, may include folding the image or acquiring a plurality of measurements less than the size of the image. In some embodiments, folding the image may include applying a hashing function. For example, FIG. 7D illustrates applying a pairwise independent hash function Hp: x→ax+b (mod P) to a numbering of the cells 712 of FIG. 7C. The signal 714 generated by hashing is shown to include a plurality P of cells 716, where $P > (n/w')^2$ cells.

In some embodiments, construction of the measurement matrix may be based on other algorithms for sparse matrices, such as Count-Sketch or Count-Min. In some embodiments, as shown for example in FIG. 7E, hash each cell, c, is hashed such as each cell 712 in FIG. 7C, $s=O(\log_k N)$ times into s arrays 720 of $q=O(k)$ buckets 722, and sum all cells hashed to the same bucket. Each bucket 722 defines one measurement of $w'^2$ pixels, which gives $m=O(k \log_k N)$ measurements. The measurements or buckets 722 thus form the measured signal 724, the measured signal being z=Ax'. The number of measurements in the measured signal 724 is less than the size N of the image 700. N may be a positive integer. The measured signal 724 acquired by compressive sensing is a compressed representation corresponding to the image 700.

In some embodiments, the method of compressive sensing may include applying an error correcting code f that maps each cell 712 onto exactly one bucket 722 in every row or array 720. The cells mapping onto each bucket are summed. Hashing may be done by using one of the Chinese Reminder Theorem (CRT) codes (i.e., modulo prime hashing) and Reed-Solomon (RS) codes. For example, the code illustrated in FIG. 7E is CRT, where each cell 712 is mapped to its index (or numbering) modulo various relatively prime numbers. It should be noted that unlike in other scenarios, our use of CRT codes does not incur any additional polylogarithmic factors that typically lead to sub-optimal results. Each cell 712 of FIG. 7C, including each cell containing the objects 704, is mapped onto exactly one bucket 722 in every array 720 as illustrated in FIG. 7E. Some distinct objects 704 may be hashed to the same bucket, for example as shown in bucket 728 of FIG. 7E, which includes two distinct objects. Applying an error correcting code enables robust compressive sensing and allows for handling errors. The errors may be due to distinct objects being hashed to the same bucket as illustrated by bucket 728 in FIG. 7E, the noise vector μ, and the grid cutting objects into pieces. Hashing based on CRT and RS codes is described next in further detail.

In some embodiments, such as described above with reference to FIG. 7E, compressive sensing includes hashing each cell c, such as each cell 712, into s different arrays of size O(k), such as arrays 720. In some embodiments, folding the image 700 of FIG. 7A may include hashing as shown for example in FIGS. 7D and 7E. Each array 720 may be a fold. Hashing may be considered as a mapping f from [N] to $[O(k)]^s$. As long as each character of the mapping is approximately pairwise independent, then in expectation most of the k objects 704 will be alone in most of the array locations they map to. In some embodiments, recovering one or more objects 704 may include clustering the values in the buckets 722, as will be described further below, giving us a noisy version y' of the true codeword y=f(c) with a constant fraction of errors. We may then efficiently decode from y' to c. Hence, in some embodiments there is a need for an efficient error correcting code that is also approximately pairwise independent in each character. Precise definitions of requirements of some embodiments and two codes, the Reed-Solomon (RS) code and the Chinese Remainder Theorem (CRT) code that achieve these requirements, are described below.

DEFINITIONS

Definition 1

A hash family $\mathcal{H}$ of functions h: A→B is pairwise-independent if, for any $x_1, x_2 \in A$ and $y_1, y_2 \in B$ with $x_1 \neq x_2$, we have $$Pr_{h \in \mathcal{H}}[h(x_1) = y_1 \cap h(x_2) = y_2] = \frac{1}{|B|^2}.$$

In many applications, the range B is the product of s symbols $B_1 \times \ldots \times B_s$. For a function $f: A \to B$ and $i \in [s]$, we use $f_i(x)$ to denote the ith coordinate of f.

When B is a produce space, one may settle for a weaker notion of pairwise independence. In some examples, rather than requiring pairwise independence for the whole range, we only require pairwise independence in each coordinate.

Definition 2

Let $B = B_1 \times \ldots \times B$. A hash family $x$ of functions h: $A \to B$ is coordinate-wise C-pairwise-independent if, for all $i \in [s]$, any $x_1 \neq x_2 \in A$, and all $y_1, y_2 \in B_i$, we have $$Pr_{h \in \varkappa}[h_i(x_1) = y_1 \cap h_i(x_2) = y_2] \leq \frac{C}{|B_i|^2}.$$

Definition 3

Let $B = B_1 \times \ldots \times B$. A function $f: A \to B$ is C-uniform if, for all $i \in [s]$ and all $y \in Bi$, $$Pr_{x \in A}[f_i(x) = y] \leq \frac{C}{|B_i|}.$$

Definition 4

For any function $f: B \to D$ and family $x$ of functions h: $A \to B$, $f \circ \varkappa$ denotes the family of $A \to D$ functions $\{g(x) = f(h(x)) | h \in \varkappa\}$.

Theorem 5

If $\varkappa$ is pairwise-independent and f is C-uniform, then $f \circ \varkappa$ is coordinatewise $C^2$-pairwise-independent.

Proof. Let $\varkappa$ be $A \to B$ and f be $B \to D = D_1 \times \ldots \times D_s$. Then for any $i \in [s]$, any $x_1 \neq x_2 \in A$, and all $y_1, y_2 \in D_i$ we have, as desired:

$$Pr_{h \in \mathcal{H}}[f_i(h(x_1)) = y_1 \cap f_i(h(x_2)) = y_2] =$$

$$\sum_{z_1, z_2 \in B} Pr_{h \in \mathcal{H}}[h(x_1) = z_1 \cap h(x_2) = z_2 \cap f_i(z_1) = y_1 \cap f_i(z_2) = y_2] =$$

$$\sum_{z_1, z_2 \in B} \frac{1}{|B|^2} Pr[f_i(z_1) = y_1 \cap f_i(z_2) = y_2] =$$

$$Pr_{z_1, z_2 \in B}[f_i(z_1) = y_1 \cap f_i(z_2) = y_2] =$$

$$Pr_{z_1 \in B}[f_i(z_1) = y_1] Pr_{z_2 \in B}[f_i(z_2) = y_2] \leq \frac{C^2}{|B_i|^2}$$

Definition 6

A function $f: A \to B$ for $B = B_1 \times \ldots \times B_s$ is an error-correcting code of distance d if, for any two distinct $x_1, x_2 \in A$, $f(x_1)$ and $f(x_2)$ differ in at least d coordinates.

We say that f is efficiently decodable if we have an algorithm $f^1$ running in $\log^{O(1)}|B|$ time with $f^1(y) = x$ for any $x \in A$ and $y \in B$ such that $f(x)$ and y differ in fewer than d/2 coordinates.

For any prime $P \geq N$, the function family $\varkappa_P: ax + b \pmod{P}$ for $a, b \in [P]$ is pairwise independent when viewed as a set of functions from $[N]$ to $[P]$.

Lemma 7

If f is an efficiently decodable error-correcting code with distance d, then so is $f \circ h$ for every $h \in \varkappa_P$ with $a \neq P$.

Proof. Since $a \neq P$, there exists an $a^{-1}$ modulo P, that can be efficiently computed. Hence h is injective, so $f \circ h$ is an error-correcting code of distance d. Furthermore, $(f \circ h)^{-1}(x) = a^{-1}(f^1(x) - b) \pmod{P}$ is efficiently computable.

Definition 8

We say that a family G of functions g: $A \to B_1 \times \ldots \times B_s$ is a $(C, N, s, d)_q$-independent-code if G is coordinatewise C-pairwise independent, $q \leq |B_i| < 2q$ for all $i \in |s|$, $|A| \geq N$, and with probability at least $1 - 1/N$ over $g \in G$ we have that g is efficiently decodable with distance d.

If $f: A' \to B_1 \times \ldots \times B_s$ is a C-uniform and efficiently decodable with distance d and $|B_i| \geq q$ for all i, then $f \circ \varkappa_P$ is a $(C^2, N, s, d)_q$-independent-code.

Two Code Constructions

Discussed below are two $(4, N, s, s-r)_q$-independent codes. Both are achievable for any parameters with $2N < q^r$ and $s < q/\log q$ (and the first code allows any $s < q$). We let P be a prime in $$\left\{\frac{1}{2}q^r, \ldots, q^r\right\}.$$

Reed-Solomon (RS) Code

Let $q \geq s$. The Reed-Solomon code $f_{RS}: [q^T] \to [q]^s$ is defined for $f(x)$ by (i) interpreting x as an element of $F_q^r$, (ii) defining $X_x \in F_q[\xi]|$ to be the rth degree polynomial with coefficients corresponding to x, and (iii) outputting $f(x) = (\chi_x(1), \ldots, \chi_x(s))$. It is well known to have distance $s - r$ and to be efficiently decodable.

Theorem 9

Let $f: [P] \to [q]^s$ be the restriction of $f_{RS}$ to $[P]$. Then f is 2-uniform.

Proof. We know that $f_{RS}$ is 1-uniform. Since $P \geq q^r/2$, f is 2-uniform.

Hence $G_{RS} = f \circ \varkappa_P$ is a $(4, N, s, s-r)_q$-independent code.

Chinese Remainder Theorem (CRT) Code

Let $p_1, \ldots, p_s \in [q, 2q]$ be distinct primes; note that the asymptotic distribution of prime numbers implies $q/\log q = \Omega(s)$. Hence for any $x \in [N]$, any r of the residues mod $p_1, \ldots, p_s$ uniquely identify x. The CRT code $f_{CRT}: [P] \to [p_1] \times \ldots \times [p_s]$ is defined by taking the residues modulo each prime. It has distance $s - r$ and is efficiently decodable.

Theorem 10

The CRT code $f_{CRT}$ is 2-uniform.

Proof. Let $i \in [s]$. The projection of $f_{CRT}$ onto its ith coordinate is one-to-one over a domain that is any consecutive sequence of $p_i$ integers. Hence over the domain $[P]$, the ratio between the likelihood of the most common and the least common values in the range is $$\frac{[P/p_i]}{[P/p_i]} \le 2.$$

Hence $G_{CRT} = f_{CRT} \circ \varkappa_P$ is a $(4,N,s,s-r)_q$-independent code.

Collisions

Lemma 11

Suppose $g: A \to B_1 \times \ldots \times B_s$ is drawn from a $(4, N,s,s-r)_q$-independent code. Let S, $S^g \subset A$. Define the set of "colliding" symbols $$C = \{(a,i) | a \in S, i \in [s], \exists a' \in S's, t, g_i(a) = g_i(a'), a \ne a'\}$$

With probability at least 7/8, $|C| \le 32|S| \, |S'|s/q$.

Proof. We observe that $$E[|C|] = \sum_{i \in [s]} \sum_{a \in S} Pr[(a,i) \in C]$$

$$\le \sum_{i \in [s]} \sum_{a \in S} \sum_{\substack{a' \in S' \\ a' \ne a}} Pr[g_i(a) = g_i(a')]$$

$$= \sum_{i \in [s]} \sum_{a \in S} \sum_{\substack{a' \in S' \\ a' \ne a}} \sum_{z \in B_i} Pr[g_i(a) = z \cap g_i(a') = z]$$

$$\le \sum_{i \in [s]} \sum_{a \in S} \sum_{\substack{a' \in S' \\ a' \ne a}} \sum_{z \in B_i} \frac{4}{|B_i|^2}$$

$$\le s|S||S'|4/q$$

Hence, by Markov's inequality, $|C| \le 32|S||S'|$ s/q with probability at least 7/8.

Examples of Systems and Methods (Continued)

Referring again to FIGS. 7A to 7C, let $O = \{o_1 \ldots o_k\}$ be a sequence of k objects such as the objects 704, and let $T = \{t_1 \ldots t_k\}$ be a sequence of (non-colliding) translations in x. Also, let μ be the noise vector, and let x' be the noisy image 700, as described above and illustrated in FIG. 7A. We further introduce (small) constants α, β, γ, δ, η>0, whose values will be determined in the course of the analysis.

As described with reference to FIG. 7C, a square grid G is imposed, such as the grid 710, with w'×w' cells on the image x', such that w'=w/α. The grid may be shifted by a vector v chosen uniformly at random from $[w']^2$. Let S' be the set of cells that intersect or contain some object $t_i(o_i)$, and $S \subset S'$ be the set of cells that fully contain some object $t_i(o_i)$. Observe that a fixed object, such as an object 704, is fully contained in some cell, such as a cell 712, with probability $(1-w/w')^2 > 1-2\alpha$, since each axis of the grid intersects the object with probability w/w'. This implies that the expected number of cells in S'−S is at most 2αk, which implies by Markov that $|S'-S| \le 16\alpha k$ with probability 7/8 (see Lemma 11). In some embodiments, we will assume the latter event holds. Let k'=|S'|. We choose α>0 such that k'≤2k.

Referring again to FIG. 7E, the measurement matrix A is defined by the following linear mapping. Let G denote the set of cells, such as cells 712 of FIG. 7C. Let g: G→B= $B_1 \times \ldots \times B_s$ be drawn from a $(4,N,s,4(3\delta+\beta)s)_q$-independent code, such as either $G_{RS}$ or $G_{CRT}$. Moreover, we require that k/q≤η; such a code is achievable per the two code constructions described above, with $s = \Theta(\log_k N)$ as long as k>C log N for some constant C (such that both $q^{(1-3(3\delta+\beta))s} > k^{s/2} 2N$ and s<log N/log k≤q/log q). For each i=1 . . . s, we define a $|B_i|$-dimensional vector $z^i$, where each $z^i$ is a row or array 720 as illustrated in FIG. 7E, whose entries are elements in $R^{w'2}$, such that for any j $$z^i_j = \sum_{g_i(c) = j} x'_c$$

That is, all cells 712 of FIG. 7C are hashed into $|B_i| \ge q$ buckets 722 of FIG. 7E, and sum all cells hashed to the same bucket. The acquired or measured signal 724, that is the measurement vector z=Ax', is now equal to a concatenation of vectors $z^1 \ldots z^s$. Note that the dimension of z or the number of measurements is equal to m=w'2Σ$|B_i|$=O(qs)= O(k $\log_k$ N).

In some embodiments, recovering one or more objects of the image 700 is as described next and illustrated with reference to FIGS. 7E to 7J. For simplicity, assume for now that the image contains no noise, and ignore the effect of two different objects being hashed to the same bucket, such as bucket 728 of FIG. 7E. In this case, all buckets 722 containing distinct objects 704 are distinguishable from each other. Therefore, non-empty buckets can be grouped into k clusters of size s, with each cluster containing buckets having a single value. Since $q^s > N$, each cluster of buckets uniquely determines the cell in x containing the object in those buckets.

In some embodiments, it is desirable that the method of compressive sensing be robust to errors. The errors may be due to distinct objects being hashed to the same bucket, such as bucket 728 of FIG. 7E, the noise vector μ, and the grid 710 cutting objects into pieces. Accordingly, the act of clustering may aim to find clusters containing elements that are close to each other, rather than equal, and thus clustering may allow for some small fraction of outliers. For example, clustering may be based on an approximation algorithm for the k-center problem with outliers, which correctly clusters most of the buckets. In some embodiments, to handle the small fraction of the buckets that are grouped incorrectly, the hash function may be constructed sing a constant rate error-correcting code.

In some embodiments, recovery of one or more objects of the image 700 starts by identifying the buckets that likely contain the cells from S, and labels them consistently (i.e., two buckets containing cells from S should receive the same label), allowing for a small fraction of errors. The labels are then used to identify the cells.

In some embodiments, recovering one or more objects (features) of an image may include calculating a plurality of feature vectors based on the compressed representation of the image. The compressed representation may include one or more folds of the image. For example, the measured signal 724 is a compressed representation of the image 700. FIG. 7F illustrates the measured signal 724, wherein for each bucket 722, represented by $z^i_j$, a feature vector $F(z^i_j)$ has been calculated. For example, a feature vector F corresponding to each of buckets 730, 732 and 734 is shown in FIG. 7F. In one example, the feature vector F may include information about mass and centroid.

In some embodiments, recovering one or more objects may further include thresholding the plurality of feature vectors. FIG. 7G illustrates thresholding the plurality of feature vectors corresponding to the plurality of buckets 722 of FIG. 7F. A plurality of cells 740 corresponding to feature vectors that are above a threshold are highlighted in FIG. 7G. The cells 740 may form a region R={(i,j):||F($z^i_j$)

$\|r\| \geq \text{threshold}\}$. The threshold may be a predetermined threshold. The buckets 722 of FIG. 7F that are not in R may be discarded. The thresholded feature vectors, corresponding to the cells 740 forming the region R, may then be clustered as illustrated in FIG. 7H.

FIG. 7H illustrates three clusters 742, 744 and 746, each cluster corresponding to one of the three objects 704 of the image 700. Each cluster may include at most one bucket from each row or array. The clusters 742, 744 and 746 are generated by clustering the thresholded feature vectors of FIG. 7G. In other embodiments, clustering may be based on feature vectors that are not thresholded. Each cluster may correspond to a different label and each label may correspond to a different object. Formally, clustering may include clustering $F(R) = \{F(z_j^i) : (i,j) \in R\}$ into k clusters. Clustering may include clustering with outliers, for example to handle errors due to noise. Clustering may induce a partition $R'$, $R^1 \ldots R^k$ of R, with $F(R^l)$ corresponding to the l-th cluster.

Recovering one or more objects may further include decoding one or more clusters. Recovering the one or more objects may include recovering the locations corresponding to the one or more objects in the image as shown for example in FIG. 7I. Recovering the one or more objects may include recovering data or values of pixels corresponding to the one or more objects as shown for example in FIG. 7J. FIG. 7I illustrates a signal 750 indicative of the locations of the objects 704 in the image 700. For example, cluster 742 is decoded to recover the location 752 of a first object in the original image 700, cluster 744 is decoded to recover the location 754 of a second object in the image and cluster 746 is decoded to recover the location 756 of a third object in the image. Decoding may thus include decoding each $R^l$ to obtain a cell $d^l$ in the original image.

FIG. 7J illustrates recovering the contents or data corresponding to each of the recovered locations 752, 756 and 754. The recovered contents correspond to the objects 704. In some embodiments, a minimum or median may be used to obtain an approximation to the contents of each cell $d^l$.

Formally, for a set of pairs X, let $F(X)$ denote $\{F(z_j^i) : (i,j) \in X\}$. In some embodiments, recovering features or objects may include the following steps:

1. Identify $R = \{(i,j) : \|F(z_j^i)\| \geq T/2\}$ (that is, $R_i$ contains the "heavy cells" of the measurement vector z). This corresponds to thresholding a plurality of feature vectors as described above. FIG. 7G illustrates a result of applying this step, wherein $R_i$ containing the "heavy cells" 740 are identified.
2. Partition R into sets $R'$, $R^1, \ldots, R^k$ such that $|R'| \leq \delta sk$, and such that for $1 \leq l \leq k$ the diameter of $F(R^l)$ is at most $T/2$.
3. For each label $l=1 \ldots k$, create a vector $u^l \in B$ such that for each $i=1 \ldots s$, $u^l_i = j$ if $(i,j) \in R^l$ (if there are many such j, ties are broken arbitrarily), or $u^l_i = \perp$ (an arbitrary erasure symbol) if no such j exists. FIG. 7H, as described above, illustrates a result of applying steps 2 and 3 of this embodiment.
4. For each label $l=1 \ldots k$ apply decoding for g to $u^l$, obtaining a (possibly invalid) decoded cell $d^l$. Each in $u^l$ may be replaced with an arbitrary j before decoding. FIG. 7I illustrates the result of applying step 4 to the clusters 742, 744 and 746 of FIG. 7H, each of the three clusters corresponding to one of the three distinct labels or objects (k=3).

Analysis

We analyze the above described embodiment of the compressive sensing method by keeping track of the errors at each step of the above four steps.

Step 1: For any cell $c \in S$ and $i=1 \ldots s$, we say that i preserves c if $\|F(z_{gi(c)}^i) - F(x_c)\| \leq T/24$ and $g_i(c') \neq g_i(c)$ for all other $c' \in S$. That is, there is no collision from the hashing process, and the total amount of distortion due to the noise $\mu$ is small. Let $P = \{(i, g_i(c)) : I \text{ preserves } c\}$. Note that $P \subset R$. We show that P is large and that most of R is in P.

Lemma 12

With probability at least 7/8, $|P| \geq (1-\beta) sk$.

Proof. Consider any pair $(c,i) \in S \times \{1 \ldots s\}$, and let $j = g_i(c)$. If i does not preserve c, it must be because either (i) there is another cell $c' \in S'$, $c' \neq c$ such that $g_i(c') = j$, or because (ii) the total noise affecting $z_j^i$, equal to $F(\mu_j^i) \leq \Sigma_{gi(c)=j} F(\mu_c)$, has norm at least T/24.

By Lemma 11 with probability at least 7/8 the number of pairs affected by (i) is at most $32ks|S'|/q$. The event (ii) is determined by the noise vector $\mu$. However, for each i, there are at most $$\frac{\|\mu\|F}{T/24} \leq 24\gamma k$$

additional cells $c \in S$ that are not preserved under i due to this reason.

Altogether, the total number of pairs (c,i) such that c is not preserved by i is at most $32sk|S'|/q + 24\gamma sk = [32\eta(1+16\alpha) + 24\gamma]sk = \beta sk$ as desired.

Lemma 13

With probability at least 3/4, $|R \setminus P| \leq \delta sk$.

Proof. Any element (i,j) of $R \setminus P$ ("heavy but not preserved") must belong to one of the following three categories:

1. $j = g_i(c)$ for $c \in S$ such that c is not preserved by i. By the previous lemma (lemma 12), there are at most $\beta sk$ such pairs (c,i) with probability at least 7/8.
2. $j = g_i(c)$ for some cell $c \in S'' \setminus S$. There are at most $16\alpha sk$ such pairs (c,i), with probability at least 7/8.
3. The vector $F(\mu_j^i) = \Sigma_{gi(c)=j} F(\mu_c)$ has norm at least T/2. There are at most $2\gamma sk$ such pairs (i,j).

This implies that with probability at least ¾ the total number of pairs $(i,j) \in R \setminus P$ is at most $(\beta + 16\alpha + 2\gamma)sk = \delta sk$ as desired.

Step 2: Observe that the elements of $F(P)$ can be clustered into k clusters of diameter T/12. Thus, by the previous lemma, there is a k-clustering of all but $\delta sk$ elements of $F(R)$ such that the diameter of each cluster is at most T/12. A 6-approximation algorithm is now applied for this problem, finding a k-clustering of $F(R)$ such that the diameter of each cluster is at most T/2. Such an approximation algorithm follows immediately from a known 3-approximation algorithm for k-center with outliers.

Step 3: Consider cells $c, c' \in S$ such that c is preserved by i and c' is preserved by i'. If $F(z_{gi(c)}^i)$ and $F(z_{gi(c')}^{i'})$ belong to the same cluster, then it must be the case that $c = c'$, since otherwise the distance between them would be at least $T - 2T/24 > T/2$. In other words, for each l, if $u^l \subset P \cap R^l$ contains at least one element of P, then all the elements of $u^l$ are "derived" from the same cell.

Lemma 14

With probability at least 3/4, $u^1 \ldots u^k$ contain a total of at most $2\delta sk$ errors and $(\delta + \beta)sk$ erasures (i,l such that $u^l_j = \perp$).

Proof. Let $R''=R\backslash R'=R'\cup\ \cup R^k$. Let $P'=P\cap R'$, and $P''=P\cap R''$.

Note that $|P'|\leq|R'|\leq\delta sk$. Each error in $u^1\ldots u^k$ corresponds to a unique element of $R''\backslash P''$, and we have $$|R''\backslash P''|\leq|R''\backslash P|+|P\backslash P''|\leq|R\backslash P|+|P'|\leq\delta sk+\delta sk=2\delta sk.$$

Additionally, $u^1\cdots u^k$ contain at least $P''$ elements total, and so the number of erasures is at most $sk-|P''|=sk-|P|+|P'|\leq\beta sk+\delta sk$, where we use $|P|\geq(1-\beta)sk$ from Lemma 12.

Step 4: We can replace erasures by errors, and conclude $u^1\cdots u^k$ have a total of at most $(3\delta+\beta)sk$ errors. It follows that at least $k/2$ of them have at most $2(3\delta+\delta)s$ errors, and therefore can be decoded. Therefore, the set $D=\{d^1\ldots d^k\}$ contains at least $k/2$ elements of S.

Theorem 15

Assume $k\geq C\log N$ for some constant C, a signal x with k objects, and a noise vector $\mu$, all subject to the constraints delineated in the Example of Class of Images section described above. There is a distribution over random binary m×N matrices A, m=O(k $\log_k$ N), and an associated recovery algorithm with the following property. Suppose that the algorithm is given Ax' for $x'=x+\mu$. Then the algorithm recovers (with probability at least 3/4) a set D of k cells, such that at least k/2 of the cells fully containing an object are included in D. Moreover, the matrix has column sparsity $O(\log_k N)$.

Examples of Systems and Methods (Continued)

Figure 8:
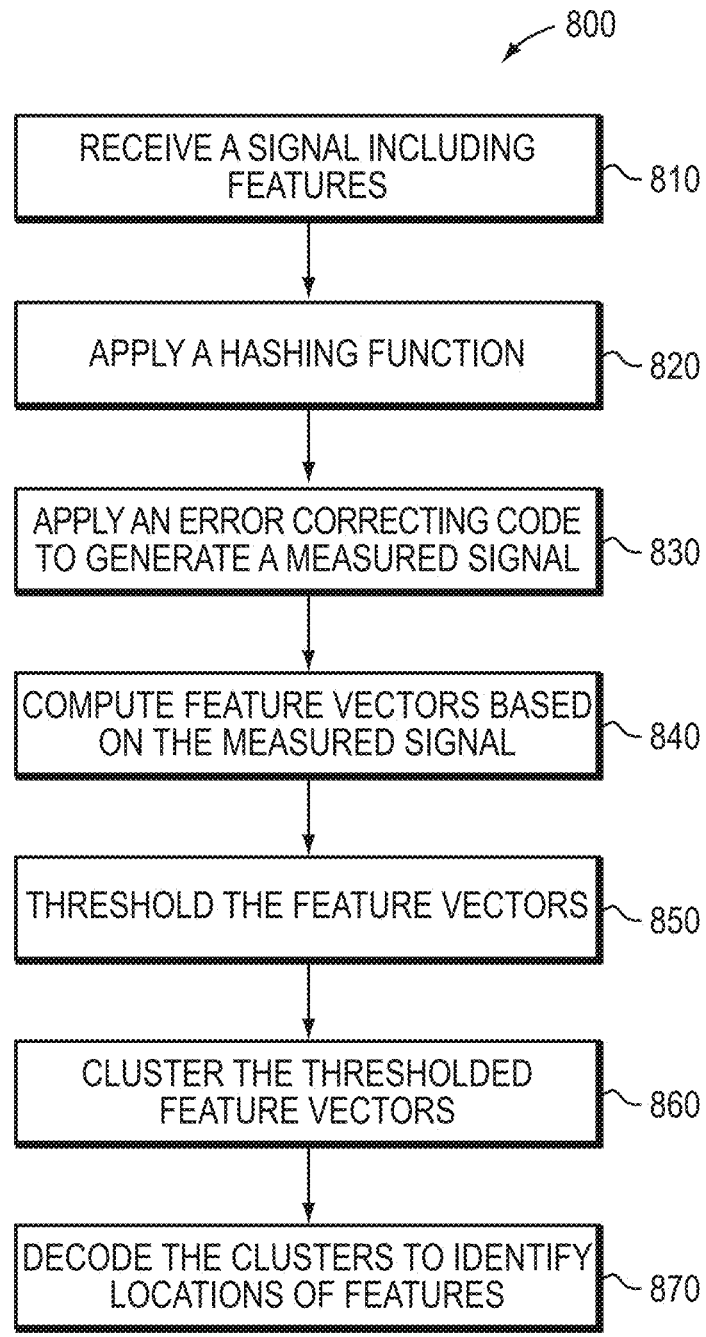
FIG. 8 illustrates one example of a method of compressive sensing according to aspects of the present invention.

Referring now to FIG. 8, there is illustrated a flow chart of one example of an embodiment of a method 800 of compressive sensing. The method 800 includes receiving a signal including features in act 810. For example, the signal may be an image and the features may be objects as illustrated in FIG. 7A. The method 800 further includes an act 820 of applying a hashing function. For example, the hashing function may be any one of the hashing functions disclosed herein. The hashing function may be a pairwise independent hashing function. For example, FIGS. 7D and 7E illustrate applying a hashing function to the image 700. The method 800 further includes applying an error correcting code to generate a measured signal in act 830. For example, FIG. 7E illustrates a result of applying an error correcting code, namely the Chinese Remainder Theorem (CRT) code to generate the measured signal 724. In various embodiments, acts 820 and 830 may be performed in a single step.

The method 800 further includes an act 840 of calculating feature vectors based on the measured signal. For example, FIG. 7F illustrates a result of calculating features vectors for each bucket 722 of the measured signal 724. The method 800 further includes thresholding the plurality of feature vectors calculated in act 850. For example, FIG. 7G illustrates a result of thresholding to generate cells 740 corresponding to thresholded feature vectors. The method 800 further includes clustering the thresholded feature vectors in act 860. For example, FIG. 7H illustrates a result of clustering the thresholded feature vectors of FIG. 7G, thereby generating the clusters 742, 744 and 746, wherein each cluster corresponds to a respective feature to be recovered.

The method 800 further includes an act 870 of decoding the clusters generated in act 860, thereby identifying one or more features of the signal. Identifying one or more features of the signal may include identifying locations of the one or more features in the signal, or may include identifying any other values or content associated with the one or more features. For example, FIG. 7I illustrates a result of applying act 870 to the clusters 742, 744 and 746 of FIG. 7H, to identify the locations of the objects 704. FIG. 7J further illustrates recovering content associated with the recovered cells 752, 754 and 756.

In various embodiments, one or more acts of the method 800 may be performed substantially in parallel, may overlap or may be performed in a different order. In some embodiments, method 800 may include more or less acts. In one embodiment, thresholding the feature vectors in act 850 may not be included in method 800 and act 860 may include clustering the feature vectors calculated in act 840. In some embodiments, acts 810, 820 and 830 may correspond to acquiring a compressed signal corresponding to an original signal including one or more features and acts 840, 850, 860 and 870 may correspond to recovering the one or more features of the original signal based on the compressed signal, without reconstructing the original signal. In one example, acts 810, 820 and 830 may be included in acts 410 and 420 of the method 400 illustrated in FIG. 4, whereas acts 840, 850, 860 and 870 may be included in act 430 of the method 400 illustrated in FIG. 4. In another example, the act 610 of folding an image to generate one or more folds in the method 600 of FIG. 6 may include acts 810, 820 and 830 of the method 800, and the act 620 of recovering features based on the folds in method 600 may include acts 840, 850, 860 and 870 of the method 800.

According to another aspect, various embodiments of apparatuses configured to perform various methods of compressive sensing as disclosed herein may be provided. In one example, the compressive sensing apparatus 300 of FIG. 3 may be configured according to the method 800 of FIG. 8. In particular, the lens 302 may receive an image including features according to act 810. The focal plane array 304 may be configured to perform acts 820 and/or 830 of method 800, thereby acquiring a compressed measured signal corresponding to the image. In some embodiments, the compressed signal may be digitized by the digitizer 308. In other embodiments, acquiring the compressed signal by the focal plane array 304 may include digitizing. The decoder 310 may be configured to perform one or more of the acts 840, 850, 860 and 870, thereby recovering one or more features of the original image.

Figure 9:
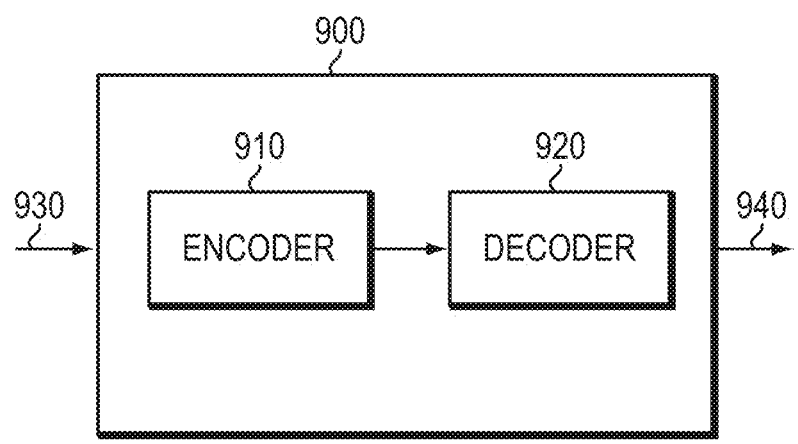
FIG. 9 illustrates one example of an embodiment of a compressive sensing apparatus according to aspects of the present invention.

FIG. 9 illustrates another example of an embodiment of a compressive sensing apparatus 900. The compressive sensing apparatus 900 includes an encoder 910 and a decoder 920. The encoder 910 is configured to receive an input signal 930, such as an input image. For example, the input image 930 may be the image 700 of FIG. 7A. The encoder 910 may further be configured to acquire a plurality of measurements corresponding to the input signal 930, for example by being configured to perform at least one of acts 820 and 830 of the method 800. The encoder 910 may be configured to output an encoded, measured signal, such as the encoded measured signal 724 of FIG. 7E.

The decoder 920 may be configured to receive the measured signal. The decoder 920 may further be configured to perform one or more of the acts 840, 850, 860 and 870 of the method 800 and to generate an output signal 940 indicative of locations or content corresponding to one or more features of the input signal 930. In some embodiments, the apparatus 900 may include other modules. For example, in one embodiment, the apparatus 900 may include a clustering module configured to receive the measured signal from the encoder and to perform one or more of acts 840, 850 and 860 of the method 800, and the decoder may be configured to receive one or more clusters output by the clustering module and to perform act 870 to decode the clusters, thereby generating the output signal 940.

3. SATELLITE NAVIGATION APPLICATION

An example of an application of the various compressive sensing methods and apparatuses disclosed herein is a task in satellite navigation formally known as attitude (i.e., orientation) determination. An attitude is a triple (roll, pitch, yaw) that describes an orientation relative to the fixed night sky. Many satellites compute their attitude by acquiring a picture of night sky, extracting stars from the picture, and matching patterns of stars to an onboard database. A standard attitude determination routine may be implemented, with the picture acquisition and star extraction steps performed by an embodiment of a compressive sensing method disclosed herein. Embodiments of the compressive sensing method perform better recovery on small numbers of measurements and may be orders of magnitude faster than previous compressive sensing approaches.

The implementation of the compressive sensing method applied to satellite navigation is referred to herein as Star Recovery with Geometric Features (SRGF). The SRGF performs star extraction in very small space and time, conforming to the physical constraints of computing on a satellite.

One of the main energy costs in conventional imaging is incurred by analog to digital conversion, as was described for example with reference to FIG. 2. Compressive sensing allows reducing the number of measurements that need to be digitized. Previous compressive imagers have several disadvantages as described herein and in particular are not suited for use as satellite based imagers. One disadvantage is that previous compressive imagers use dense matrices, which are impractical when the signal is weak compared to the noise.

In modern satellites, the entire task of attitude determination is encapsulated in a star tracker or star camera. To acquire attitude, such cameras typically acquire the incoming light as an n-by-n pixel analog signal, referred to as the preimage (that is, the input image or the original image); digitize each of the $n^2$ pixels, to obtain the digital image; locate a set S of star like objects in the digital image; match patterns formed by three to five element subsets of S to an onboard database (this step is commonly known as star identification); and recover spacecraft attitude by using the database coordinates of the identified stars. Digitizing each of the $n^2$ pixels consumes a significant amount of power due to the number of analog to digital conversions, and locating a set S of star like objects in the digital image requires significant processing and memory resources due to the large number of measurements that must be processed. In contrast, compressive sensing methods and apparatuses disclosed herein compress the $n^2$ measurements of the preimage into $m<<n^2$ measurements that then get digitized, reducing the cost of the digitizing and locating steps.

Spatial Distribution of Stars

Figure 10A:
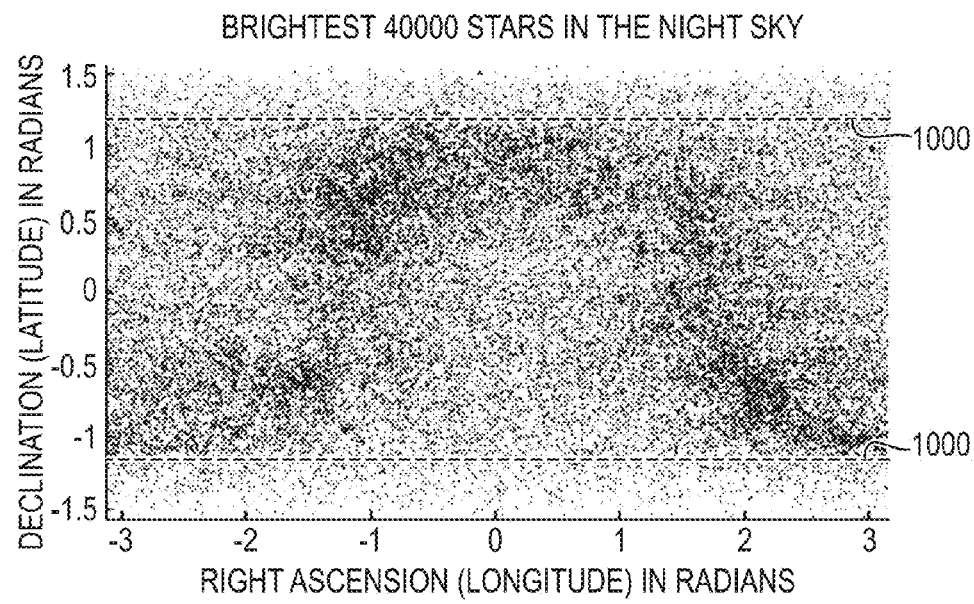
FIG. 10A illustrates the night sky as seen from Earth's orbit, wherein the area between the dashed lines is used herein as an input to a compressive sensing method according to aspects of the present invention.

FIG. 10A shows the distribution of stars across the night sky. The dense omega-shaped region is the central disk of our galaxy. In our pictures, if the median total star mass is 1, the $10^{th}$ percentile mass is 0.6, and the $90^{th}$ percentile mass is 2.25.

We assume everywhere that stars live on a rectangular interval, rather than a sphere. We index the rectangle by right ascension (longitude) $\alpha \in [-\pi,\pi]$ and declination (latitude) $\delta \in [-\pi/2, \pi/2]$; in particular, $\delta=0$ is the equator, and $\delta=\pi/2$ is the north pole. So that the approximation makes sense, we ignore the portion of the sky where $|\delta|>\pi/2-\pi/8$ (the dashed lines 1000 in FIG. 10A). An embodiment of a compressive sensing method is tested on the areas between the dashed lines 1000, where the Mercator projection does not skew the distribution of stars too much. We also assume without loss of generality that the camera is axis-aligned.

Mass Distribution of Stars

Figure 10B:
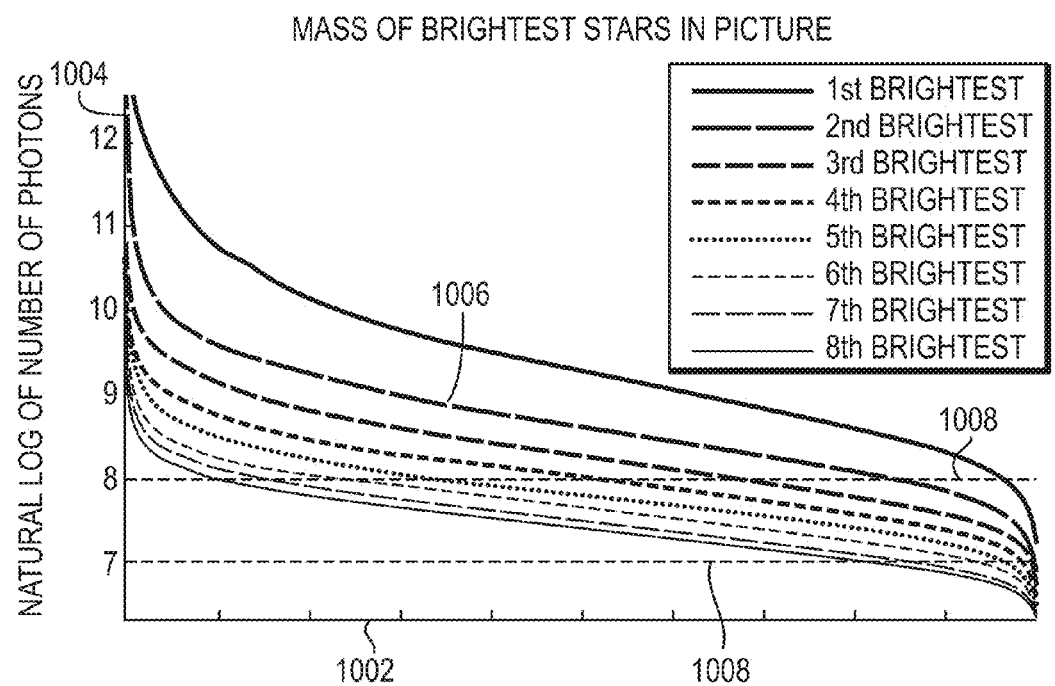
FIG. 10B illustrates a graph of the mass of the brightest stars in images used in a satellite navigation application according to aspects of the present invention.

In one example, we define the mass of a star to be the number of photons from the star that hit our camera. The mass of the $j^{th}$ brightest star in the sky is $\theta(j^{-1.17})$. FIG. 10B gives some intuition for the mass of the biggest stars in our pictures relative to the amounts of noise. There are usually 50 to 150 total stars in a given preimage. In FIG. 10B, the horizontal axis 1002 ranges from 100 to 0 and represents a percentage, and the vertical axis 1004 represents the natural logarithm (ln) of the number of photons. For instance if (x, y) falls on line 1006, it means that in x percent of the pictures, the ln(mass) of the second biggest star is greater than y. The two dashed lines 1008 are the expected Gaussian $L_1$ noise over a given star when there is a standard deviation of 150 and 400 photons of noise per pixel.

Sample Images

Figure 11C:
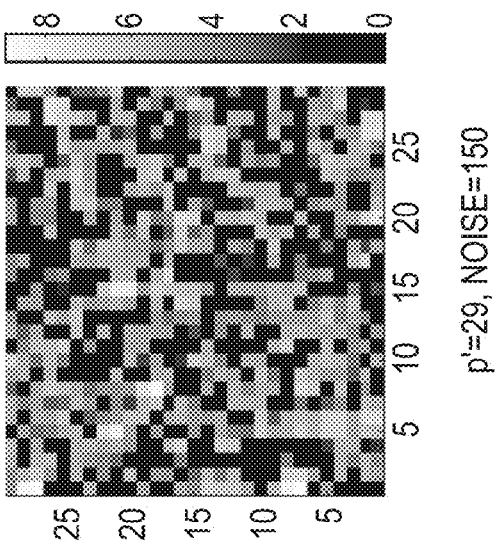
FIGS. 11A to 11C illustrate the logarithm of the mass of stars in sample images from one representative section of the sky.
Figure 11B:
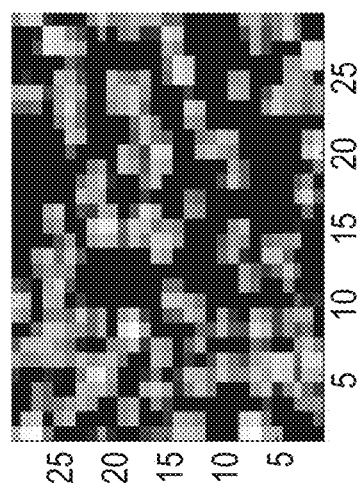
Figure 11A:
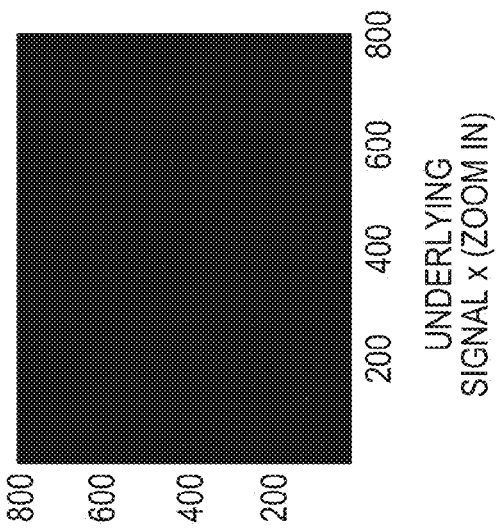

FIGS. 11A to 11C illustrate examples of images to provide intuition about star density and what stars look like. The log(mass) in sample images from one representative section of the sky is shown. The legend on the right applies to all three images. It is generally possible to see where the biggest stars are located, though some fraction of them are occluded by small stars or noise. FIG. 11A illustrates an underlying signal x, showing a plurality of stars in the night sky. All images have Poisson noise applied, though FIGS. 11A and 11B have no additional Gaussian noise. We cut off pixels with values below zero before taking the log in FIG. 11C.

Implementation Example

In one implementation, we fix n=800 (N=640000) for all experiments, where n is the number of pixels in each dimension and N is the total number of pixels of an image. We expose the camera to a 0.08 radian by 0.08 radian (4.6 by 4.6 degree) patch of the sky, which means that a typical image will have around 3 to 10 objects (bright stars, $10^{th}$ percentile to $90^{th}$ percentile) and 50 to 150 stars that act as background noise. To generate test images, we use the Smithsonian Astrophysical Observatory (SAO) Star Catalog, randomly select patches from the sky, and convolve the stars with a Gaussian of radius 0.5 pixels. These are typical values for modern star cameras. Stars are point sources of light. Stars cover more than one pixel in the preimage only because the lens of the camera convolves the image with a function approximated by a Gaussian.

In this example, we set the column sparsity s to a small value: 2. We set the object size w to 3, as the vast majority of a star's mass falls within a 3-by-3 box.

In this example, we assume the stars are randomly (rather than adversarially) distributed within the image x', and use that to simplify construction of the measurement vector z=Ax'. In particular, we no longer need to compose our error correcting code with a hash family such as that from Definition 1. If $p_1$ and $p_2$ are the primes used to construct the CRT code as described above under the Chinese Reminder Theorem code, we find primes $p'_i$ such that $p'_i \approx \sqrt{p^i}$. Note that we don't necessarily need $p'_1$ and $p'_2$ to be prime, as long as they are relatively prime or coprime, since the Chinese Remainder Theorem used in the decoding step of recovery applies in this case as well. As used herein, the term prime may refer to $p'_i$ and $p'_2$ even when they are just relatively prime or coprime.

Notating x' as an n-by-n image, we define $z^i$ to be a $p'_i$-by-$p'_i$ image with $$z^i[j_1, j_2] = \sum_{\substack{c_1 = j_1 (mod\, p_i') \\ c_2 = j_2 (mod\, p_i')}} x'[c_1, c_2].$$

Since the stars were assumed to be randomly distributed in x', they are randomly distributed within each $z^i$ as well. We may define the measurement vector z to be a 1-dimensional representation of the pair $(z^1, z^2)$, and construct our measurement matrix A accordingly. We may think of each $z^i$ as a 2-dimensional image. Each $z^i$ may be a fold corresponding to the image x'. Therefore, $z^1$ and $z^2$ are two folds based on the image x'.

As described and illustrated for example with reference to FIG. 7, recovering one or more stars based on $z^1$ and $z^2$ in this example includes the following steps of calculating feature vectors, thresholding, clustering and decoding:
1. In each $z^i$, we identify ten 3-by-3 cells with high mass such that no two cells collide in more than 4 pixels. We allow the 3-by-3 cells to wrap around the edges of $z^i$.
2. In place of a k-centering algorithm, we greedily choose up to 8 pairs of cells $(c^1, c^2)$ from $(z^1, z^2)$ such that the feature vectors $F(c^1)$ and $F(c^2)$ are close. In this example, the feature vector F(c) is a triple of values: the mass of c, along with two coordinates for the centroid of c. Each pair of cells represents a cluster including a first cell $c^1$ from $z^1$ and a second cell $c^2$ from $z^2$. Each pair from this step corresponds to one of the $u^i$.
3. Apply the Chinese Remainder Theorem in each dimension to recover a 3-by-3 region of the original image for each pair from step 2.

We now have an image x" with up to 8 decoded regions, or "star candidates". We input x" into a star identification algorithm. In one example, star identification works as follows: We first extract a subset SAO' of the Star Catalog SAO, by taking the 10 largest stars in every ball of radius 4.6 degrees. SAO' has 17100 stars, compared to 25900 stars in SAO. We then build a data structure DS that can find a triangle of stars in SAO' given three edge lengths and an error tolerance. We query DS with subsets of three stars from x" until we find a match. Star identification may be performed by any regular star identification algorithm, and in particular a star identification algorithm that has some tolerance for incorrect data.

There are many sources of noise in real star cameras; we mimicked the major ones by having photons hit the camera in a random Poisson process, and by adding Gaussian noise to Ax'. We report our results as a function of the standard deviation of the added Gaussian noise.

The above described example implementation of a compressive sensing method, referred to herein as Star Recovery with Geometric Features (SRGF), was run, along with another example, Sequential Sparse Matching Pursuit (SSMP), on 159 randomly generated images of the sky. SSMP is a near-linear (in N) time procedure with recovery quality on par with other known methods. The same measurement matrix A was used for both methods. In this application, both SRGF and SSMP only attempt to recover portions of the signal x'; we then ran the same star identification algorithm on the outputs of both of them. We note that SSMP is not designed for this level of sparsity, and works better for d>2.

Figure 12:
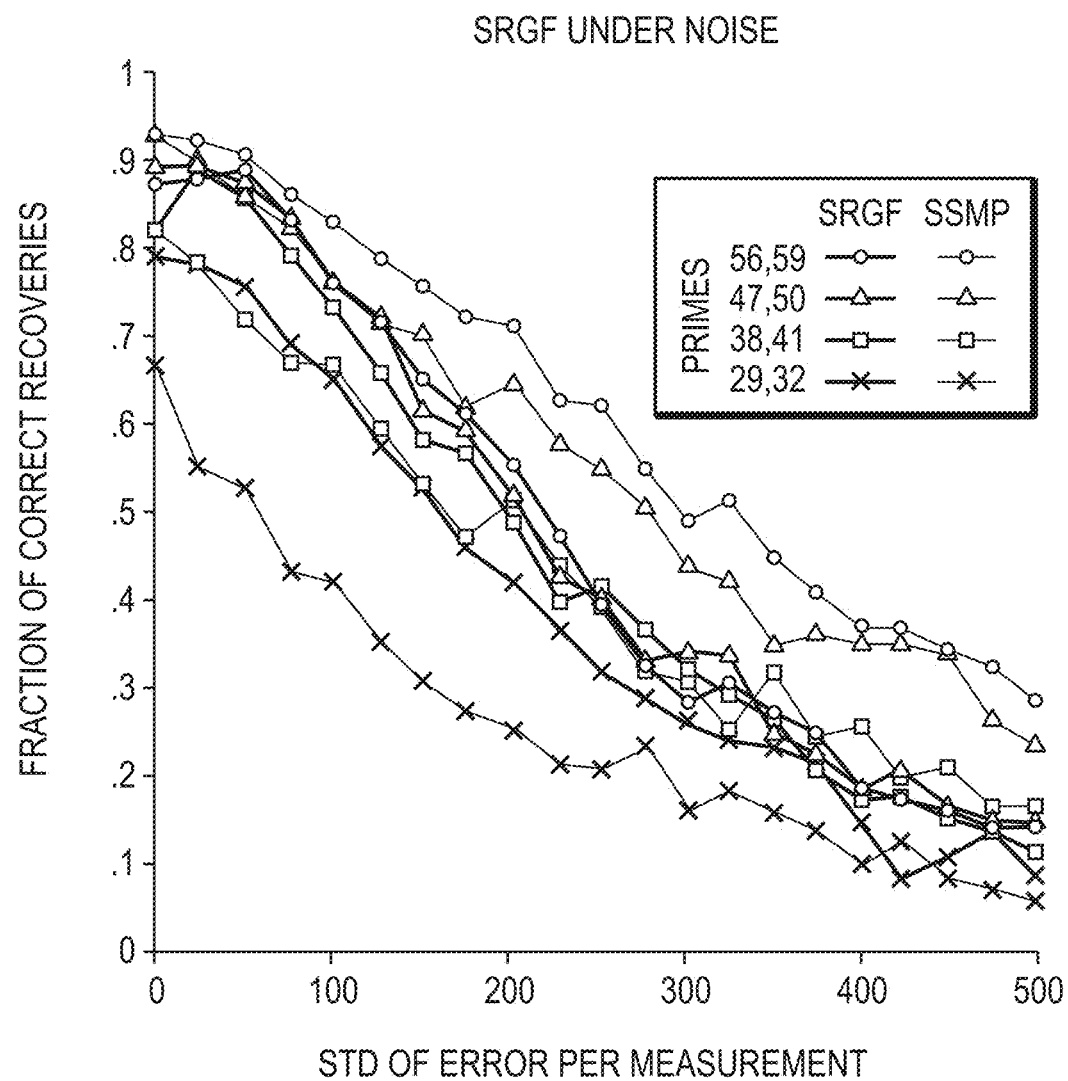
FIG. 12 illustrates a result of applying one example of a method of compressive sensing to a satellite navigation application according to aspects of the present invention.

FIG. 12 illustrates results of the experiments described above. Each data point in FIG. 12 is calculated using the same 159 underlying images. The first observation we make is that SRGF works very well down to an almost minimal number of measurements. The product $p'_1 p'_2$ has to be greater than 800, and the minimal set of primes is 26 and 31. As the number of measurements increases, SSMP catches up and surpasses SRGF, but we note that running SSMP (implemented in the programming language C) takes 2.4 seconds per trial on a 2.3 GHz laptop, while SRGF (implemented in Octave/Matlab) takes 0.03 seconds per trial. Computation power on a satellite is substantially lower than that of a low end laptop, and given that the entire acquisition has to happen in 0.1 to 2 seconds, it seems unlikely that any algorithm linear or near linear in N is going to be practical. Finally, we note that all plot lines in the results could be improved by a more thorough implementation of a star identification algorithm.

4. MUZZLE FLASH DETECTION APPLICATION

Figure 13:
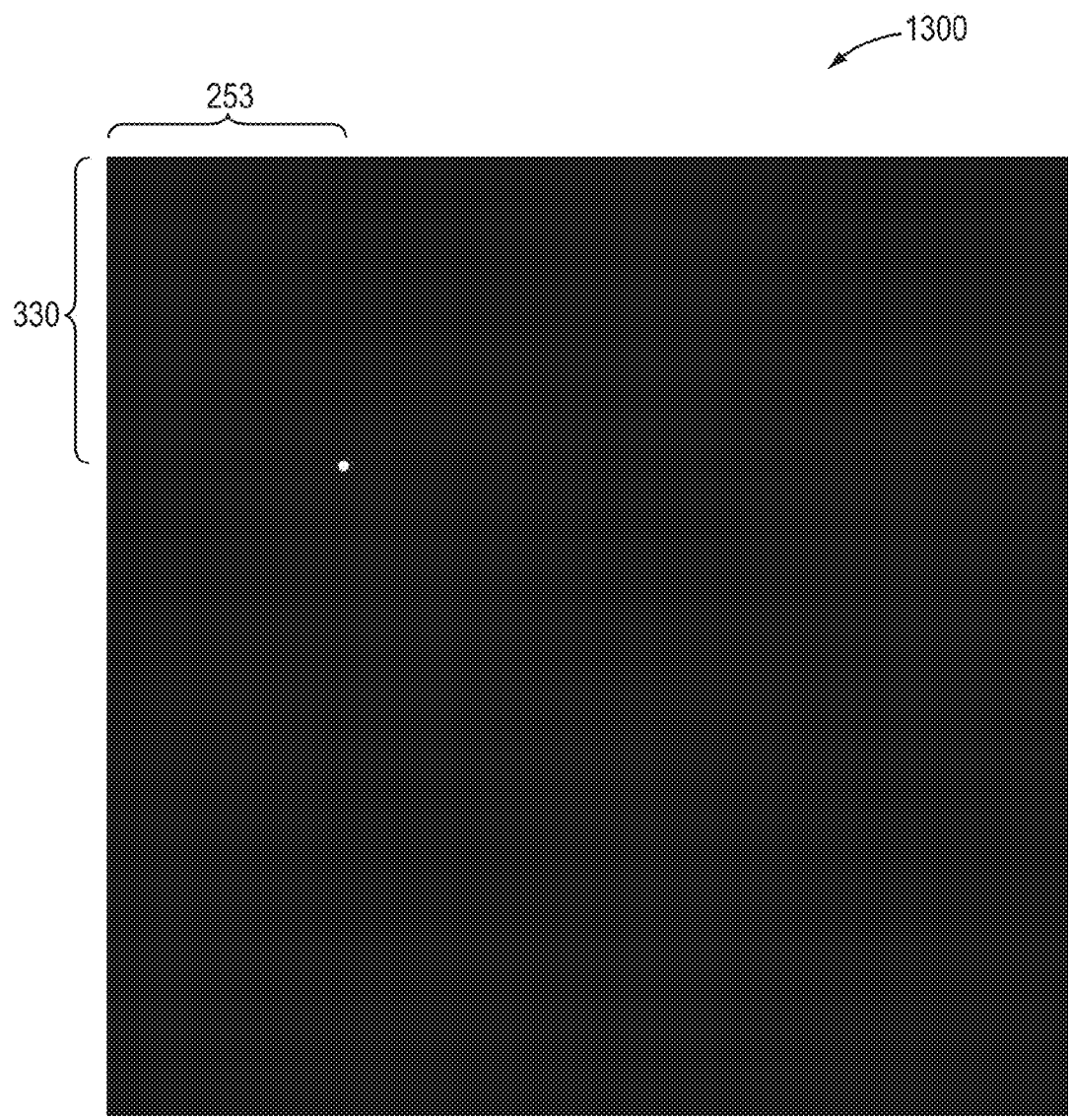
FIG. 13 illustrates one example of an image of a muzzle flash.

Referring to FIGS. 13 to 16, there is illustrated an example of applying embodiments of compressive sensing disclosed herein to detect muzzle flash. FIG. 13 illustrates one example of an image 1300 of a muzzle flash, having a size of 1024×1024 pixels, with the shot location at 330 along the vertical dimension and at 253 along the horizontal dimension. The image 1300 may be input to a compressive sensing method, such as the method 800 of FIG. 8. The image 1300 may be input to a compressive sensing apparatus, as shown for example in FIGS. 3 and 9.

Figure 14:
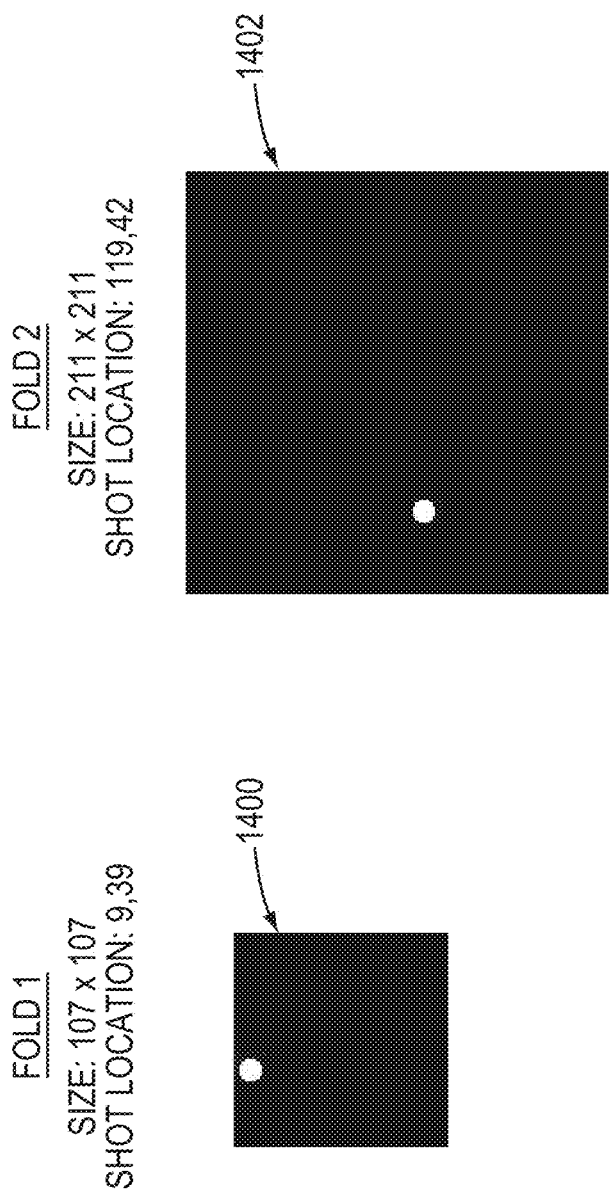
FIG. 14 illustrates two folds corresponding to the image of FIG. 13 according to aspects of the present invention.

In one example, the image 1300 is folded to generate a first fold 1400 and a second fold 1402 as shown in FIG. 14. The first fold 1400 has a first size of 107×107 pixels and a shot location at pixel 9 along the vertical dimension and at pixel 39 along the horizontal dimension. The second fold 1402 has a second size of 211×211 pixels and a shot location at pixel 119 along the vertical dimension and at pixel 42 along the horizontal dimension. The fold sizes may be selected to be coprime. The folds 1400 and 1402 may be generated, for example, by the encoder 910 of FIG. 9. The folds 1400 and 1402 represent a compressed signal corresponding to the image 1300. That is, instead of acquiring the entire image 1300, the folds 1400 and 1402 are acquired. Based on the size of the acquired folds 1400 and 1402 compared to the size of the original image 1300, the total compression in this example may be calculated as $(107^2+211^2)/1024^2=0.534$ or around 5%. Thus, the number of measurements acquired is much less than the size of the original image 1300.

Figure 15:
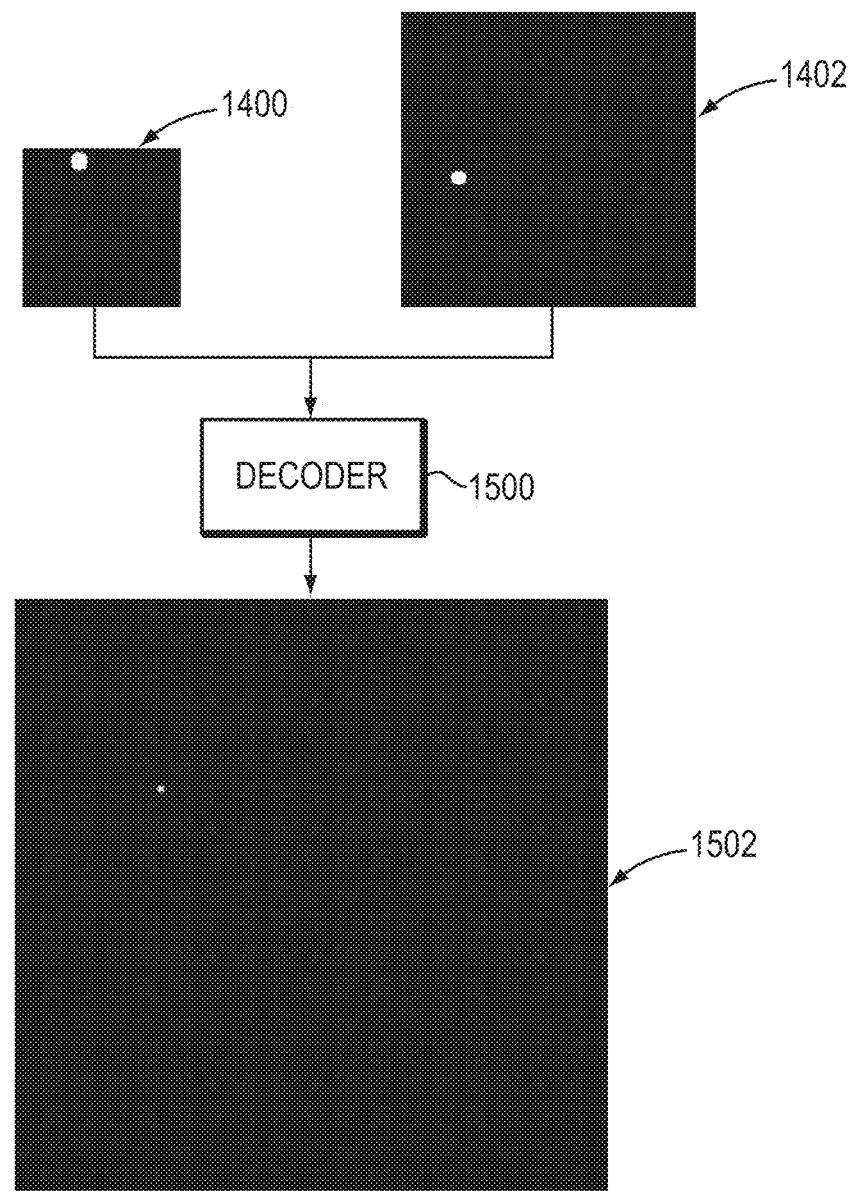
FIG. 15 illustrates decoding to recover the muzzle flash of FIG. 13 based on the two folds of FIG. 14 according to aspects of the present invention.

FIG. 15 illustrates decoding to recover a feature, in this case the muzzle flash location, of the image 1300 based on the first fold 1400 and the second fold 1402. The first fold 1400 and the second fold 1402 are input to a decoder 1500. The decoder may be configured to recover the muzzle flash location based on the first fold 1400 and the second fold 1402, without reconstructing the original muzzle flash image 1300. In one embodiment, the decoder 1500 may be the decoder 920 of FIG. 9. As shown in FIG. 15, the decoder outputs a signal 1502 indicative of the detected muzzle flash. The decoder 1500 may be configured to decode the muzzle flash location based on only 5% of the original measurements of the image 1300. In one example, decoding may include applying the Chinese Remainder Theorem code.

Since the fold sizes (107 for the first fold 1400 and 211 for the second fold 1402) are coprime and N=107*211>1024, decoding may apply CRT along each of the horizontal and vertical dimensions to decode the original muzzle flash location. In this embodiment, the feature is recovered based on two folds. In other embodiments, the feature may be recovered based on a different number of folds.

Figure 16:
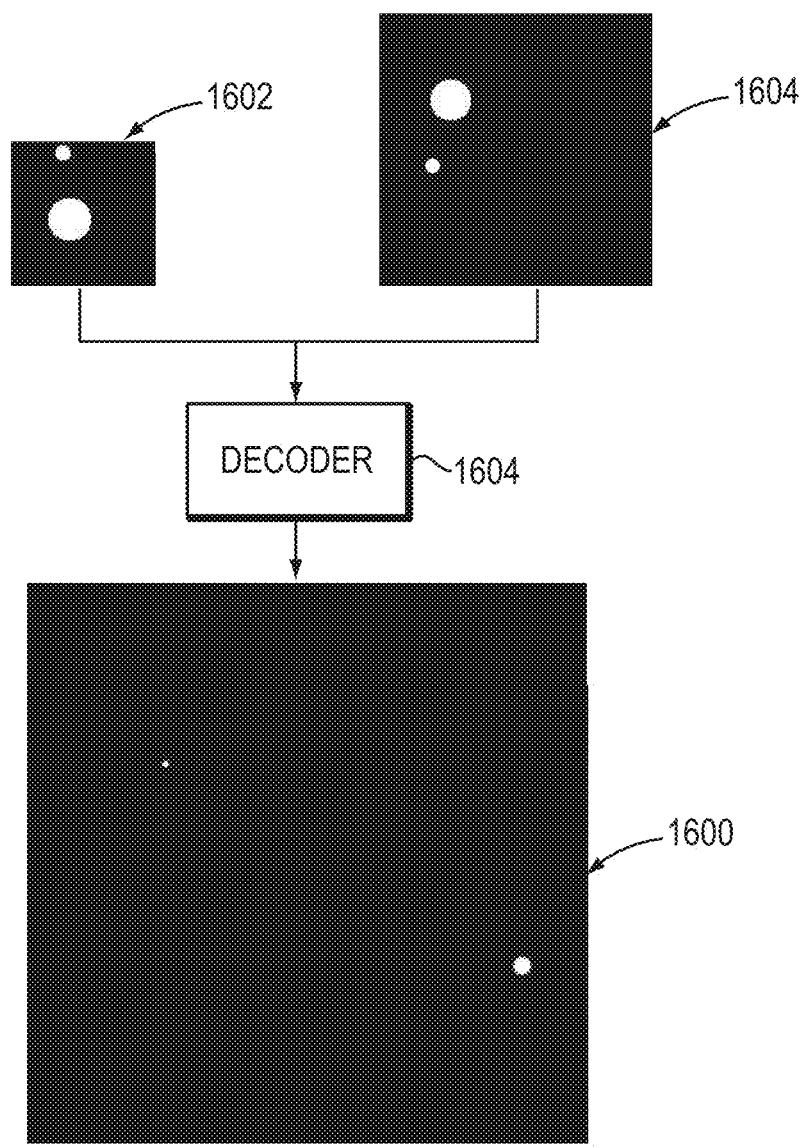
FIG. 16 illustrates another example of decoding to identify a plurality of muzzle flashes based on folds according to aspects of the present invention.

FIG. 16 illustrates another example of recovering a plurality of muzzle flashes as shown in the output image 1600, based on a first fold 1602 and a second fold 1604. The plurality of muzzle flashes may be differentiable. The folds 1602 and 1604 have different sizes and each fold has a size smaller than the original image used to generate the folds. The fold sizes may be selected to be coprime. A decoder 1604 receives the first fold 1602 and 1604 and generates the output image 1600 indicative of the detected muzzle flashes. In one embodiment, the decoder 1604 may be configured to apply CRT along each of the horizontal and vertical dimensions to decode the original muzzle locations based on the first fold 1602 and the second fold 1604. In this embodiment, the features are recovered based on two folds. In other embodiments, the features may be recovered based on a different number of folds.

In some embodiments disclosed herein, an input image may exhibit spatial sparsity. When an input image is spatially sparse, that is most pixels have a value of zero, folding introduces relatively little degradation as most non-zero pixels end up being summed with zero-valued pixels in the folded representation. Examples include star images of the night sky and images of muzzle flash as described above. In some embodiments, an input image may not exhibit spatial sparsity. For example, an input image may be a natural image, wherein the zero-valued pixels of spatially sparse images become non-zero for natural images. In this case folding may introduce distortion in the form of signal noise as features of interest are added to other non-zero pixel values.

In various embodiments disclosed herein, the features to be recovered may be corners, as described next. Other embodiments may be directed at determining translation or rotation between two images, such as between subsequent image frames. These features may be recovered based on compressed or folded representations according to aspects of the present disclosure. Simulation results showing the performance of various embodiments on natural images are also disclosed.

5. COMPRESSIVE CORNER DETECTION

In various embodiments, a feature to be recovered may be a corner. According to aspects disclosed herein, some embodiments of compressive sensing methods and apparatuses may be used for recovering corners, for example based on folded representations of an image. One example of application of these embodiments is vision-based navigation systems where features are tracked from consecutive video frames for motion and navigation estimation. Embodiments of compressive sensing methods and apparatuses for recovering corners based on folds are presented next, along with simulation results of applying the embodiments to various images.

In various embodiments, a method of compressive sensing to recover one or more corners based on folds may include one or more acts of folding, detecting corners based on folds, pairwise correlating corners, matching corners and decoding.

Figure 17:
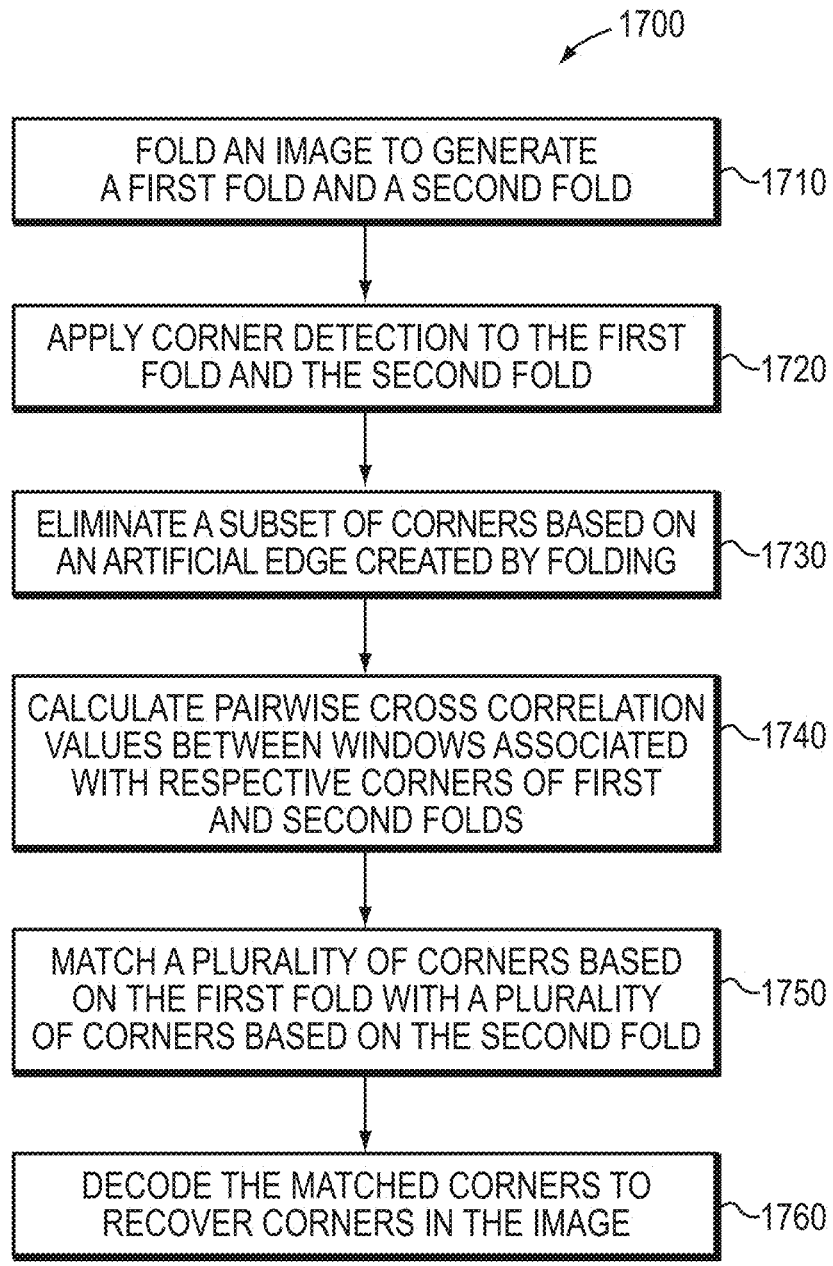
FIG. 17 illustrates one example of a method of compressive sensing for recovering corners in an image according to aspects of the present invention.

FIG. 17 illustrates a flow chart of one example of an embodiment of a method 1700 of compressive sensing for recovering corners of an image. The method 1700 includes an act 1710 of folding an image to generate a first fold and a second fold according to aspects disclosed herein. In some embodiments, folding in act 1710 may include applying a hashing function or applying an error correcting code, as shown for example in method 800 of FIG. 8. In some embodiments, the first fold and the second fold may have different sizes. The sizes of the folds may be prime or coprime. In some embodiments, folding may include applying one of a Chinese Remainder Theorem code or a Reed Solomon code. In FIG. 17, act 1710 includes generating two folds. In some embodiments, act 1710 may include generating a different number of folds and one or more of the other acts of the method 1700 may be based on a different number of folds.

In one embodiment, the input image is I and the first and second folds generated in act 1710 are two distinct folds, $F_1[x_1,x_2]=\text{FOLD}(I,p_{1a},p_{1b})$ and $F_2[x_1,x_2]=\text{FOLD}(I,p_{2a},p_{2b})$, where $p_{1a}$ and $p_{2a}$ are the fold sizes of a first dimension and $p_{1b}$ and $p_{2b}$ are fold sizes of a second dimension, and the fold sizes of each dimension are pairwise coprime, that is gcd$(p_{1a},p_{2a})=1$, gcd$(p_{1b},p_{2b})=1$, where gcd is the greatest common denominator. Act 1710 may further include applying a CRT code. Method 1700 may include decoding to recover one or more corners of the image I based on the CRT code, the first fold and the second fold, as will be described further below with reference to act 1760.

The output generated by applying the method 1700 may include $[x_1,x_2]$ pixel locations that are candidate corner locations. That is, recovering one or more corners may include recovering locations of the one or more corners. In some embodiments, recovering one or more corners may include recovering any other values or content associated with the one or more corners.

The method 1700 further includes an act 1720 of applying corner detection to the first fold and the second fold. Applying corner detection to the first fold may generate a first plurality of corners and applying corner detection to the second fold may generate a second plurality of corners.

In some embodiments, folding in act 1710 may create an artificial edge in at least one of the first fold and the second fold. The artificial edge is an artifact of folding and is not representative of the input image. Accordingly, the method 1700 may include an act of detecting one or more artificial edges associated with at least one of the first fold and the second fold. Method 1700 may further include an act 1730 of eliminating a subset of corners generated by act 1720, based on an artificial edge. In particular, a first subset of corners may be eliminated from the first plurality of corners to generate a first plurality of pruned corners, and a second subset of corners may be eliminated from the second plurality of corners to generate a second plurality of pruned corners. In some embodiments, acts 1720 and 1730 may be performed substantially in parallel or may overlap.

The method 1700 further includes an act 1740 of calculating pairwise cross correlation values between windows associated with respective corners of the first and second folds. As will be described in detail further below, act 1740 may include calculating a plurality of cross correlation values. A cross correlation value may correspond to a first window and a second window, where the first window is associated with a first corner of the first plurality of corners and the second window is associated with a second corner of the second plurality of corners. The first and second plurality of corners may be generated by act 1720, or may be the first and second plurality of pruned corners generated by act 1730. Cross correlation values may be calculated in act 1740 for all pairs of corners, each pair including a first corner from the first fold and a second corner from the second fold.

Cross correlation values may then be used to match each corner of the first fold with a corresponding corner of the second fold in act 1750 of the method 1700. Matching corners in act 1750 may include, for example, pruning a candidate match based on a cross correlation value. For example, thresholding may be applied to prune candidate matches. In some embodiments, acts 1740 and 1750 may be performed substantially in parallel or may overlap. The method 1700 further includes an act 1760 of decoding the matched corners to recover corners of the image. In one example, decoding may be based on the CRT code.

In various embodiments, one or more acts of the method 1700 may be performed substantially in parallel or may overlap. Act 1710 may be an instance of acquiring a compressed signal corresponding to an original signal including one or more features (corners) and acts 1720 to 1760 may correspond to recovering the one or more features of the original signal based on the compressed signal, without reconstructing the original signal. In one embodiment, act 1710 of the method 1700 may be one example of act 610 of folding an image to generate one or more folds in the method 600 of FIG. 6 and acts 1720 to 1760 of the method 1700 may correspond to one example of the act 620 of recovering features based on the folds in method 600 of FIG. 6.

According to another aspect, various embodiments of apparatuses configured to perform various methods of compressive sensing as disclosed herein may be provided. In one example, the compressive sensing apparatus 300 of FIG. 3 may be configured according to the method 1700 of FIG. 17. In particular, the lens 302 may receive an image including corners. The focal plane array 304 may be configured to perform act 1710 of the method 1700, thereby folding the image to generate a plurality of folds corresponding to the image. In some embodiments, the folds may be digitized by the digitizer 308. In other embodiments, folding by the focal plane array 304 may include digitizing. The decoder 310 may be configured to perform one or more of the acts 1720, 1730, 1740, 1750 and 1760, thereby recovering one or more corners of the original image.

In one example, the compressive sensing apparatus 900 of FIG. 9 may be configured according to the method 1700 of FIG. 17. For example, the encoder 910 may further be configured to fold an image 930 according to act 1710 and to output the first and second folds. The decoder 920 may be configured to receive the folds, to perform one or more of the acts 1720, 1730, 1740, 1750 and 1760 of the method 1700 and to generate an output signal 940 indicative of locations or content corresponding to one or more corners of the input image 930. In some embodiments, the apparatus 900 may include other modules. For example, in one embodiment, the apparatus 900 may include a corner detection module configured to receive the folds from the encoder and to perform one or more of acts 1720 and 1730, and a matching module configured to receive the corners from the corner detection module and configured to perform one or more of acts 1740 and 1750. In this embodiment, the decoder 920 may be configured to receive matched corners output by the matching module and to perform act 1760 to decode the matched corners, thereby generating the output signal 940.

Referring again to FIG. 17, applying corner detection in act 1720, eliminating a subset of corners based on artificial edges in act 1730, calculating correlation values in act 1740, matching corners in act 1750 and decoding based on the matched corners in act 1760 are each described next in further detail.

Corner Detection

Applying corner detection, for example in act 1720 of the method 1700 illustrated in FIG. 17 may include applying one of various corner detection algorithms, such as those described below.

To a human, corner detection seems rather simple: there is a corner wherever two edges intersect at close to a right angle. However, as is typically the case in machine vision, a more systematic and mathematical approach is needed to detect a corner using a computer system or a compressive sensing apparatus. Harris and Stephens proposed an approach in 1988 that has become a widespread standard for the task. Intuitively, it strives to find pixels that have drastic changes in intensity in two orthogonal directions. One can think of this as there exists a corner wherever the sum of squared differences between an image patch and the shifted version of the patch by 1 pixel in the horizontal and vertical directions has a large value. If a large difference is observed only when shifting in the horizontal or vertical direction, then the image patch contains an edge. If no large response is observed when shifting in any direction, then the image patch is of relatively constant intensity. Harris extended this simple method of corner detection to be isotropic by incorporating all possible shifts, not only in the horizontal and vertical direction, by approximating the sum of squared differences via a Taylor expansion. Following is a formal statement of the Harris corner detection algorithm:

Let a grayscale image I be the input to the algorithm. $I[x_1,x_2]$ represents the image intensity at pixel location $[x_1,x_2]$. Harris corner detection may include the following steps:

1. Calculate discrete approximations to the image gradient in both the horizontal and vertical directions, $I_x[x_1,x_2]$ and $I_y[x_1,x_2]$ calculated as $$I_x[x_1, x_2] = I[x_1, x_2] * [\begin{matrix} -1 & 0 & 1 \end{matrix}]$$

$$I_y[x_1, x_2] = I[x_1, x_2] * \begin{bmatrix} -1 \\ 0 \\ 1 \end{bmatrix}$$

The symbol * indicates 2-dimensional convolution. Two important details of one example implementation are: 1) The output image size is truncated to be equal to the larger of the two input image sizes and 2) edge values are replicated for the computation of output values where the convolutional mask extends past the input image boundaries; this reduces edge effects from the convolution.

2. Form a circular smoothing window, $w[x_1,x_2]$ typically derived from a two dimensional Gaussian, $$e^{-\frac{x_1^2+x_2^2}{2\sigma^2}}$$

of standard deviation $\sigma$.

3. Create the Harris matrix Mat every pixel location, $[x_1,x_2]$, defined as:

$$M[x_1, x_2] = \begin{bmatrix} (I_x^2 * w)[x_1, x_2] & (I_x I_y * w)[x_1, x_2] \\ (I_x I_y * w)[x_1, x_2] & (I_y^2 * w)[x_1, x_2] \end{bmatrix}$$

4. Calculate the corner response function R (x,y) defined as:

$$R[x_1,x_2]=\text{determinant}(M[x_1,x_2])-k^*\text{trace}(M[x_1,x_2])$$

If we let α and β be the eigenvalues of the matrix $M[x_1,x_2]$, then corner pixels are located where both α and β are large. It can be computationally expensive to calculate the eigenvalues at all pixel locations, so an approximation to this explicit calculation is achieved with the above corner response function $R[x_1,x_2]$. In this expression, k is a sensitivity factor. Smaller values of k make the algorithm more likely to detect sharper corners.

The Harris algorithm outputs the corner response function $R[x_1,x_2]$. It is a distribution over all the pixels of corner likelihoods. Larger values of R indicate a stronger corner response for that pixel and thus an increased likelihood of being a corner.

The next step is to extract exact corner locations from the response function $R[x_1,x_2]$. According to one aspect disclosed herein, this may include at least one of non-maximal suppression and corner identification steps:

Non-maximal Suppression: This step may include "thinning" the response matrix by shrinking neighboring connected large response values (corresponding to the same corner) to the single local maxima. This avoids outputting two adjacent pixels as separate corners when in reality they have large corner response values $R[x_1,x_2]$ due to the same corner region in the image.

Corner Identification: This step includes picking a subset of the largest corner response values (after non-maximal suppression) as the output of the algorithm. The desired method for doing so is largely application specific, but two common constraints are returning the N best corners (N largest corner response values $R[x_1,x_2]$) or returning all corners with a response function value above a user-specified quality level Q.

An example implementation of act 1720 of the method 1700 includes applying a modified version of Harris corner detection as described above. Harris corner detection may be implemented, for example, based on the corner function in MATLAB. The window function w is a 5×5 two-dimensional Gaussian kernel with standard deviation σ=1:5:

$$w = \begin{bmatrix} 0.0144 & 0.0281 & 0.0351 & 0.0281 & 0.0144 \\ 0.0281 & 0.0547 & 0.0683 & 0.0547 & 0.0281 \\ 0.0351 & 0.0683 & 0.0853 & 0.0683 & 0.0351 \\ 0.0281 & 0.0547 & 0.0683 & 0.0547 & 0.0281 \\ 0.0144 & 0.0281 & 0.0351 & 0.0281 & 0.0144 \end{bmatrix}$$

In an example implementation, a sensitivity factor k=0:04 is used. Additionally, a maximum of N=200 corners is returned per image and only corners with a response function value above quality level Q equal to 1% of the maximum response value is returned, namely only those pixels with $R[x_1,x_2]>0.01^*\max(R[x_1,x_2])$.

In one embodiment, a modified version of Harris corner detection, as described above, is performed in acts 1720 and 1730, based on the two folds, $F_1[x_1,x_2]$ and $F_2[x_1,x_2]$ generated in act 1710. The departure from standard Harris corner detection is that a certain subset of the corner response values is ignored when selecting the best corners. As described above with reference to act 1730 of the method 1700, this is to deal with the fact that the folding process may create a prominent artificial (false) edge in a resultant fold in both the horizontal and vertical directions. This occurs when the fold size does not perfectly divide the image dimension. For example, artificial edges are created when the final subimages in the folding at the extremes of the image (the right and the bottom) add value to only a subset of the folded image pixels. This phenomenon creates a sharp intensity drop off in the form of an edge in the horizontal and vertical edges. This artificial edge is problematic for corner detection when many false corners are created from other natural edges in the image folding on top of this artificial edge.

FIG. 18 illustrates this phenomenon of artificial edges. The image 1800 is folded to generate a fold 1802. If the image 1800 is an input image I of size M×N then the artificial horizontal and vertical edges occur at M (mod $p_{ia}$) and N (mod $p_{ib}$) where i is the index of the current fold 1802. The fold 1802 includes artificial edges within the region marked by the vertical lines 1804 and within the region marked by the horizontal lines 1806.

It is known a priori that false corners will deterministically be created along these artificial edges from the folding. In one embodiment, in order to compensate, all corner response values $R[x_1,x_2]$ within a distance of d pixels from artificial edge locations are ignored in selecting the best corners to output. For example, FIG. 18 shows the regions between the vertical lines 1804 and between the horizontal lines 1806 which are ignored. This has the side effect of throwing out any original corners that happen to fold into the ignore regions. Assuming a somewhat uniform distribution of corners in the input image, this does not result in the loss of too many original corners. Specifically the probability of loss from landing in the ignore regions for any given corner is $$P(\text{loss}) = \frac{(2d+1)M + (2d+1)N - (2d+1)^2}{MN}$$

Referring again to FIG. 17, performing acts 1720 and 1730 results in an output of two sets of detected $[x_1,x_2]$ corner locations, $c_1$ and $c_2$, from the two input folds $F_1$ and $F_2$ generated by act 1710.

Pairwise Correlation

Calculating pairwise correlation values, for example in act 1740 of the method 1700 illustrated in FIG. 17 may include calculating correlation values as described herein.

In one embodiment, the normalized cross correlation between image windows (patches) centered on the corners detected from the previous step (such as from acts 1720 and/or 1730) is calculated. As used herein, the terms window and patch may be used interchangeably. In one embodiment, square image patches of size 2b+1 by 2b+1 are used, where b is the distance from the center pixel to the edge of the image patch. Normalized cross correlation may be used instead of standard cross correlation for a couple of reasons. First, the output values are normalized to the range [−1,1] which is a desirable property for relative comparisons between image patches. Second, it is more robust to lighting and amplitude changes between images, which we expect to be true from the degradation of folding. The signal noise from the folding may yield image patches corresponding to the same corner in the original image that are unequal in the two folded versions. However, in the act of calculating cross correlation values, we are leveraging the fact that enough image content is preserved in the local neighborhood for template matching between patches to enable corner matching in the next step (such as in act 1750 of the method 700).

In one example, the cross correlation value may correspond to a shift size of zero. In other words, we may take the cross correlation value of when the image patches are perfectly aligned. If $p_1[x_1,x_2]$ and $p_2[x_1,x_2]$ are the image patches of size 2b+1 by 2b+1 centered on the corners, we may compare the correlation value defined as:

$$\frac{\sum_{x_1,x_2}(p_1[x_1,x_2]-\bar{p}_1)(p_2[x_1,x_2]-\bar{p}_2)}{\sqrt{\sum_{x_1,x_2}(p_1[x_1,x_2]-\bar{p}_1)^2 \sum_{x_1,x_2}(p_2[x_1,x_2]-\bar{p}_2)^2}}$$

When a corner lies within b pixels from the edge of an image, the image patch we use must wrap around the other side of the image. This follows naturally from the fact that bin selection under folding is linear modulo the fold size. Accordingly, the wrapped around pixels are the bins that the image pixels from a particular corner's local neighborhood mapped to in the original image.

Matching

Matching corners, for example in act 1750 of the method 1700 illustrated in FIG. 17, may include matching as described herein. Matching includes matching corners between the folds, that is matching each corner of a first plurality of corners detected based on a first fold with a corresponding corner of a second plurality of corners detected based on a second fold.

According to one aspect of the present disclosure, it is appreciated that matching may be framed as a minimum cost bipartite graph matching problem, to which there are known solutions. The two sets of corners (that is the first and second plurality of corners) from each of the folds, $c_1$ and $c_2$, may form the two disjoint sets of the bipartite graph. An edge may be placed between each node of one set to all other nodes in the other set, with a weight of 1−α, where a is the correlation value between the two corner patches from the previous step. 1−α may be used instead of a in order to transform our problem into a minimum cost matching.

In some embodiments, matching may include one or more pruning acts. For example, matching may include at least one of the following two pruning steps, pruning based on weak correlation values and pruning based on impossible corner matches, to reduce the complexity of the graph and ultimately the number of false corners returned.

Pruning based on weak correlation values: even with the noise induced from folding, very weakly correlated image patches do not generally correspond to the same corner. Accordingly, in this pruning step, the graph edges for all corner pairs with a correlation value below a minimum threshold, τ, are removed. Correspondingly all graph edges with a weight greater than 1−τ are removed.

Pruning based on impossible corner matches: the CRT code was described above under the Chinese Remainder Theorem section, and is a theorem about the uniqueness of an integer given its residuals among a series of coprime integers. In one embodiment of a compressive sensing method based on two folds, the Chinese Remainder Theorem may provide a mapping for each dimension from the two residuals modulo the fold sizes to the set of integers from 0 to the product of the fold sizes. That is, in the first dimension a mapping from $[r_1,r_2] \to 0 \ldots p_{1a}p_{2a}-1$ where $0 \le r_1 < p_{1a}$, $0 \le r_2 < p_{2a}$, and for the second dimension, $[r_1,r_2] \to 0 \ldots p_{1b}p_{2b}-1$ where $0 \le r_1 < p_{1b}$, $0 \le r_2 < p_{2b}$. For an input image I of size M by N, the minimum requirements for the system to be able to decode all corner locations according to the CRT is $M < p_{1a} \cdot p_{2a}$ and $N < p_{1b} \cdot p_{2b}$. However, at the feasible levels of compression for decent performance from the algorithm, M and N tend to be significantly less than the product of the fold sizes for their corresponding dimensions. It is this fact that we can exploit in this pruning step. Any edge in our bipartite graph that connects two corners that decode to a coordinate outside the original image dimensions may be discarded.

We can quantify a precise performance gain from this fact based on the fold sizes. Assuming a uniform distribution of corner locations, the probability of two corners that do not correspond to the same corner in the original image decoding to a location still within the image boundaries is:

$$P(\text{false corner surviving this pruning step}) = \frac{MN}{p_{1a}p_{2a}p_{1b}p_{2b}}$$

It can be observed that as the fold sizes become larger, this optimization becomes more effective at pruning the complexity of the matching problem.

In one example, the specific algorithm used for matching corners is the classic Hungarian Algorithm. An efficient extension of the Hungarian Algorithm for the rectangular case where the number of nodes in each disjoint set of the bipartite graph is different may also be used. This is of interest for our application given the number of corners recovered from each fold is in general not equal.

Decoding

Decoding, for example in act 1760 of the method 1700 illustrated in FIG. 17 may include decoding as described herein.

In one embodiment, decoding is based on matching obtained between the sets of corners $c_1$ and $c_2$. The goal is to decode corner location information about the original input image I from the position of the corner in the folded versions of the image. In one embodiment, the Chinese Remainder Theorem (CRT) coupled with the fact that the fold sizes, $p_1$ and $p_2$, are coprime, are the critical properties that allow the decoding to take place. The CRT code was described above under the Chinese Remainder Theorem section, and is a theorem about the uniqueness of an integer given its residuals among a series of coprime integers. Formally, it may be defined as follows:

Chinese Remainder Theorem: Let $n_1 \ldots, n_k$ be integers greater than 1 and pairwise relatively prime. Let $n = n_1 \cdot n_2 \cdot n_3 \ldots n_k$. Then for any integers $a_1, a_2, \ldots, a_k$, the set of simultaneous equations $$x \equiv a_i (\bmod n_i)$$

For $1 \le i \le k$ has a unique solution modulo n for the unknown x.

The CRT proves the uniqueness for a given x satisfying the given residuals modulo the $a_i$. An efficient algorithm for finding x is known and referred herein as CRT-decode. Its inputs are the coprime bases $n_i$ and the residuals, $a_i$.

In an example implementation, CRT-decodee($[a_1 \ldots a_k],[n_1 \ldots n_k]$) may include the following steps:
1. Calculate $n = n_1 \cdot n_2 \cdot n_3 \ldots n_k$.
2. Calculate $m_i = n/n_i$, for $1 \le i \le k$
3. Calculate $e_i = m_i^{-1} \pmod{n_i}$, for $1 \le i \le k$. That is, calculate the multiplicative inverse of each $m_i$ modulo $n_i$. It is guaranteed to exist since $m_i$ and $n_i$ are relatively prime. Its computation is accomplished via the Extended Euclidean algorithm 4. Calculate $c_i=m_ie_i$ for $1\leq i\leq k$.
5. Return $x=(\alpha_1c_1+\alpha_2c_2+\ldots\alpha_kc_k)$ (mod n) as the decoded solution to the set of simultaneous equations $x\equiv\alpha_i$ (mod $n_i$)

Once the same corner from the original image has been identified in each of the two folds, we have the residual of its $x_1$ and $x_2$ locations among two sets of coprime integers, $(p_{1a},p^{2a})$ and $(p_{1b},p_{2b})$. Therefore running CRT decoding along the first dimension and then again along the second dimension yields the location of the corner in the original input image.

Example

Figure 19:
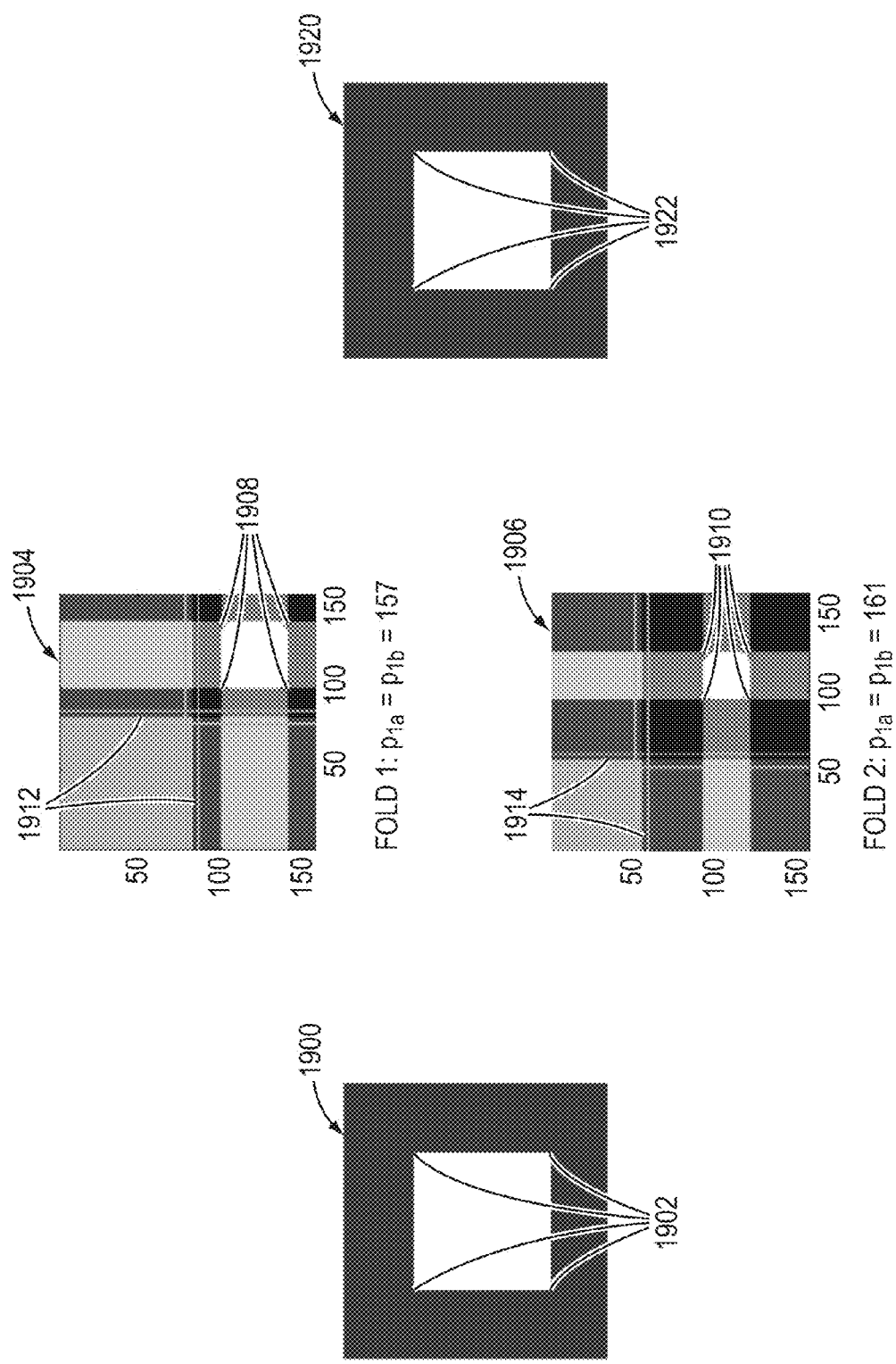
FIG. 19 illustrates an example of application of a compressing sensing method to an image including four corners to recover the corners according to aspects of the present invention.

The following example demonstrates applying one embodiment of compressive sensing to recover corners on a simple image consisting of only 4 corners. FIG. 19 illustrates an example of application of the compressing sensing method 1700 to an image 1900 including four corners 1902 to recover the corners according to aspects disclosed herein. The image 1900 has a size of 1024 by 1024 pixels. Folding the image 1900 by applying the act 1710 generates a first fold 1904 and a second fold 1906. For simplicity the horizontal and vertical fold sizes for each fold are the same in this example, $p_{1a}=p_{1b}=157$, $p_{1a}=p_{1b}=161$.

Each of the first fold 1904 and the second fold 1906 further illustrate a result of applying corner detection in act 1720 and eliminating a subset of corners in act 1730. The stars 1908 in the first fold 1904 indicate the first plurality of corners detected in the first fold, and the stars 1910 in the second fold 1906 indicate the second plurality of corners detected in the second fold. Furthermore, the area 1912 in the first fold 1904 indicates the corner response regions that are ignored in the first fold, and the area 1914 in the second fold 1906 indicates the corner response regions that are ignored in the second fold. Each of the area 1912 and the area 1914 includes artificial edges as an artifact of folding.

Figure 20:
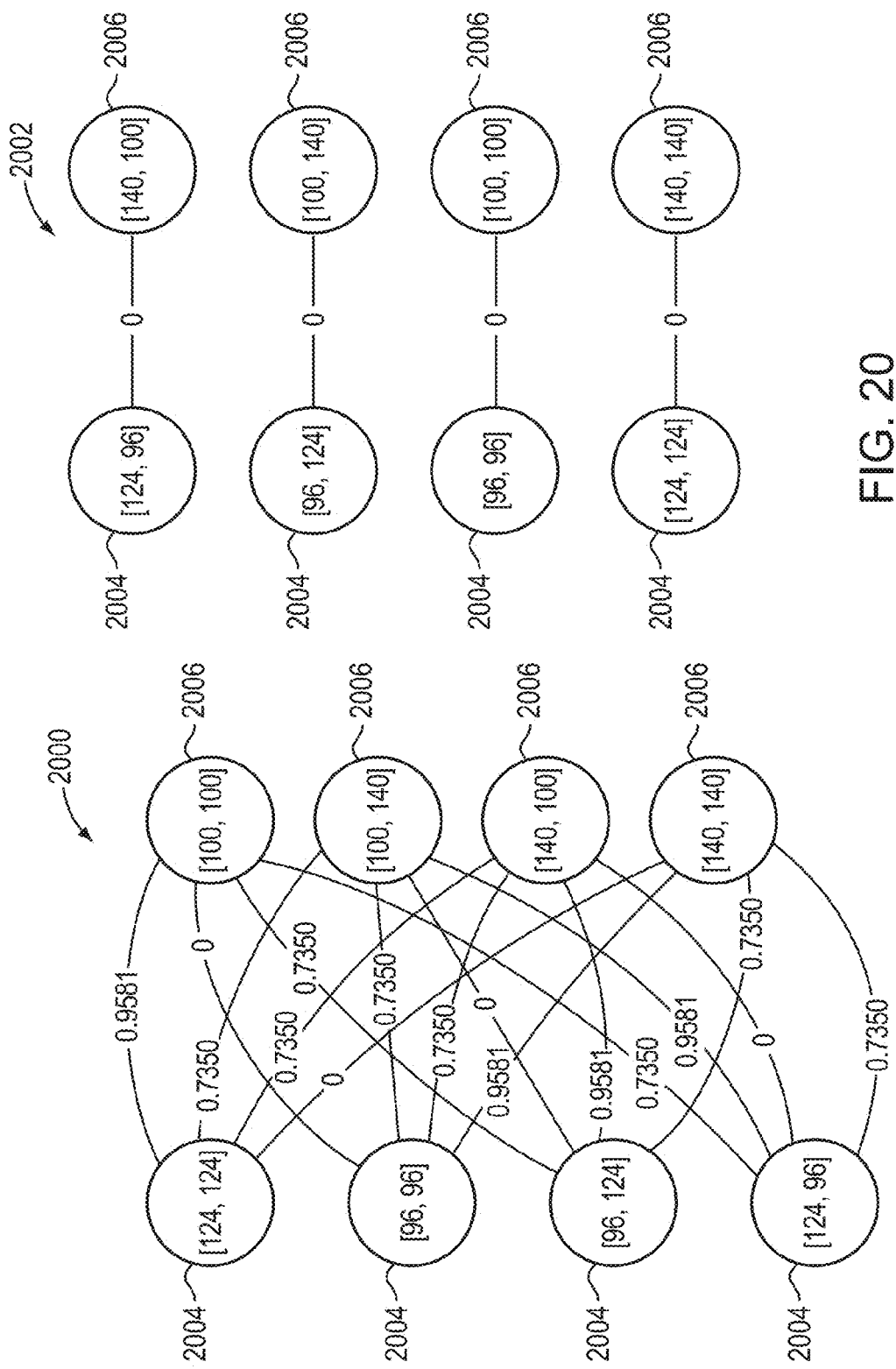
FIG. 20 illustrates an example of matching corners using bipartite matching graphs according to aspects of the present invention.

An example of performing the act 1740 of calculating pairwise correlation values and the act 1750 of matching corners is illustrated in FIG. 20. In particular, FIG. 20 illustrates a bipartite graph 2000 and a pruned bipartite graph 2002. The pruned bipartite graph 2002 is a pruned version of the bipartite graph 2000, generated by applying the graph pruning steps described above (pruning based on weak correlation values and impossible corner matches). The pruned bipartite graph 2002 shows the reduction in complexity due to pruning, relative to the bipartite graph 2000.

Referring now to FIGS. 19 and 20, in each of the bipartite graph 2000 and the pruned bipartite graph 2002, the four nodes 2004 correspond to the locations of the four corners 1910 in the second fold 1906, and the four nodes 2006 correspond to the locations of the four corners 1908 in the first fold 1904. In the bipartite graph 2000, pairwise correlations are calculated as shown by the correlation values associated with edges between each pair of nodes including a first node 2004 and a second node 2006. In the pruned bipartite graph 2002, many edges are pruned, for example based on the correlation values. In this example, the pruning has done all the work and only one possible matching exists for each pair of nodes as shown in the pruned bipartite graph 2002. In another example, after the pruning, an algorithm such as the Hungarian algorithm may be applied to the pruned bipartite graph 2002 to determine the final corner correspondences.

Each corner 1908 in the first fold 1904 is matched with a corresponding corner 1910 in the second fold 1906 based on the matching illustrated in the pruned bipartite graph 2002.

Once the corners of the first and second folds are matched, the matched corners are decoded in act 1760. Referring again to FIG. 19, the image 1920 illustrates the original image 1900 including the decoded corners 1922 from the matching using the CRT. In this example, all of the four original corners 1902 were correctly recovered.

Examples of Simulation Results on Various Images

In this section a number of different results will be presented on the performance of an implementation of one embodiment of compressive sensing for recovering corners on various natural images. In all cases, for simplicity the fold sizes $p_{1a}=p_{1b}$ and $p_{2a}=p_{2b}$. All of the experiments are conducted at a range of compression ratios, showing how the algorithm performs as a function of the degree to which dimensionality is reduced.

FIG. 21 is a table of fold sizes and corresponding compression ratios for an input image size of 1024 by 1024. All input pictures for the following experiments are of size 1024 by 1024. Compression ratio, for the purposes of this experiment, was defined as the total number of output measurements from the folds divided by the number of pixels in the original picture. Smaller compression ratios may therefore be associated with smaller fold sizes, that is a smaller compression ratio corresponds to the acquisition of a more compressed signal in this example. In other examples, compression may be defined by using another metric.

FIGS. 22A to 22D illustrate a plurality of test images (images 1 to 4) used in simulations. (Image 1 source: http://tellerallaboutit.files.wordpress.com/2010/06/upstairs-hallway-before.jpg, last retrieved November 2012; Images 2, 3 and 4 of FIGS. 22B to 22D are photographed by an inventor of this application).

Figure 23A:
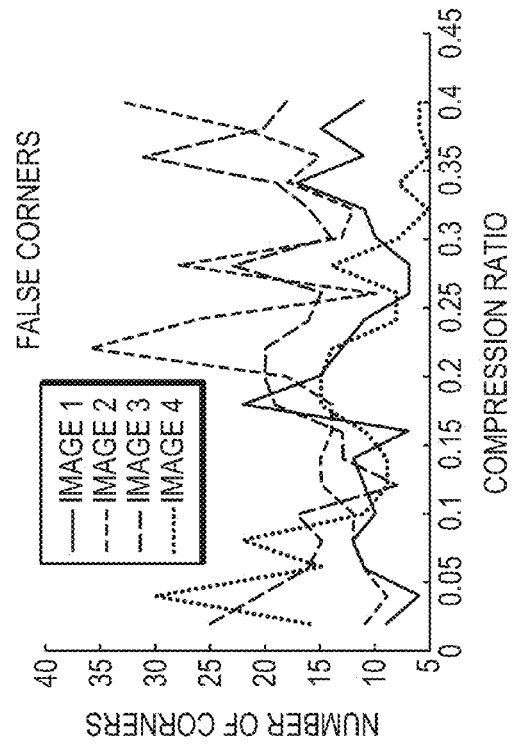
FIGS. 23A to 23C illustrate results of applying a compressive sensing method to the test images of FIGS. 22A to 22D to recover corners according to aspects of the present invention.
Figure 23B:
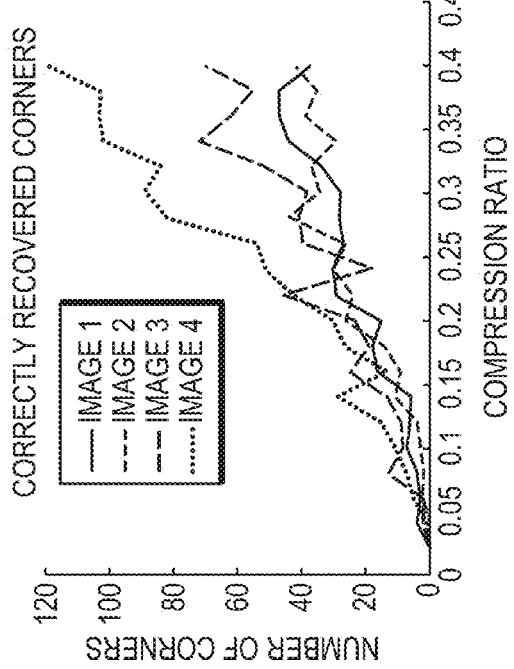
Figure 23C:
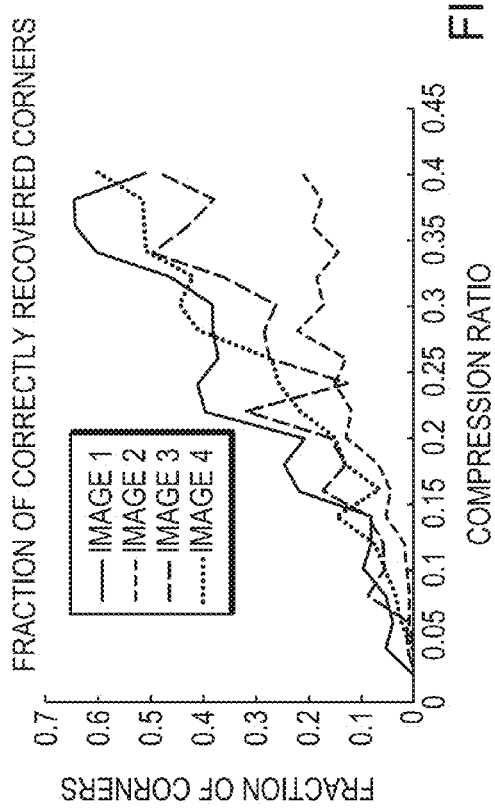

FIGS. 23A to 23C illustrate results of applying compressive sensing to the test images of FIGS. 22A to 22D to recover corners. FIG. 23A shows the number of correctly recovered corners as a function of the compression level (compression ratio). FIG. 23B shows the number of false corners as a function of the compression level. Performance appears to scale linearly with the level of compression, and the number of false corners tends to stay at approximately a constant level. In this example, a corner is defined as correctly recovered if it is within 3 pixels of a corner returned from running corner detection on the original unfolded version of the image. All other returned corners were classified as false corners. A more useful view of the results for the purposes of comparing performance between the images is shown in FIG. 23C. It is the same graph as FIG. 23A, with each curve normalized by the number of corners detected on the unfolded original version of each image. Thus it shows the percentage of original corners detected across the compression ratios on our test suite. This is a more fair comparison across different images because there is a fundamentally different amount of corners returned by Harris corner detection for every image.

In various embodiments of compressive sensing methods and apparatuses, parameters such as the correlation window size b and the correlation value threshold τ may be varied. These parameters may be selected based on a determination of optimal values.

Figure 24A:
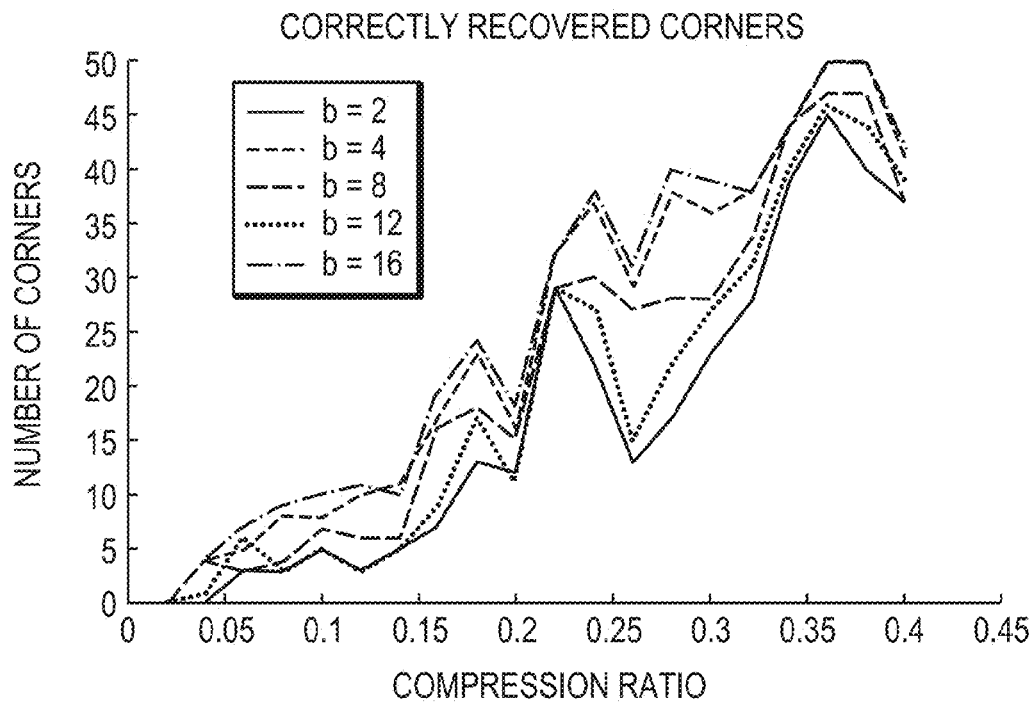
FIGS. 24A and 24B illustrate results of applying a compressive sensing method to a test image for various correlation window sizes b according to aspects of the present invention.
Figure 24B:
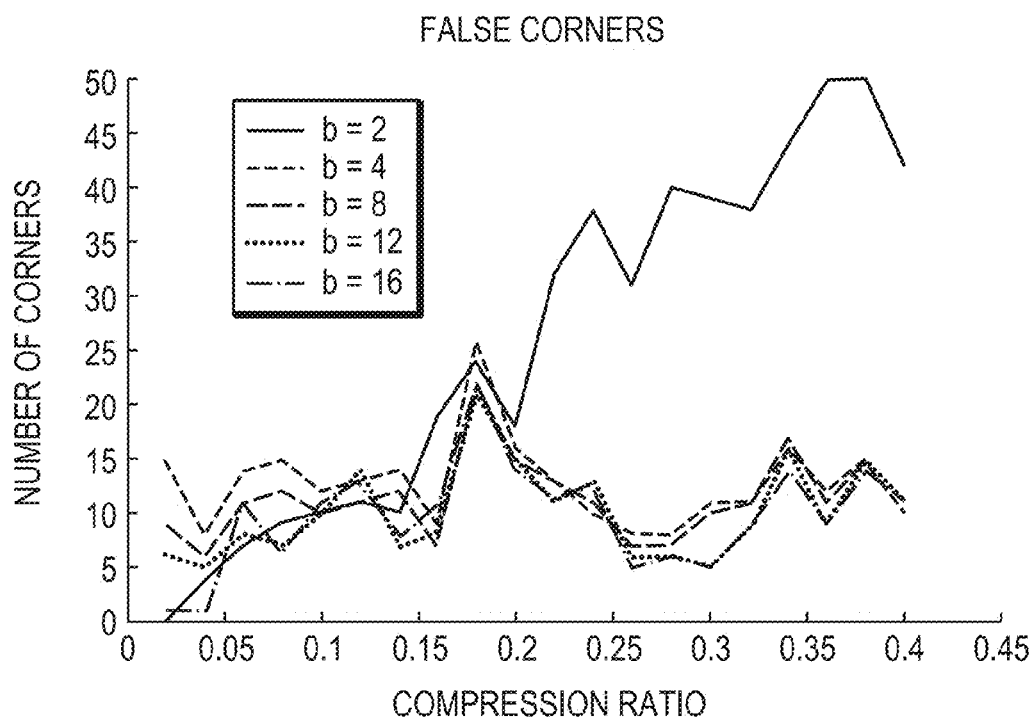

Correlation Window Size (b): FIGS. 24A and 24B illustrate results of applying compressive sensing to the test image 1 of FIG. 22A, for various correlation window sizes b. FIG. 24A shows correctly recovered corners as a function of compression ratio for various values of b and FIG. 24B shows false corners as a function of compression ratio for various values of b. We observe that when the window size is very small, b=2, the surrounding image patch of a corner is too small to allow differentiation between corners during the pairwise correlation. At the other extreme, when it is too large, correlation values remain too small because of the added noise from the folding process. With b=8 there appears to be a balanced tradeoff between the two competing effects, however the optimal value for this parameter would ultimately be application specific depending on the desired performance metric.

Figure 25A:
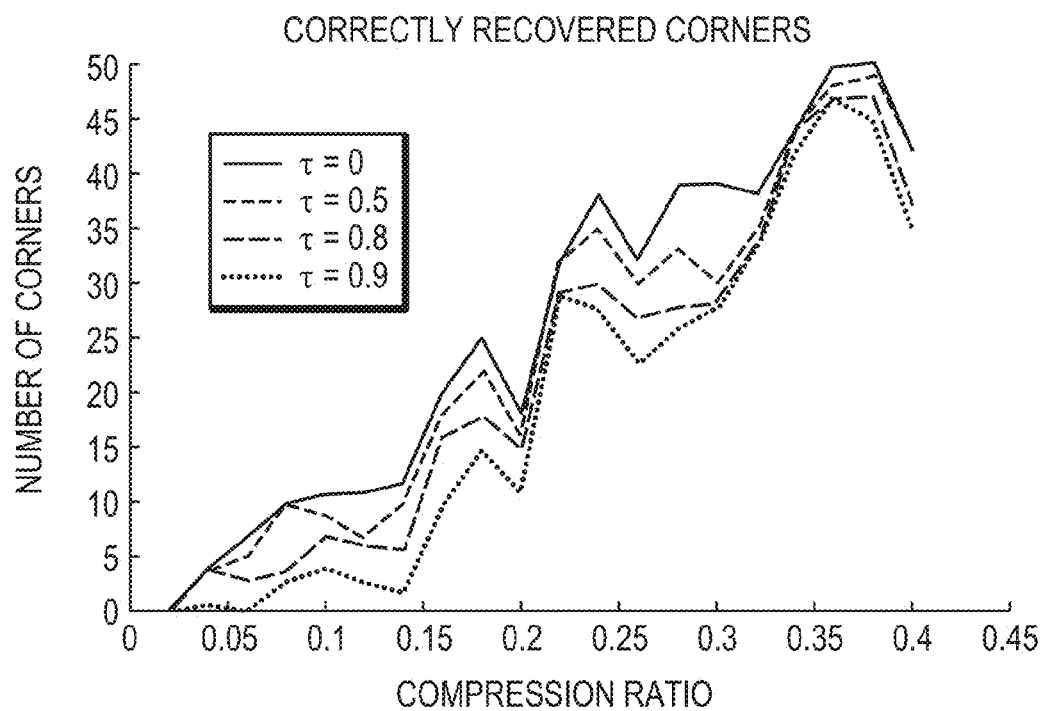
FIGS. 25A and 25B illustrate results of applying a compressive sensing method to a test image for various correlation value thresholds τ according to aspects of the present invention.
Figure 25B:
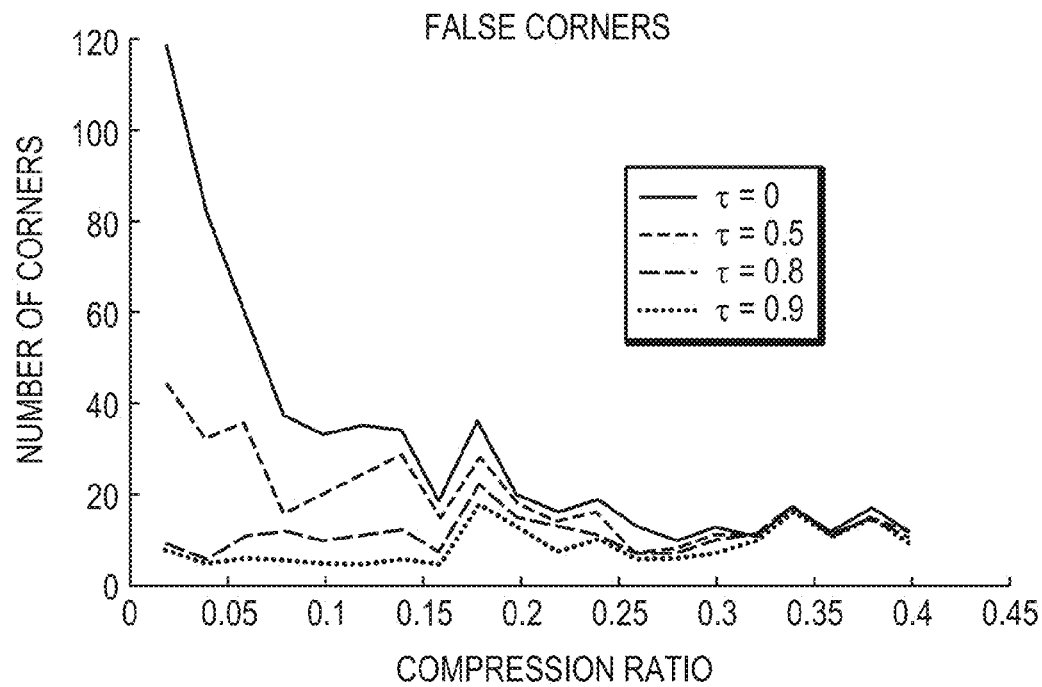

Correlation Value Threshold (τ): FIGS. 25A and 25B illustrate results of applying compressive sensing to the test image 1 of FIG. 22A for various correlation value thresholds T. FIG. 25A shows correctly recovered corners as a function of compression ratio for various values of τ and FIG. 25B shows false corners as a function of compression ratio for various values of τ. A value of zero for τ corresponds to no pruning based on correlation value and increasing τ corresponds to relaxing the minimal standard for a correlation value to be considered a match. From FIG. 25A, it can be seen that increasing τ causes a slight decrease in the number of correctly recovered corners. From FIG. 25B, it can be seen that increasing τ causes the number of false corners to decrease significantly, especially at the lower compression levels where the pruning from impossible corner matches is less effective. As is the case for the parameter b, the optimal value for τ depends on the application and what performance metric the user wishes to maximize. For the experiments with the test suite in FIGS. 22A to 22D, a value of τ=0.2 is found to be a good tradeoff between the two competing effects.

Repeatability: From the results above, it can be seen that the method of compressive sensing detects a subset of the original corners in the image. For a vision-based navigation application, we must verify that a completely different subset of corners is not returned from subsequent frames of the same scene. This would yield frame-to-frame feature tracking impossible. Features must survive temporally across subsequent image frames for vision-based navigation.

FIGS. 26A to 26D illustrate decoded corners for two different scenes and more specifically decoded corners for two consecutive image frames of two different scenes. The images may be frames of a video signal. FIGS. 26A to 26D illustrate image 1 of FIG. 22A, along with a translated version of image 1. FIGS. 26A to 26D also illustrate image 3 of FIG. 22C, along with a rotated version of image 3. The dots superimposed on the images in FIGS. 26A to 26D indicate the correctly decoded corners from each image. A common set of 22 corners were detected between image 1 and the translated version thereof, and a common set of 28 corners were detected between image 3 and the rotated version thereof. These results suggest that a compressive sensing method for corner recovery may provide a set of stable corners across aspect changes of the same scene.

As the results above show for one example, at very high compression levels most corners may be lost. This is the result of multiple compounding effects:

First, higher compression levels may correspond to smaller folds and consequently increased degradation from the folding process. Smaller folds correspond to a larger number of pixels from the original image mapping to any given bin of the fold. The local geometry of many corners may simply be lost in the folds with so many image patches being summed on top of each other. This may manifest itself at two different places. Some corners may not be detected in the folds. Also, some corners may still be detected in both folded representations but may have such low correlation value from the noise that they cannot be matched.

Second, smaller fold sizes may cause an increased number of fake corners to be detected in the folds. Fake corners are two edges from the original image folding on top of each other in the folded version thus forming a corner. Fake corners increase the complexity of the matching by adding more nodes to the bipartite graph matching problem. When a fake corner is accidentally matched, a false corner may be returned.

Third, smaller fold sizes may decrease the effectiveness of both types of pruning during the matching step. Weak correlation pruning may prune correct matches accidentally because correlation values are so low from the increased folding noise. Impossible corner pruning may become less effective because the product of the fold sizes is smaller and consequently the probability of a false corner surviving the pruning step increases.

All of the above effects are alleviated as the compression rate decreases (i.e. fold sizes increase) and this can be observed in the performance graphs as can be expected from natural images.

In some examples, there may be some loss of corners through the folding process and some amount of false corners may be returned. From the perspective of vision-based navigation, this may be tolerable since feature-tracking only needs some subset of consistent features from frame to frame. Additionally, features that the system cannot track, such as false corners, are usually ignored. Therefore, various embodiments of compressive sensing methods and apparatuses disclosed herein may provide a low power approach for vision-based navigation applications.

Figure 27:
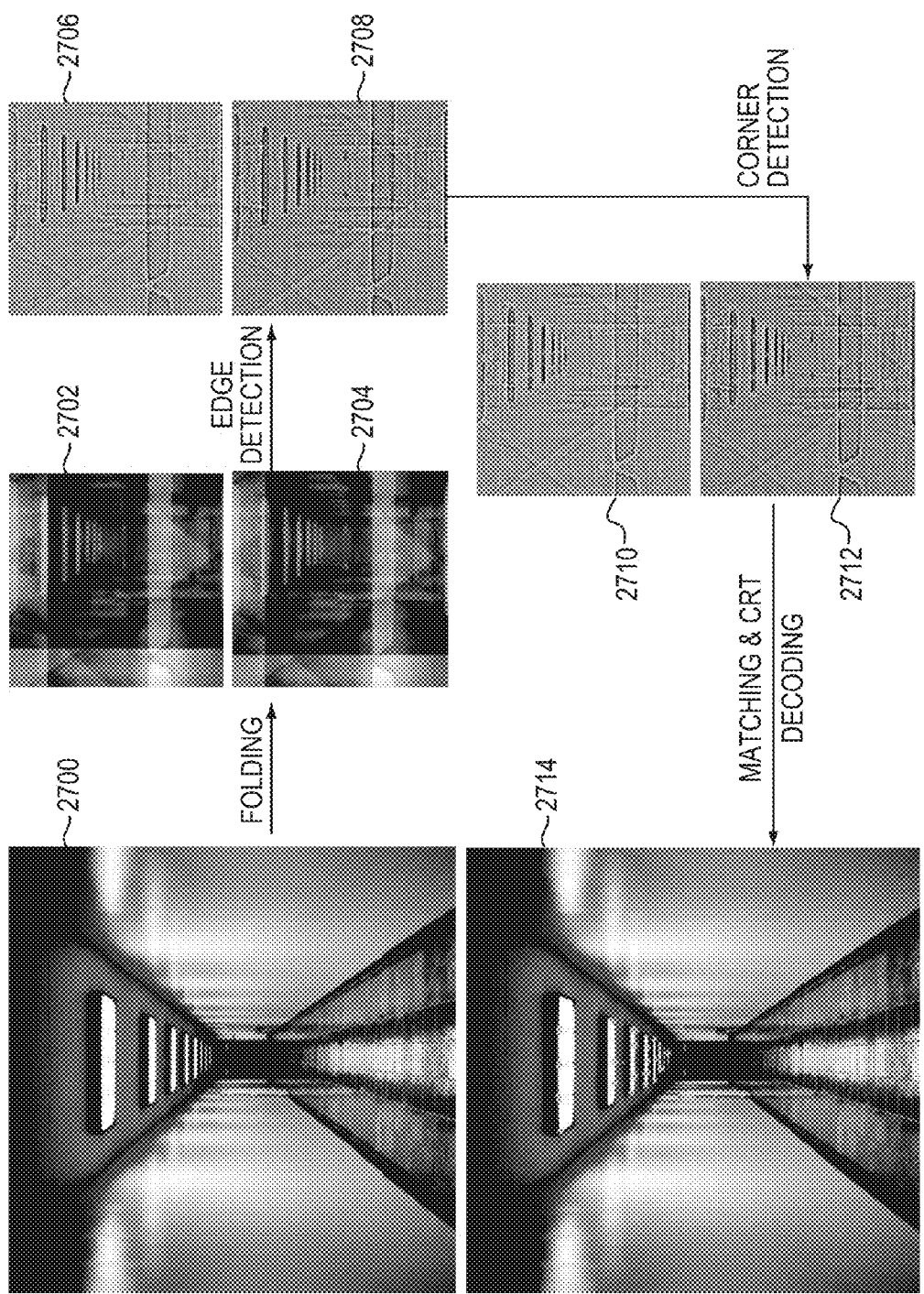
FIG. 27 illustrates one example of a method of compressive sensing for recovering corners according to aspects of the present invention.

FIG. 27 illustrates one application of a method of compressive sensing for recovering corners. In one embodiment, as shown in FIG. 27, the method includes acts of folding to generate folded images, processing the folds, for example, by detecting edges based on the folds and detecting corners based on the folds, and decoding the processed folds to efficiently identify locations of corners in the original image.

As described with reference to the method 1700 of FIG. 17, the compressive sensing method of FIG. 27 includes acts of folding, corner detection, matching and CRT decoding. In this embodiment, the method further includes an act of edge detection. An input image 2700 is folded to generate a first fold 2702 and a second fold 2704. Edge detection is then applied to each of the first fold 2702 and the second fold 2704, resulting in a respective plurality of edges being identified in each fold as shown by the fold images 2706 and 2708. Corner detection is then applied to the fold images 2706 and 2708, thereby generating fold images 2710 and 2712, each including a respective plurality of corners. In this example, the plurality of corners in each of the fold images 2710 and 2712 are pruned corners, generated by eliminating a subset of corners based on artificial edges. The corners in the folds 2710 and 2712 are matched and decoded to recover corners as shown in the output image 2714, wherein the recovered corners are shown superimposed on the input image 2700. Note that the input image 2700 may not be reconstructed by the compressive sensing methods. That is, compressive sensing recovers the corners based on the folds without reconstructing the image 2700. The decoded corners (corner locations) are superimposed on the original image 2700 for illustration.

Figure 28:
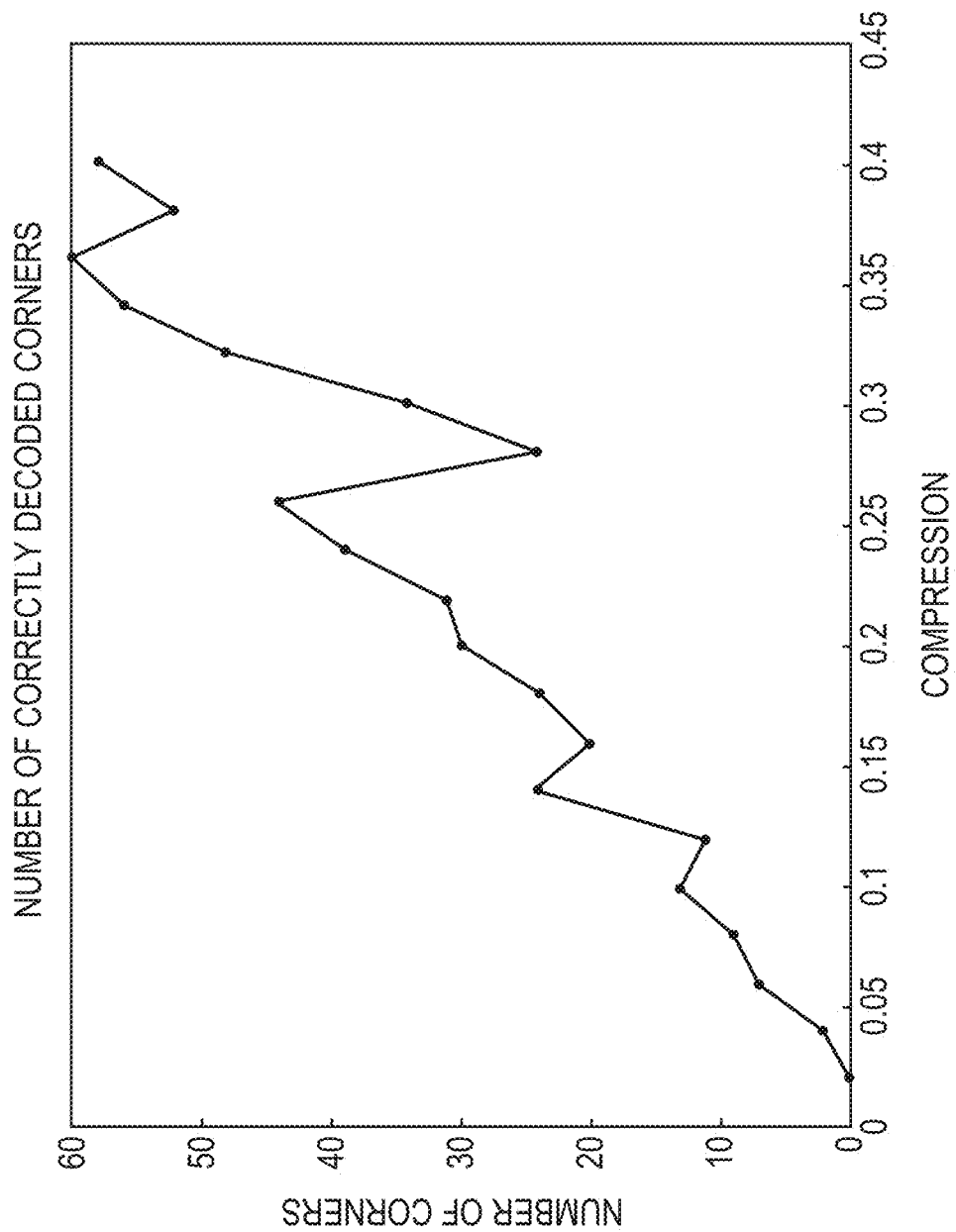
FIG. 28 illustrates a result of the application of the compressive sensing method of FIG. 27 according to aspects of the present invention.

FIG. 28 illustrates a result of the application of the compressive sensing method of FIG. 27. In particular, FIG. 28 shows the number of correctly decoded corners as a function of compression. In this example, smaller values of compression correspond to smaller fold sizes and thus more compression.

FIG. 29 illustrates one example of pruning to reduce false positives, in this case false corners. As described above under corner detection and with reference to FIGS. 18A and 18B, a subset of a plurality of detected corners may be eliminated, for example based on an artificial edge created as an artifact of folding. Referring to FIG. 27, each of the fold images 2710 and 2712 includes pruned corners, thereby generating the output image 2714 having reduced false corners. FIG. 29 illustrates fold images 2900 and 2902 prior to pruning, generated by applying corner detection to the fold images 2706 and 2708 of FIG. 27. Pruning includes eliminating a first subset 2904 of the plurality of corners of the fold image 2900, and eliminating a second subset 2906 of the plurality of corners of the fold image 2902, thereby generating the fold images 2710 and 2712 of FIG. 27. If eliminating a subset of corners based on artificial edges is not performed, matching corners and decoding based on the fold images 2900 and 2902 results in the output image 2908 which includes a plurality of false corners 2910. In contrast, the output image 2714 does not include the false corners 2910 shown in FIG. 29, since recovery in FIG. 27 includes eliminating corners based on artificial edges.

6. COMPRESSIVE TRANSLATION AND ROTATION DETERMINATION

According to aspects disclosed herein, compressive sensing methods and apparatuses are provided for determining rotation and translation information between images, based on folded representations of the images. One example of application is aerial photography, such as acquiring a series of image or video frames from a satellite or reconnaissance aircraft. The motion model for images in such scenarios is typically constrained to rotation and translation due to the geometry of the situation. Another example of application is vision-based navigation, where an efficient compressive sensing apparatus may be configured on an unmanned aerial vehicle (UAV), thereby providing rotation and translation vectors with respect to the Earth's surface to be used in calculating navigation solutions.

Let $I_0(x,y)$ represent an image at time 0 and $I_t(x,y)$ represent an image at time t. The image is said to be translated by an amount $(x_0, y_0)$ if $$I_t(x,y) = I_0(x-x_0, y-y_0)$$

The image is said to be rotated by an angle $\theta_0$ if $$I_t(x \cos \theta_0 - y \sin \theta_0, x \sin \theta_0 + y \cos \theta_0) = I_0(x,y)$$

The two can be combined such that an image is said to be translated by an amount $(x_0, y_0)$ and rotated by an amount $\theta_0$ if $$I_t(x \cos \theta_0 - y \sin \theta_0 + x_0, x \sin \theta_0 + y \cos \theta_0 + y_0) = I_0(x,y)$$

Translation between two images may be determined based on the phase difference between the Fourier transforms. Let $I_1[x_1, x_2]$ and $I_1[x_1, x_2]$ be the two input images where $I_2$ is a translated version of $I_1$ by an amount $[x_{1t}, x_{2t}]$, and let $F_1$ and $F_2$ be the corresponding two-dimensional Discrete Fourier Transforms (DFT), $F_1[m_1, m_2] = DFT\{I_1[x_1, x_2]\} = |F_1|e^{j\phi_1}$ and $F_2[m_1, m_2] = DFT\{I_2[x_1, x_2]\} = |F_2|e^{j\phi_2}$.

A phase correlation function $d = DFT^{-1}\{e^{j(\phi_1 - \phi_2)}\}$ may be constructed and, if $I_2$ is a translated version of $I_1$, the phase correlation function d will have a spike exactly at $[x_{1t}, x_{2t}]$. This follows from the Fourier Shift theorem, which states that if there are two signals of size M×N, $I_1$ and $I_2$, where one is a cyclically shifted version of the other, the discrete Fourier transforms are related by:

$$F_2[m_1, m_2] = F_1[m_1, m_2] \cdot e^{-j\frac{2\pi}{M}m_1 x_{1t}} \cdot e^{-j\frac{2\pi}{N}m_2 x_{2t}}$$

The phase difference, $\phi_1 - \phi_2$, will be a constant phase offset term and the inverse transform will yield an impulse in the phase correlation function d at the shift amount. It should be noted that in most applications the subsequent images are not cyclically shifted but rather infinitely shifted. That is, only a subset of the image data is common, and new image content replaces the circularly wrapped around portion. Consequently, this equality does not strictly hold but still provides a good approximation, especially at small shift sizes.

From an implementation perspective, the phase difference $\phi_1 - \phi_2$ may be thought of as the phase of the cross-power spectrum of the two signals:

$$\frac{F_1 F_2^*}{|F_1 F_2^*|}$$

Eliminating the normalizing factor above and inverse transforming is equivalent to taking the cyclic cross correlation between the two images and looking for a peak. This approach may also be used to accurately register the images. In some cases, pure phase correlation may be superior for a number of reasons, including robustness to noise and elimination of ambiguities in maximal peak selection.

Furthermore, for infinite 2-d signals and continuous transforms, the Fourier Rotation Theorem applies. That is, if $I_t(x,y)$ is a rotated version of a signal $I(x,y)$ by an amount, $\theta_0$ then their Fourier Transforms are related by:

$$F_t(w_1, w_2) = F(w_1 \cos \theta_0 + w_2 \sin \theta_0, -w_1 \sin \theta_0 + w_2 \cos \theta_0)$$

The rotation amount, $\theta_0$, is then found based on how much the corresponding transforms have rotated. This quantity may be determined, for example, by converting the transforms to a polar coordinate system where the rotation becomes a translation, or manually rotating the image while sweeping through a range a values and measuring where the strongest correlation peak occurs. The equality above does not strictly hold for infinite signals and discrete transforms, as the periodic replication effect of the DFT does not commute with rotation. However, optimizations and modifications may deal with this effect.

When an image is both translated and rotated, the constant phase offset from translation will not affect the rotation property of the Fourier transform magnitudes. Therefore, one approach is to first undo the rotation by determining it from the transform magnitudes, yielding two purely translated images that phase correlation may operate on to determine the translation amount.

Previous approaches for translation and rotation determination operate on the entire original image frames. In contrast, compressive sensing methods and apparatuses for determining translation or rotation according to aspects disclosed herein may be based on compressed or folded representations of the images, as described in further detail below for each of translation and rotation determination.

7. COMPRESSIVE TRANSLATION DETERMINATION

Various embodiments of compressive sensing methods and apparatuses disclosed herein may be used for determining translation between images based on their folded representations. In one example, the images may be subsequent images of a video signal.

In various embodiments, translation may be preserved by folding. As described above with reference to various embodiments of compressive sensing (see for example FIG. 7), folding may include applying a hash function that maps each pixel in the input image to a bin (bucket) in the fold (folded image) and sums all of the pixels mapped to the same bin (bucket). As used herein, bin and bucket may be used interchangeably.

Figure 30:
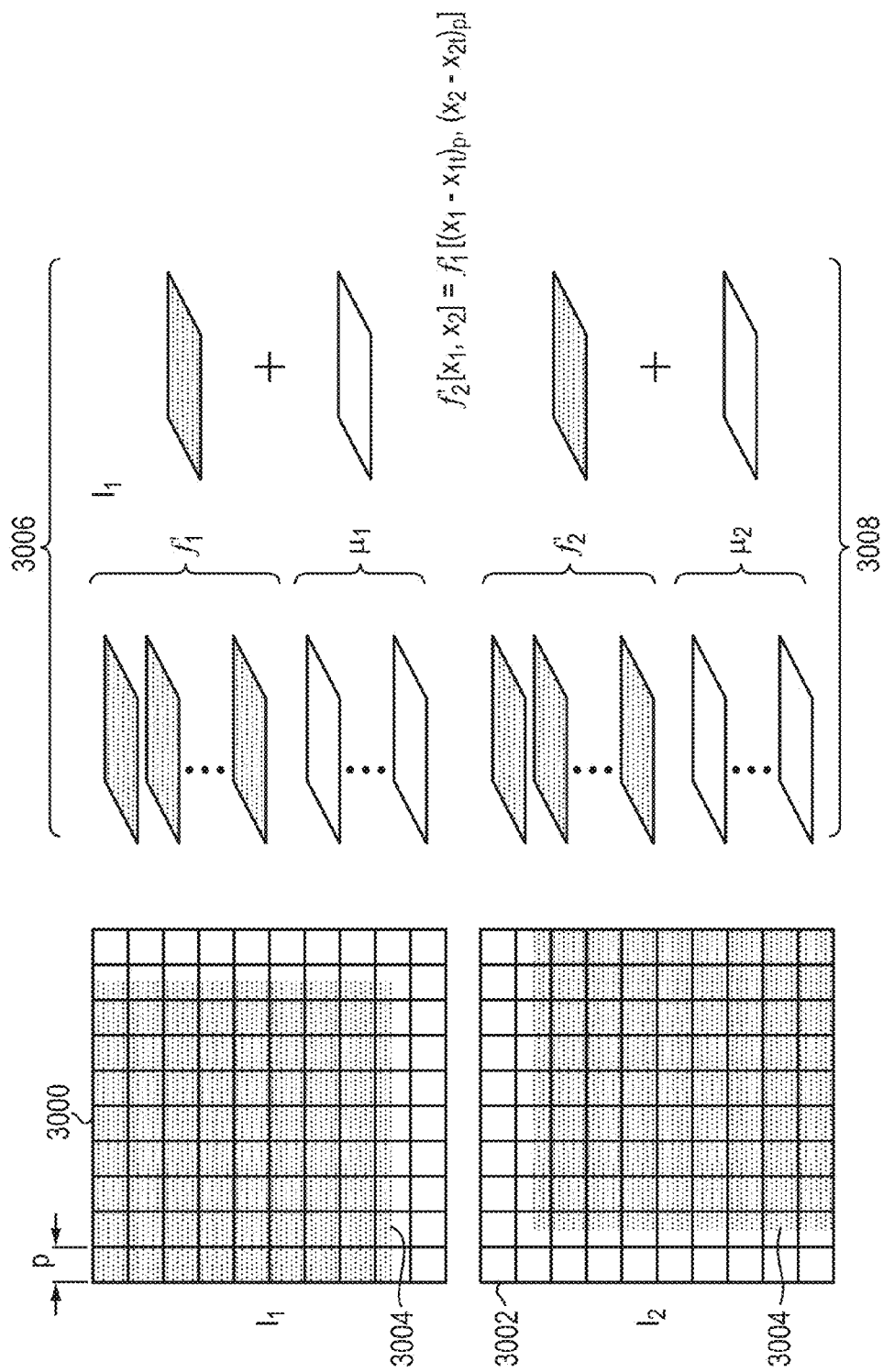
FIG. 30 illustrates one example of folding on a translated image pair according to aspects of the present invention.

FIG. 30 illustrates one example of folding on a translated pair of images including a first image 3000 ($I_1$) and a second image 3002 ($I'_2$). One desirable property of folding with respect to translation is that within a common region of overlap 3004 between the two images (or frames) 3000 and 3002, the sets of pixels mapped to the same bin does not change. Moreover, the specific bin that a same set of pixels is mapped to in the translated version, is exactly the translated bin from the first image modulo the fold size in each dimension. In other words, restricting ourselves to just the common region of overlap, such as the region of overlap 3004, one fold is exactly a circularly shifted version of the other fold. For the pixels that are not in the regions of overlap, noise is added on top of the circularly shifted images. FIG. 30 illustrates this phenomenon. The highlighted area indicates the common region of overlap 3004 between the images 3000 and 3002 and the folding process is illustrated for these translated pair of images. The first fold 3006 may be modeled as $f_1 = f'_1 + \mu_1$ and the second fold 3008 may be modeled as $\eta_2 = \eta'_2 + \mu_2$, where $f'_1$ and $f'_2$ are circularly shifted versions of each other. That is, $$f'_2[x_1,x_2] = f'_1[x_1 - x_{1t}(\mod p), x_2 - x_{2t}(\mod p)]$$

where p is the fold size. $\mu_1$ and $\mu_2$ may be modeled as signal noise from the folding process from the non-common image content between the two images 3000 and 3002.

Figure 31:
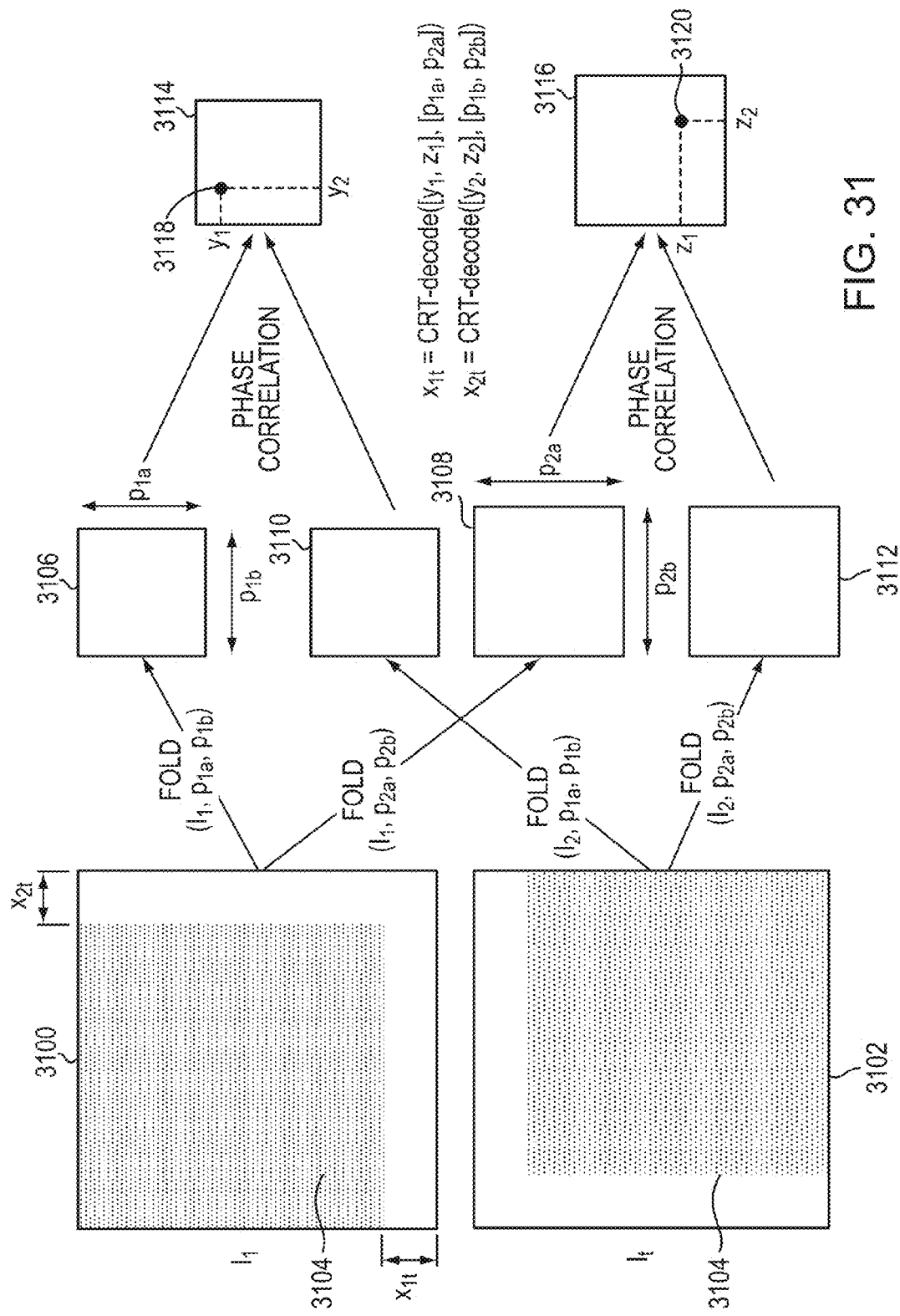
FIG. 31 illustrates one example of an application of a method of compressive sensing for determining a translation between two images according to aspects of the present invention.

An example of application of a method of compressive sensing for determining a translation between two images is described next with reference to FIGS. 31 and 32. FIG. 31 illustrates an example of application of one embodiment of the method 3200 of compressive sensing for determining a translation between two images, such as between a first image 3100 and a second image 3102 shown in FIG. 31. Let $I_1[x_1,x_2]$ and $I_t[x_1,x_2]$ be the input images 3100 and 3102 respectively, where $I_t[x_1,x_2]$ is translated by an amount $[x_{1t},x_{2t}]$. The images 3100 and 3102 thus include a common region of overlap 3104.

In one embodiment, the method 3200 includes an act 3210 of folding a first image to generate a first fold and a second fold and an act 3220 of folding a second image to generate a third fold and a fourth fold. For example, two respective folds may be generated for each of the image 3100 and the image 3102. In one example, the fold sizes are coprime in each dimension, that is $\gcd(p_{1a},p_{2a})=1, \gcd(p_{1b},p_{2b})=1$, as, described above in relation with various embodiments. Folding in acts 3210 and 3220 may include applying a CRT code. Referring to FIG. 31, the first image 3100 is folded to generate two folds of $I_1$, a first fold 3106 represented by $F_{11}=\text{FOLD}(I_1,p_{1a},p_{1b})$ and a second fold 3108 represented by $F_{12}=\text{FOLD}(I_1,p_{2a},p_{2b})$. The second image 3102 is folded to generate two folds of $I_2$, a third fold 3110 represented by $F_{t1}=\text{FOLD}(I_t,p_{1a},p_{1b})$ and a fourth fold 3112 represented by $F_{t2}=\text{FOLD}(I_t,p_{2a},p_{2b})$.

In various embodiments, the acts 3210 and 3220 of folding each image may be performed substantially in parallel, may be performed sequentially in any order, or may overlap. In some embodiments, folding in acts 3210 and 3220 may include applying a hashing function or applying an error correcting code, as shown for example in method 800 of FIG. 8. In some embodiments, folding may include generating a different number of folds and one or more of the other acts of the method 3200 may be based on a different number of folds.

Compressive sensing may further include determining a translation between the first image 3100 and the second image 3102 based on the first fold 3106, the second fold 3108, the third fold 3110 and the fourth fold 3112. Determining a translation based on the folds may include one or more of the acts 3230, 3240, 3250, 3260 and 3270 of the method 3200.

Figure 32:
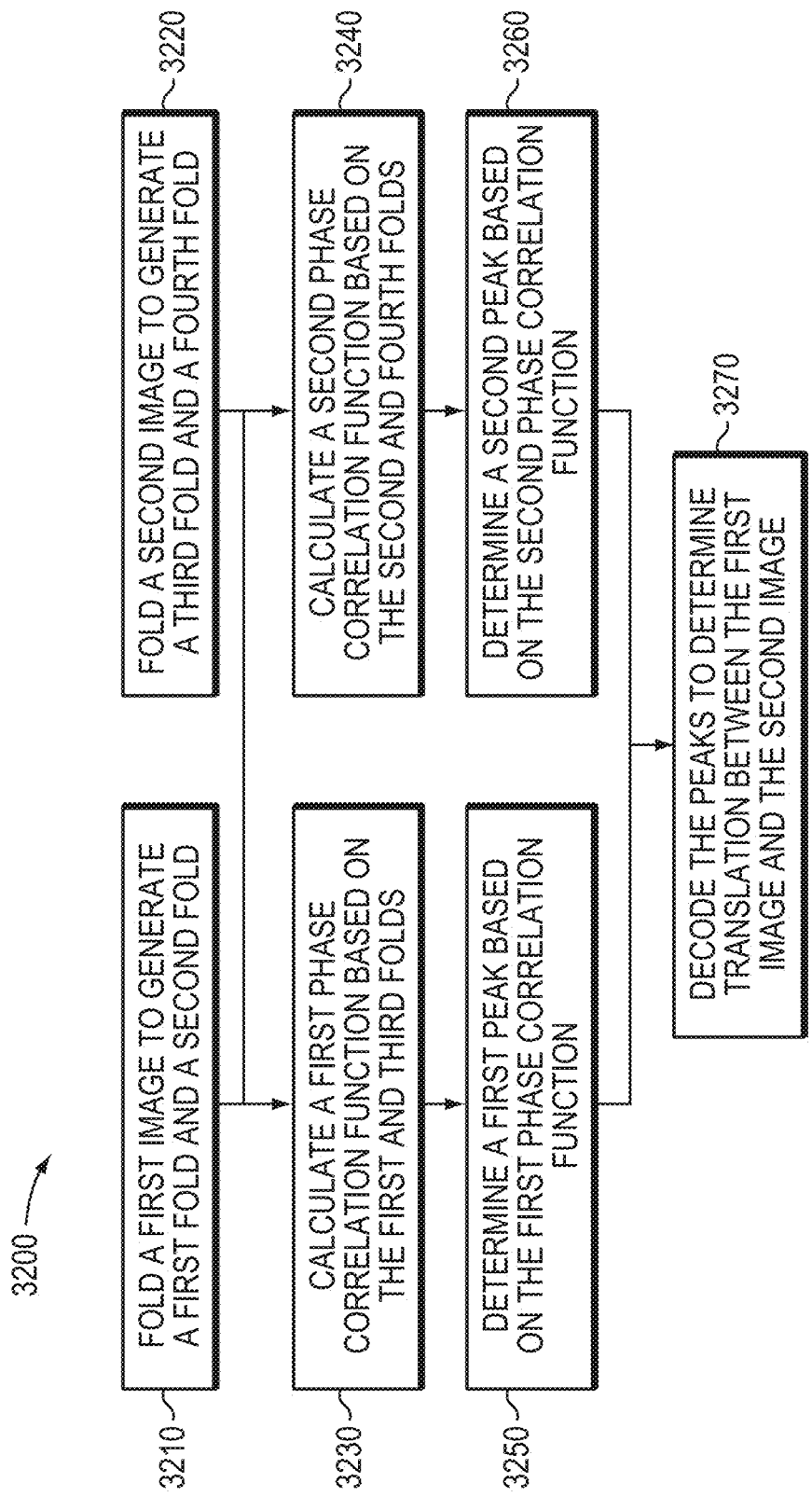
FIG. 32 illustrates one example of a method of compressive sensing for determining a translation between two images according to aspects of the present invention.

As shown in FIG. 32, the method 3200 further includes an act 3230 of calculating a first phase correlation function based on the first and third folds and an act 3240 of calculating a second phase correlation function based on the second and fourth folds. For example, the method may include calculating the phase correlation function $d_1$ between the first folds of each image, $F_{11}$ and $F_{t1}$, and the phase correlation function $d_2$ between the second folds, $F_{12}$ and $F_{t2}$. Referring to FIG. 31, a first phase correlation function 3114 is shown to be calculated based on the first fold 3106 corresponding to the image 3100 and the third fold 3110 corresponding to the image 3102. A second phase correlation function 3116 is shown to be calculated based on the second fold 3108 corresponding to the image 3100 and the fourth fold 3112 corresponding to the image 3102. In various embodiments, the acts 3230 and 3240 of calculating phase correlation functions may be performed substantially in parallel, may be performed sequentially in any order, or may overlap.

The method 3200 further includes an act 3250 of determining a first peak based on the first phase correlation function and an act 3260 of determining a second peak based on the second phase correlation function. For example, the method may include identifying the peaks in the phase correlation functions, $d_1$ and $d_2$. Let the coordinate of the peak of $d_1$ be $[y_1,y_2]$, and the coordinate of the peak of $d_2$ be $[z_1, z_2]$. Referring to FIG. 31, a first peak 3118 is determined based on the first phase correlation function 3114 and a second peak 3120 is determined based on the second phase correlation function 3116. In various embodiments, the acts 3250 and 3260 of determining the peaks may be performed substantially in parallel, may be performed sequentially in any order, or may overlap.

Method 3200 further includes an act 3270 of decoding the peaks to determine a translation between the first image and the second image. In one embodiment, decoding may include applying the Chinese Remainder Theorem. For example, with the residuals of the translation vector, $[x_{1t}, x_{2t}]$, among two coprime integers in each dimension we recover the translation vector using the CRT: $x_{1t}=\text{CRT-decode}([y_1,z_1],[p_{1a},p_{2a}])$ and $x_{2t}=\text{CRT-decode}([y_2,z_2],[p_{1b}, p_{2b}])$ as shown in FIG. 31.

According to one aspect disclosed herein, it is appreciated that compressive sensing for translation determination leverages the fact that after folding, the phase correlation is able to identify and register the translation of a circularly shifted image. Two parameters may affect the performance of compressive sensing for translation determination: the translation shift amount and the fold size (or the degree of dimensionality reduction). As the translation shift amount increases, the percentage of common image content decreases, and the correlation peaks may become increasingly weak and more difficult to distinguish from noisy correlation peaks. Similarly, as the dimensionality gets reduced from smaller fold sizes, performance may decrease as more noise slices are added in the μ component of the signal model and the correlation peaks become smaller. In addition, the size of the underlying circularly shifted component becomes smaller with smaller fold sizes and the correlation peaks may naturally become weaker because there is less signal to match against. Accordingly, in various embodiments, parameters of compressing sensing may be selected based on a given application or based on some criterion to be optimized.

According to another aspect, various embodiments of apparatuses configured to perform various methods of compressive sensing as disclosed herein may be provided. In one example, the compressive sensing apparatus 300 of FIG. 3 may be configured according to the method 3200 of FIG. 32. In particular, the lens 302 may receive a first image and a second image that is translated relative to the first image. The focal plane array 304 may be configured to perform folding according to acts 3210 and 3220 of the method 3200, thereby folding each of the first and second images to acquire a plurality of folds corresponding to each image. In some embodiments, the folds may be digitized by the digitizer 308. In other embodiments, folding by the focal plane array 304 may include digitizing. The decoder 310 may be configured to perform one or more of the acts 3230, 3240, 3250, 3260 and 3270, thereby recovering a translation between the images.

Figure 33:
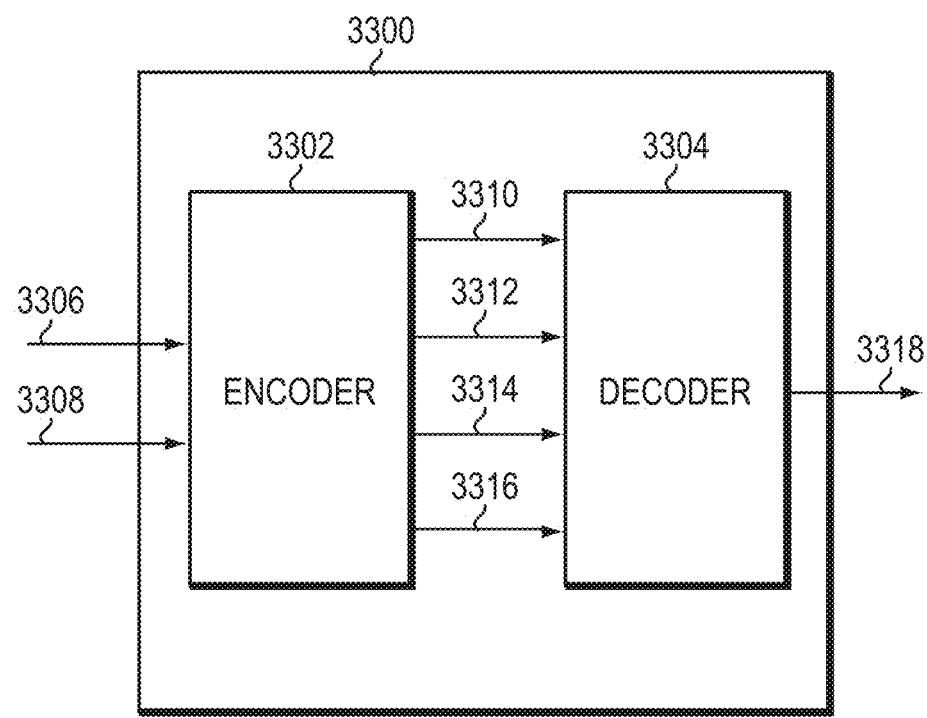
FIG. 33 illustrates one example of an embodiment of an apparatus for compressive sensing configured to determine a translation between two images according to aspects of the present invention.

FIG. 33 illustrates another example of an embodiment of a compressive sensing apparatus 3300. The compressive sensing apparatus 3300 includes an encoder 3302 and a decoder 3304. The encoder 3302 is configured to receive a first input image 3306 and a second input image 3308. For example, the input images 3306 and 3308 may be frames of a video signal. In other embodiments, the encoder 3302 may be configured to receive a different number of input images. In one example, the input images 3306 and 3308 may be the images 3100 and 3102 shown in FIG. 31. The encoder 3302 is configured to acquire a plurality of folds corresponding to the input images 3306 and 3308, for example by being configured to perform acts 3210 and 3220 of the method 3200. The encoder 3302 is configured to output a plurality of folds 3310, 3312, 3314 and 3316. In one example, the folds 3310, 3312, 3314 and 3316 may be the folds 3106, 3108, 3110 and 3112 of FIG. 31. In other embodiments, the encoder may be configured to output a different number of folds.

The decoder 3304 is configured to receive the folds 3310, 3312, 3314 and 3316. The decoder 3304 may further be configured to perform one or more of the acts 3230, 3240, 3250, 3260 and 3270 of the method 3200 and to generate an output signal 3318 indicative of a translation between the first input image 3306 and the second input image 3308. In some embodiments, the apparatus 3300 may include other modules. For example, in one embodiment, the apparatus 3300 may include a phase correlation module configured to receive the folds output from the encoder and to perform one or more of acts 3230, 3240, 3250 and 3260 of the method 3200, and the decoder may be configured to receive peaks corresponding to the phase correlation functions output by the phase correlation module and to perform act 3270 of decoding to generate the output signal 3318.

Analysis of Complexity

Various embodiments of compressive sensing methods disclosed herein may be implemented on hardware, software or a combination thereof. For example, some embodiments may be implemented on one or more apparatuses disclosed herein. Some embodiments may be implemented on one or more computer systems or one or more features of the computer systems as described herein. Various embodiments of compressive sensing apparatuses may include one or more computer systems or features of computer systems.

As described above, previous approaches for translation determination operate on the entire original image frames. In contrast, compressive sensing methods and apparatuses for determining translation according to aspects disclosed herein are based on folded representations of the images. Even without a hardware implementation of folding, various embodiments of compressive sensing methods for translation detection provide computational advantages. Given input images of size N×N, a compressive sensing method for translation determination has complexity that is linear in the number of image pixels, $O(N^2)$, whereas standard phase correlation operating on the full images has complexity $O(N^2 \log N)$. This is because the compressive sensing method is not bound by transform calculations but by folding.

An analysis of the complexity of a compressive sensing method for translation determination is compared herein to a previous approach that operates on an entire image. An analysis of the complexities of exemplary building blocks is presented first.

2-d Fast Fourier Transform (FFT): In one example, assuming row-column decomposition and use of the FFT, the 2-dimensional DFT calculation for an image of size N by N has complexity:

$$O(N(N \log_2 N)+(N(N \log_2 N))=O(N^2 \log_2 N^2=O(N^2 \log N).$$

Phase Correlation: In one example, correlation of two N by N images includes 2 forward DFTs, 1 inverse DFT, and element by element multiplication. It has complexity:

$$O2N^2 \log N+N^2+N^2 \log N)=O(N^2 \log N).$$

Correlation Peak Selection: In one example, finding the maximal peak in the output of circular correlation is $O(N^2)$.

Folding: In one example, the complexity of folding for an image of size N by N is $O(N^2)$. One must add each image pixel to its hashed bin value.

CRT decoding: In one example, Chinese Remainder Theorem decoding of 2 residuals modulo $p_1, p_2$ includes finding 2 modular multiplicative inverses, $p_1^{-1}(\mod p2))$ and $p_2^{-1}(\mod p1))$. In one example, the Extended Euclidean algorithm is used to find the multiplicative inverses and the complexity of doing so is $(\log \min(p_1, p_2))$. The overall CRT decoding algorithm may include multiplying these inverses by the residuals and summing them. Thus, in one example, the overall complexity is $O(2 \log(\min(p_1,p_2))+2O(1)+1O(1))=O(\log(\min(p_1,p_2)))$.

An analysis of the complexity of a compressive sensing method for translation determination is compared next to a previous approach that operates on an entire image. In this example, each of the two inputs images has a size N by N.

Phase correlation on full input images: In one example, this includes correlating the two full input images and searching for the maximal peak. The complexity of this operation is $O(N^2 \log N+N^2=O(N^2 \log N)$.

Compressive sensing method for translation determination: In one example, as described above, this includes folding each input image twice, to size $p_{1a} \times p_{1b}$ and $p_{2a} \times p_{2b}$. Then correlation and peak selection are carried out on the two sets of folds and CRT decoding is performed in each dimension on the location of the identified peak in the two folds. In this example, we will assume $p_{1a} \approx p_{2a} \approx p_{1b} \approx p_{2b} = p$.

This may be good practice such that image content in both folds is jointly maximized. Moreover, we will assume we are using the minimum p necessary to decode the peak at any point in the image. For this, the necessary requirement is that the product of the fold sizes is greater than N, that is $p^2 > N$. This implies that the minimum necessary $p \propto \sqrt{N}$. The complexity of this step is:

$$= O(2N^2 + 2p^2 \log p + 2p^2 + 4\log p)$$
$$= O(2N^2 + p^2 \log p)$$
$$= O(2N^2 + (\sqrt{N})^2 \log \sqrt{N})$$
$$= O(2N^2 + N \log \sqrt{N})$$
$$= O(N^2)$$

Therefore, the compressive sensing method for translation determination brings the complexity down to $O(N^2)$ from $O(N^2 \log N)$ for an approach operating on full images.

Note that this analysis assumes the smallest possible P is able to decode the translation amount (i.e. identify the correct peaks in the folded correlation matrices). As shown and described further below with reference to FIG. 36, we have experimentally verified this to be the case for even relatively large shift amounts with N=1024. The compression ratio at the minimum possible p is $$\approx \frac{p^2}{N^2} = \frac{(\sqrt{N})^2}{N^2} = \frac{1}{N}.$$

Examples of Simulation Results

In this section simulation results are presented for an implementation of one embodiment of compressive sensing for determining translation. In these examples, for simplicity the fold sizes $p_{1a} = p_{1b}$ and $p_{2a} = p_{2b}$.

Figure 34:
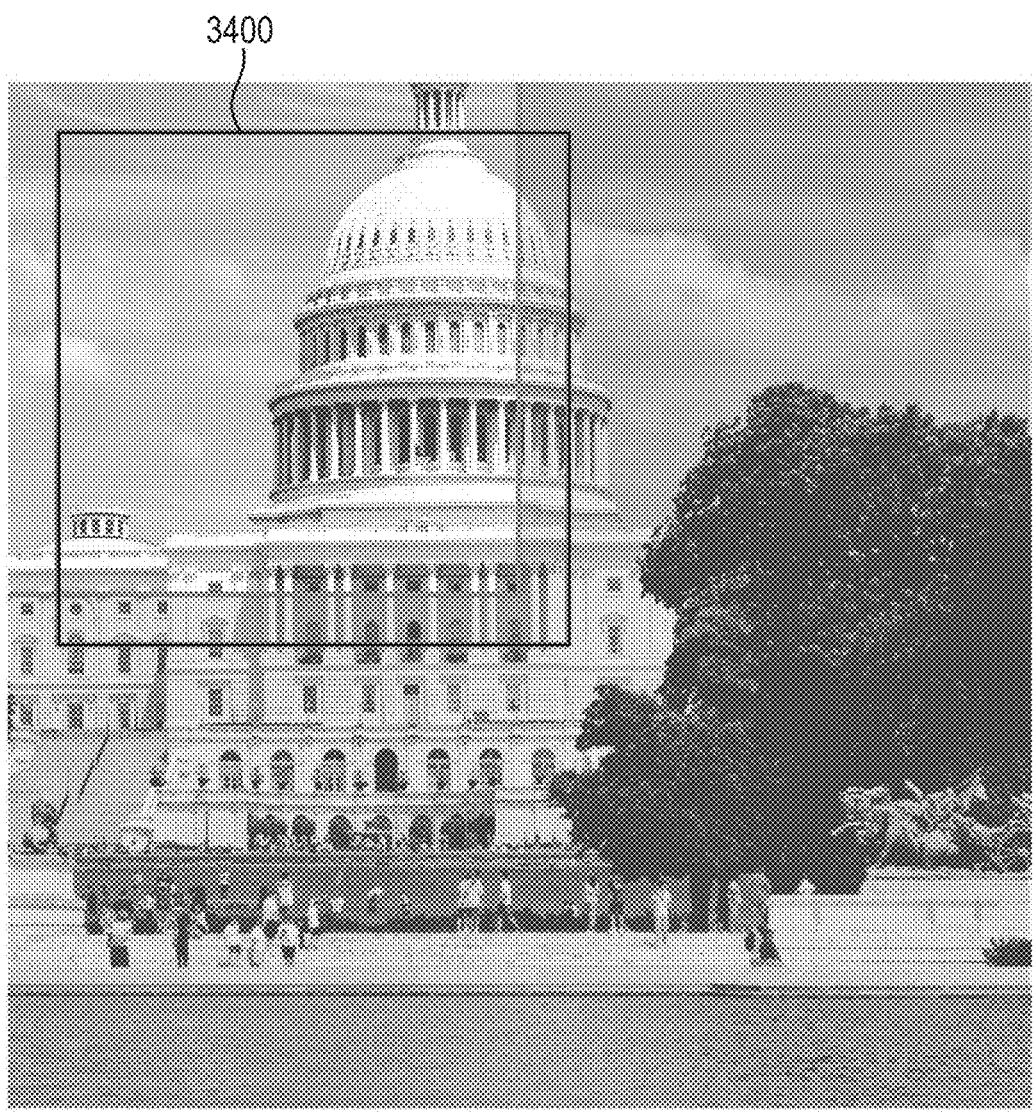
FIG. 34 illustrates a test image used in one example of an application of an embodiment of a compressive sensing method for translation determination according to aspects of the present invention.

FIG. 34 illustrates a test image of size 2048 by 2048 used for the compressive translation determination experiments (Image source: Retrieved online at http://www.stockvault-.net/photo/download/111396, last retrieved November 2012). The upper left quadrant of the image in FIG. 34 is used as the base image, $I_1[x_1, x_2]$, and the rest of the image shows all new image content generated for all possible shifts of $[x_{1t}, x_{2t}]$, for $0 < x_{1t} < 1024$ and $0 < x_{2t} < 1024$. The box 3400 is the outline of an image that is translated relative to the base image (the upper left quadrant) by a translation of [100,100].

FIGS. 35A to 35E illustrate results of applying an embodiment of a compressive sensing method for translation determination to determine translations between the base image in the upper left quadrant of FIG. 34 and all possible shifts (such as all possible shifts of the box 3400 within the image of FIG. 34), at a number of different fold sizes (that is, different compression ratios). For each chart in FIGS. 35A to 35E, shift amounts (translations) along the horizontal and vertical dimensions are shown on the x and y axes respectively. The regions 3500 correspond to translations that were correctly detected and the regions 3502 correspond to translations that were not correctly detected. The curves between the regions 3500 and the regions 3502 in each chart represent the boundaries where there is not enough common image content anymore to correctly register the images.

As shown in FIGS. 35A to 35E, the boundary pushes outward as the fold sizes increase and the corresponding compression level decreases. The results show extremely impressive performance at very high compression levels (corresponding to small fold sizes). For example, FIG. 35A corresponds to the fold sizes (31, 34) which is very close to the maximum amount of dimensionality reduction that may be tolerated (31*34=1054, which is barely above the necessary 1024 for our image size required to correctly decode the shift given the use of the CRT). Even at this extremely high compression level we can still register an impressive amount of all possible shifts. If we restrict the shift amounts we can tolerate to even smaller sizes than the full extent of the image and compression may be increased even more than is shown in the results.

Figure 35:
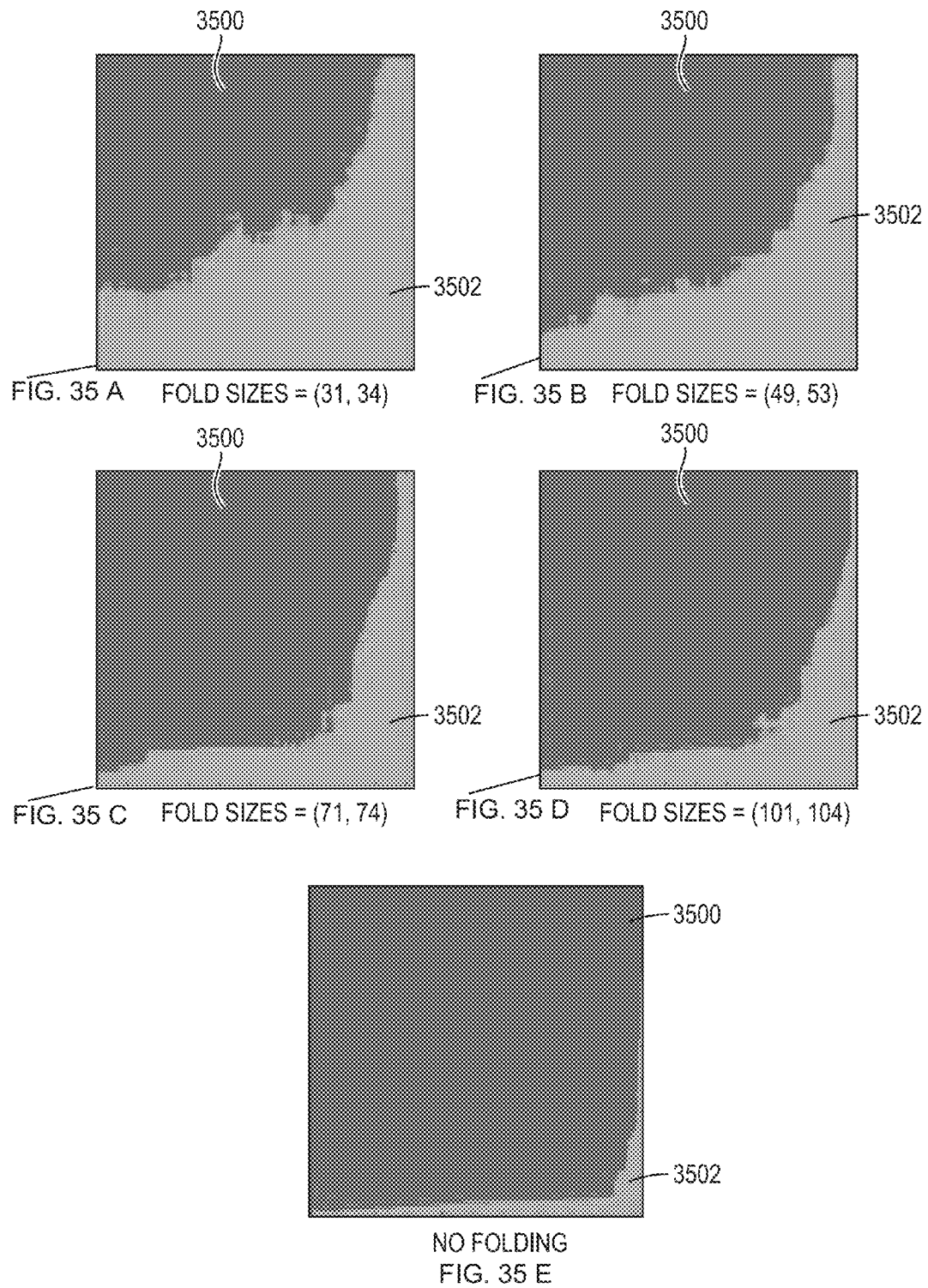
FIGS. 35A to 35E illustrate results of applying an embodiment of a compressive sensing method for translation determination to the test image of FIG. 34 for various fold sizes according to aspects of the present invention.

As a point of comparison, FIG. 35E shows the results of phase correlation on the unfolded image with no compression. The differences between the boundary in FIG. 35E and the other charts in FIGS. 35A to 35D give a measure of the performance cost of folding. The results show that we lose a relatively small amount in performance with a gain of a very large amount of dimensionality reduction.

To get a sense for how well our algorithm performs relative to alternative forms of dimensionality reduction, we compare the performance of running our compressive sensing method for translation determination against phase correlation on reconstructed images using a traditional compressive sensing approach as described earlier. More specifically, for the traditional compressive sensing approach, we use noiselets as the measurement matrix, A, and total variation (TV) minimization as the recovery (image reconstruction) algorithm. This combination tends to work well for natural images. NESTA was the MATLAB optimization package used to carry out the TV minimization.

FIG. 36 is a table of results of comparing one embodiment of a compressive sensing method for translation determination with a traditional compressive sensing (traditional CS) approach for a translation amount of [100, 100] using the image in FIG. 34. The original image in all cases is the 1024 by 1024 upper left quadrant of FIG. 34 and a translation of [100, 100] was used, corresponding to the image outlined by the box 3400. We test performance across a range of compression ratios as shown in FIG. 36, and the number of allowed measurements corresponding to the indicated fold sizes and compression ratio is kept the same across the two methods being compared. For instance fold sizes of $[f_1, f_2]$ correspond to $f_1^2 + f_2^2$ total measurements so the M×N measurement matrix A used in traditional compressive sensing method would have $M = f_1^2 + f_2^2$ (and necessarily $N = 1024^2$). Note that since we are restricting the translation amount for this experiment to [100, 100], we can use fold size pairs whose product is less than 1024 but greater than 100 in order to test the methods at extremely low compression ratios. However these fold sizes could not be used in general because the translation amount is not known a priori.

In FIG. 36, the [100, 100] estimates indicate that the respective method correctly registered the image pairs. It may be observed that the compressive sensing method according to this example (corresponding to the column labeled folding estimate in FIG. 36) significantly outperforms the traditional compressive sensing method. Embodiments of the method of compressive sensing based on folding as described herein may accurately register the translation at compression ratios as low as 0.02%, while the traditional method is ineffective at any compression ratio lower than about 1.3%. This further validates that dimensionality reduction in image feature recovery problems can be further increased by using the compressive sensing methods and apparatuses disclosed herein that aim to directly recover the relevant image features without reconstructing the image or images.

8. COMPRESSIVE ROTATION DETERMINATION

Various embodiments of compressive sensing methods and apparatuses disclosed herein may be used for determining rotation between images based on their folded representations. In one example, the images may be subsequent images of a video signal.

According to one aspect, it is appreciated that rotation does not exhibit quite the same circular shifting phenomenon under folding as in the case of translation. In general, after rotation, completely different sets of pixels from the original image are combined in the bins (buckets) of the folds. This yields methods of measuring the rotation amounts of DFT magnitudes useless. According to one aspect, it is appreciated that the distribution of gradient directions may be utilized for rotation determination. Rotation has the effect of rotating every local gradient direction by the same amount. Moreover, strong gradient directions are preserved through the folding process. The local gradient direction is essentially another example of a local geometric feature that tends to be preserved well under folding.

In various embodiments of compressive sensing for rotation determination, rotation may be determined by examining the distribution of gradient directions between the folded representations of rotated images. The shape of this distribution may be thought of as a signature for the image, and how much that shape shifts by is the rotation amount.

The gradient of an image I (x,y) is defined as $$\nabla f(x, y) = \frac{\partial f(x, y)}{\partial x} \hat{\imath}_x + \frac{\partial f(x, y)}{\partial y} \hat{\imath}_y$$

where $\hat{\imath}x$ and $\hat{\imath}y$ are unit vectors in the horizontal and vertical direction. For discrete signals, the gradient may be approximated by discrete convolutions. In some embodiments, the Sobel operator may be used as an approximation and the partial derivatives for an image $I[x_1,x_2]$ can be approximated as $$\frac{\partial f(x, y)}{\partial x} \approx I_x[x_1, x_2] = I[x_1, x_2] * \begin{bmatrix} -1 & 0 & 1 \\ -2 & 0 & 2 \\ -1 & 0 & 1 \end{bmatrix}$$

$$\frac{\partial f(x, y)}{\partial y} \approx I_y[x_1, x_2] = I[x_1, x_2] * \begin{bmatrix} -1 & -2 & -1 \\ 0 & 0 & 0 \\ 1 & 2 & 1 \end{bmatrix}$$

The magnitude of the gradient is defined as:

$$|\nabla I|[x_1,x_2] = \sqrt{I_x^2[x_1,x_2] + I_y^2[x_1,x_2]}$$

The angle, also called direction, of the gradient is defined as:

$$\Theta[x_1, x_2] = \tan^{-1}\left(\frac{I_y[x_1, x_2]}{I_x[x_1, x_2]}\right)$$

Note that the two-argument arctangent function, $\tan 2^{-1}(I_{x1}, I_{x2})$ may also be used if angle range for the $-\pi < \theta \leq \pi$ is desired instead of the half resolution, $$-\frac{\pi}{2} < \theta < \frac{\pi}{2},$$

provided by $\tan^{-1}$. This change should only be necessary if $|\theta_0| > \pi/2$.

Figure 37:
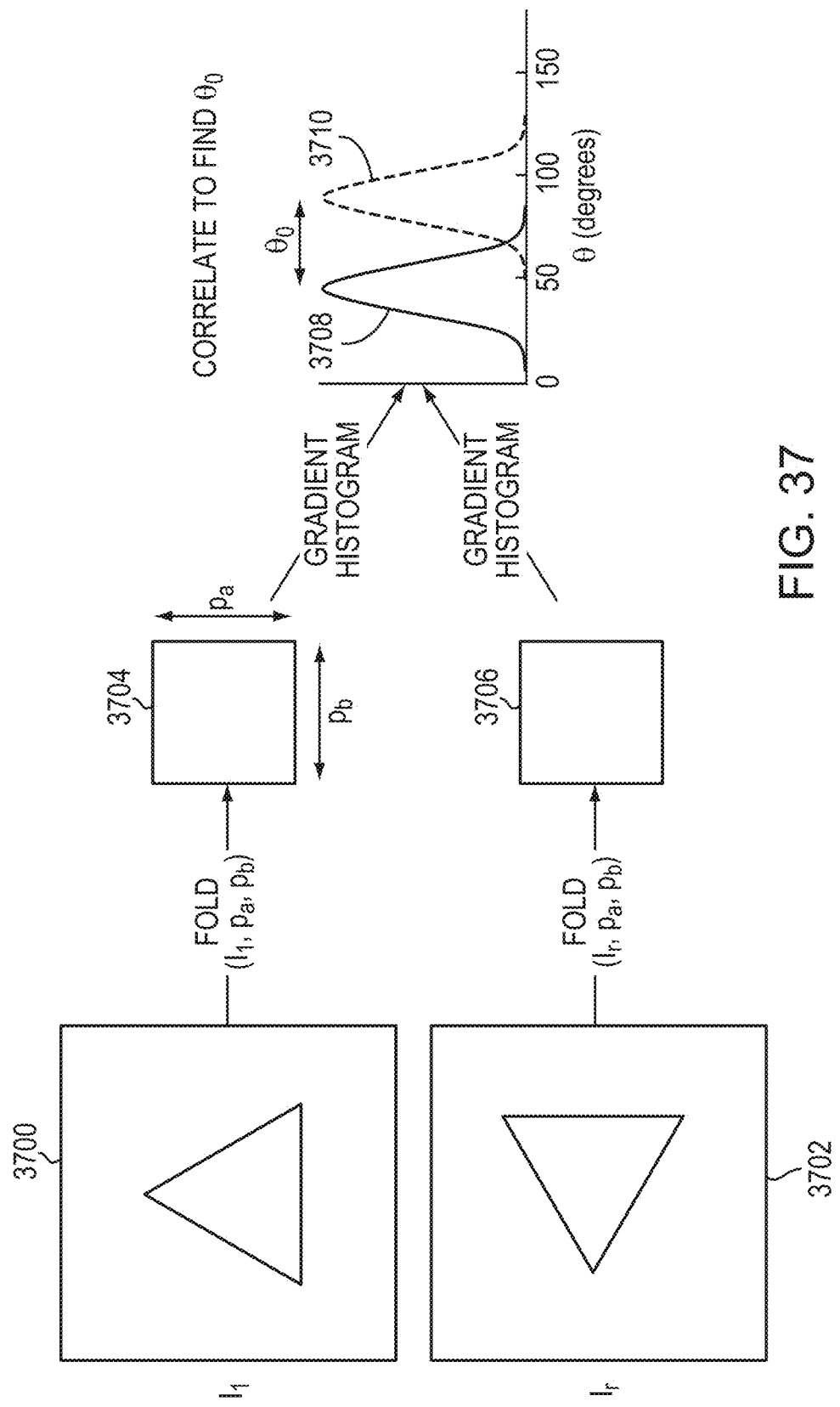
FIG. 37 illustrates one example of a method of compressive sensing for determining a rotation between two images according to aspects of the present invention.

An example of application of a method of compressive sensing for determining a rotation between two images is described next with reference to FIGS. 37 and 38. FIG. 37 illustrates an example of application of one embodiment of the method 3800 of compressive sensing for determining a rotation between two images, such as between a first image 3700 and a second image 3702 shown in FIG. 37. Let $I_1[x_1,x_2]$ and $I_r[x_1,x_2]$ be the original images 3700 and 3702 respectively, where $I_r$ is a rotated version of $I_1$ by an angle $\theta_0$.

In one embodiment, the method 3800 includes an act 3810 of folding a first image to generate a first fold and an act 3820 of folding a second image to generate a second fold. For example, a respective fold may be generated for each of the image 3700 and the image 3702. Referring to FIG. 37, the first image 3700 is folded to generate a fold of $I_1$, that is a first fold 3704 represented by $F_1$=FOLD $(I_1,p_a,p_b)$, where $p_a$ and $p_b$ are fold sizes in each dimension. The second image 3702 is folded to generate a fold of $I_r$, that is a second fold 3706 represented by $F_r$=FOLD$(I_r,p_a,p_b)$.

In various embodiments, the acts 3810 and 3820 of folding each image may be performed substantially in parallel, may be performed sequentially in any order, or may overlap. In some embodiments, folding in acts 3810 and 3820 may include applying a hashing function or applying an error correcting code, as shown for example in method 800 of FIG. 8. In some embodiments, folding may include generating a different number of folds and one or more of the other acts of the method 3800 may be based on a different number of folds.

Compressive sensing may further include determining a rotation between the first image 3700 and the second image 3702 based on the first fold 3704 and the second fold 3706. Determining a rotation based on the folds may include one or more of the acts 3830, 3840 and 3850 of the method 3800.

Figure 38:
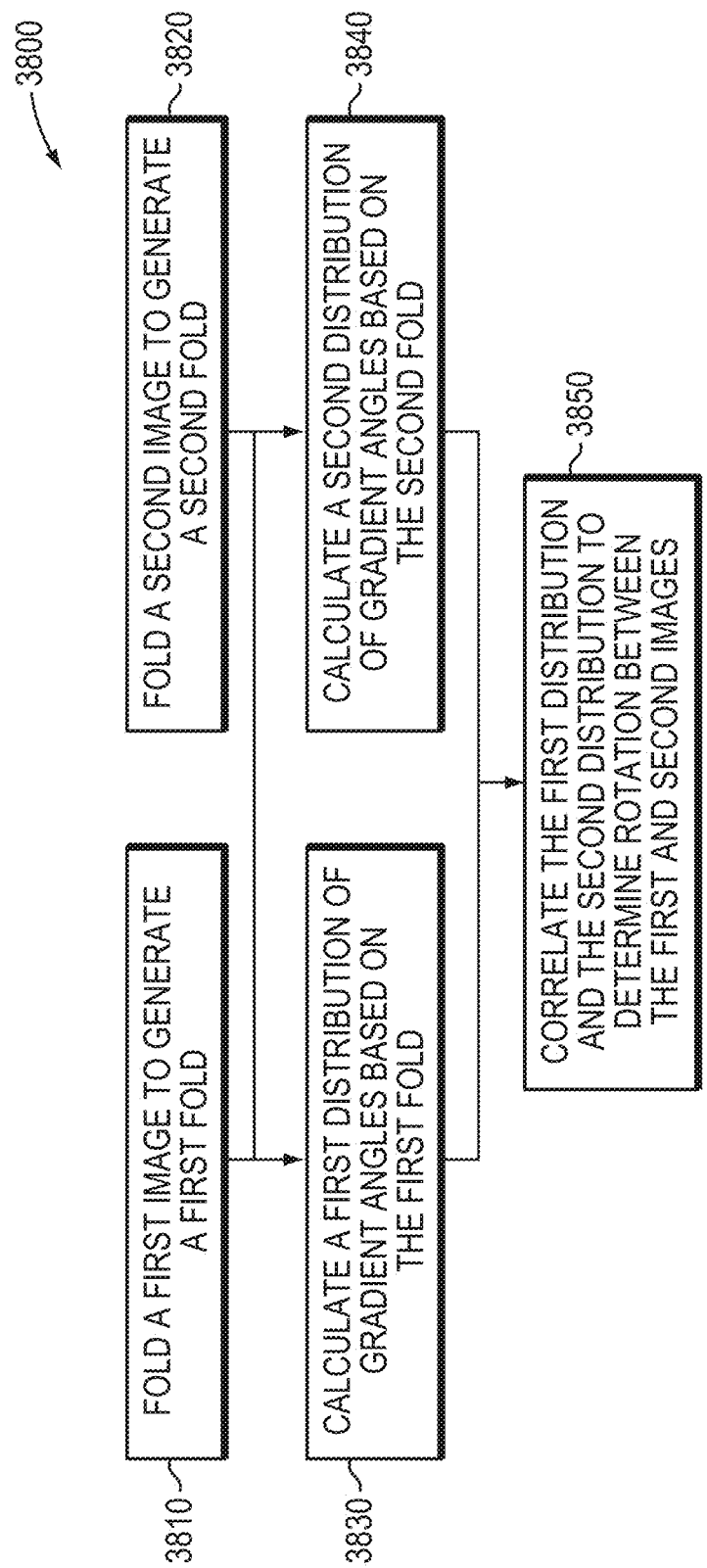
FIG. 38 illustrates one example of a method of compressive sensing for determining a rotation between two images according to aspects of the present invention.

As shown in FIG. 38, the method 3800 further includes an act 3830 of calculating a first distribution of gradient angles based on the first fold and an act 3840 of calculating a second distribution of gradient angles based on the second fold. Referring to FIG. 37, a first distribution of gradient angles 3708 is shown to be calculated based on the first fold 3704 corresponding to the image 3700. A second distribution of gradient angles 3710 is shown to be calculated based on the second fold 3706 corresponding to the image 3702. The distribution of gradient angles may be gradient histograms. In various embodiments, the acts 3830 and 3840 of calculating distributions of gradient angles may be performed substantially in parallel, may be performed sequentially in any order, or may overlap. In various embodiments, the acts 3830 and 3840 may further include one or more of the following:

1. Calculating the gradients of the two folds, such as folds 3704 and 3706 of FIG. 37 (this includes both the horizontal and vertical component for each), $F_{1x}$, $F_{1y}$, $F_{rx}$, $F_{ry}$. Gradients may be calculated for example as described above.

2. Ignoring pixels in the regions near artificial (false) edges created from the folding process (as described for example with reference to FIGS. 18A and 18B). From an implementation perspective, this may be performed for example by setting the gradient to 0 at these pixel values. These pixel values may add very strong arbitrary false votes to angles of $\theta=0$ and $\theta=\pi$ in the next step so we ignore their values.

3. Creating a histogram of N bins of the gradient angles for each fold. Creating a histogram may include creating a weighted histogram. For example, some embodiments may include weighing each angle value's vote by the value of the gradient magnitude, $|\nabla I|$, at that coordinate. That is, if a is the set of all $[x_1,x_2]$ coordinates whose angle $\theta$ maps to bin i, the histogram value for bin i is $\Sigma_{x_1,x_2 \in a}|\nabla I|[x_1,x_2]$. Let $H_l$ and $H_r$ be the N-bin weighted histograms of $\theta_l$ and $\theta_r$, respectively formed from this step.

The method 3800 further includes an act 3850 of correlating the first distribution of gradient angles and the second distribution of gradient angles to determine rotation between the first and second images. In some embodiments, correlating may include circularly correlating $H_l$ and $H_r$ and finding the index of the maximum peak. This value may be scaled by the number of angles per bin based on the N used for the histograms, yielding the rotation $\theta_0$.

According to another aspect, various embodiments of apparatuses configured to perform various methods of compressive sensing as disclosed herein may be provided. In one example, the compressive sensing apparatus 300 of FIG. 3 may be configured according to the method 3800 of FIG. 38. In particular, the lens 302 may receive a first image and a second image that is rotated relative to the first image. The focal plane array 304 may be configured to perform folding according to acts 3810 and 3820 of the method 3800, thereby folding each of the first and second images. In some embodiments, the folds may be digitized by the digitizer 308. In other embodiments, folding by the focal plane array 304 may include digitizing. The decoder 310 may be configured to perform one or more of the acts 3830, 3840 and 3850, thereby recovering a rotation between the images.

Figure 39:
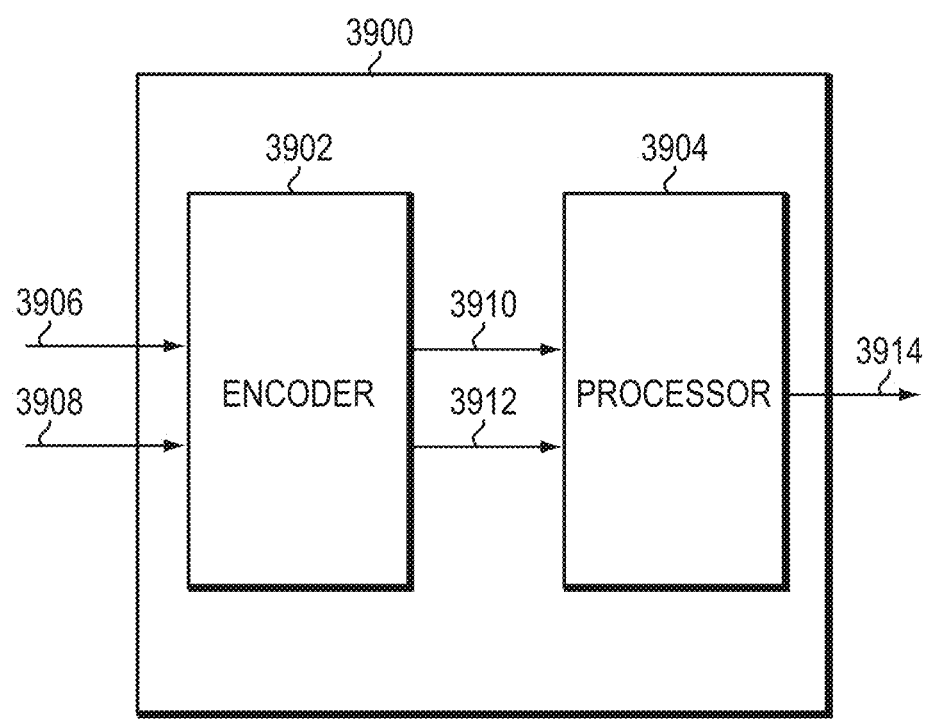
FIG. 39 illustrates one example of an embodiment of an apparatus for compressive sensing configured to determine a rotation between two images according to aspects of the present invention.

FIG. 39 illustrates another embodiment of a compressive sensing apparatus 3900. The compressive sensing apparatus 3900 includes an encoder 3902 and a processor 3904. The encoder 3902 is configured to receive a first input image 3906 and a second input image 3908. For example, the input images 3906 and 3908 may be frames of a video signal. In other embodiments, the encoder 3902 may be configured to receive a different number of input images. In one example, the input images 3906 and 3908 may be the images 3700 and 3702 shown in FIG. 37. The encoder 3902 is configured to acquire folds corresponding to the input images 3906 and 3908, for example by being configured to perform acts 3810 and 3820 of the method 3800. The encoder 3902 is configured to output folds 3910 and 3912. In one example, the folds 3910 and 3912 may be the folds 3704 and 3706 of FIG. 37. In other embodiments, the encoder may be configured to output a different number of folds.

The processor 3904 is configured to receive the folds 3910 and 3912. The processor 3904 may further be configured to perform one or more of the acts 3830, 3840 and 3850 of the method 3800 and to generate an output signal 3914 indicative of a rotation between the first input image 3906 and the second input image 3908. In some embodiments, the apparatus 3900 may include a different number of processors or modules. In some embodiments, the processor 3904 may include one or more features of the computer systems previously described.

Examples of Simulation Results

Figure 40:
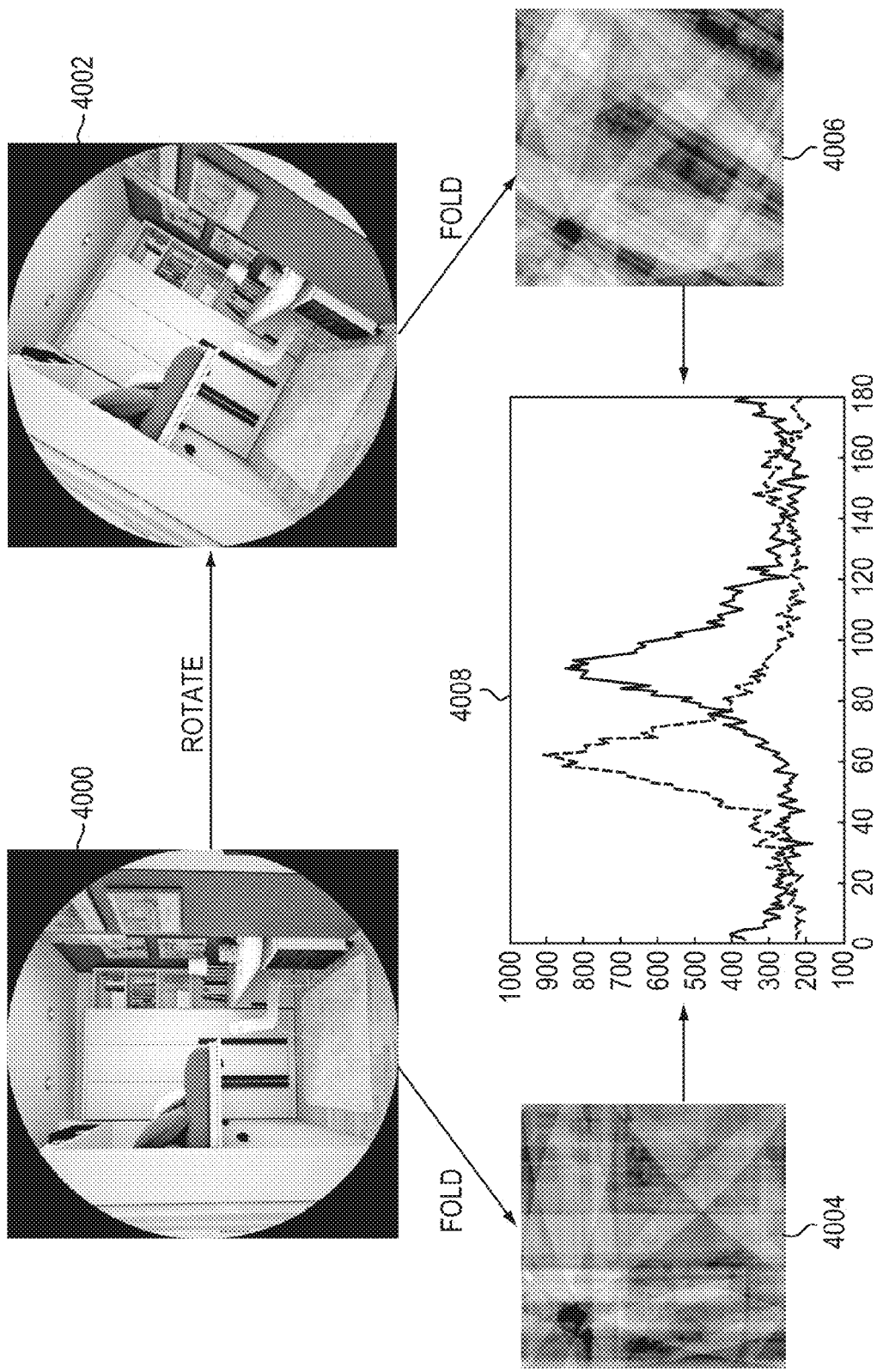
FIG. 40 illustrates one example of an application of a method of compressive sensing for determining a rotation between two images according to aspects of the present invention.

FIG. 40 illustrates one example of the application of the method 3800 of compressive sensing for determining rotation between the image 4000 and the rotated image 4002. The image 4000 is folded to generate a fold 4004 and the image 4002 is folded to generate a fold 4006. The folds 4004 and 4006 are then used to calculate gradients and to generate the graph 4008 showing distribution of gradient angles for each fold. The distributions of gradient angles are then correlated to efficiently recover the rotation.

Figure 41:
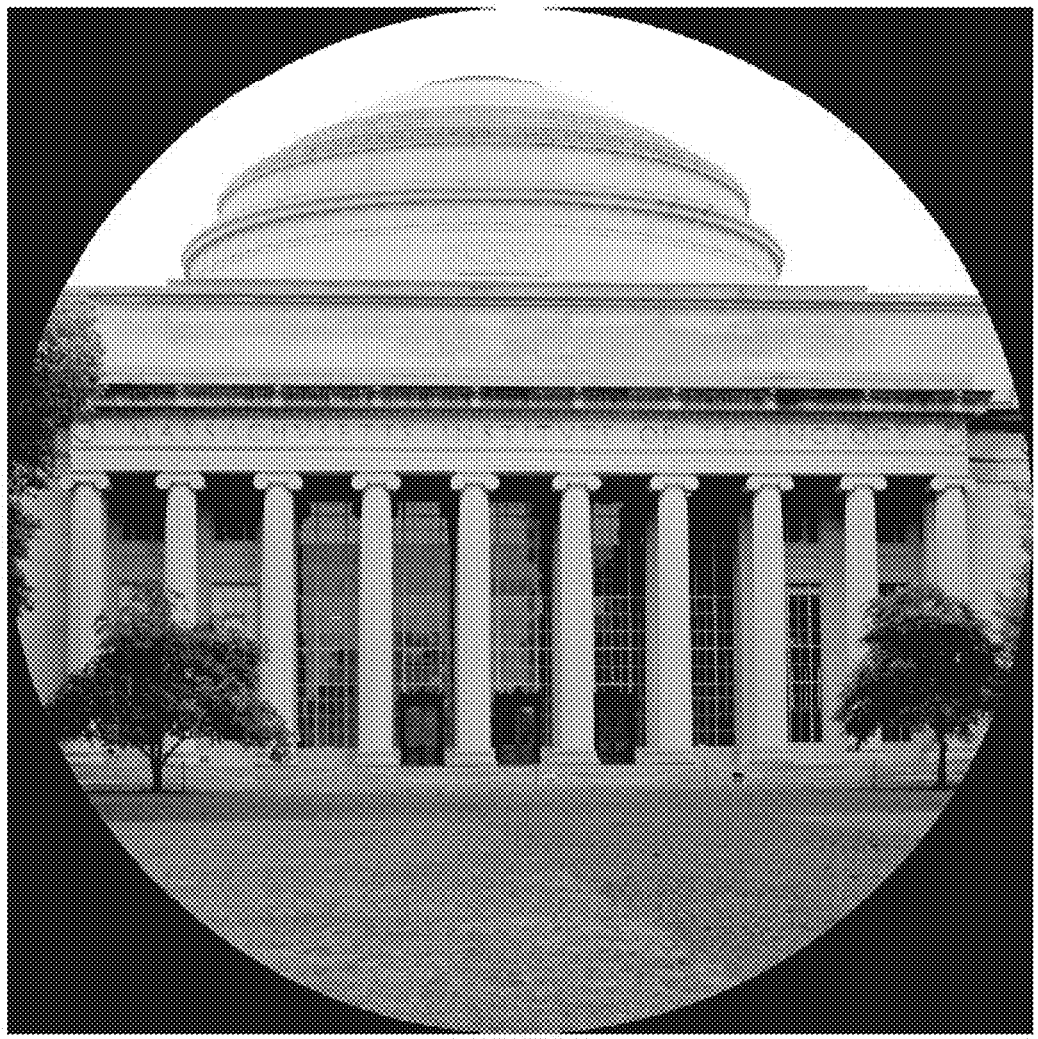
FIG. 41 illustrates a test image used in one example of an application of an embodiment of a compressive sensing method for rotation determination according to aspects of the present invention.

In another example, we rotate a test image through a series of known rotations and measure the error of the compressive sensing method output versus ground truth across different compression levels. FIG. 41 shows a test image used in this experiment (Image source: photographed by an inventor). In these simulations, we restricted image content to the shown circle in FIG. 41 in order to remove the effects of differing image content across the rotations due to occlusion. Because we are rotating by arbitrary angles on a discrete grid, pixels cannot be perfectly moved to their new locations. Bilinear interpolation has been used to extrapolate pixel values from a weighting of the four closest neighbors. In particular, the MATLAB imrotate implementation was used. The rotation amounts are from 1° to 90° at 1° intervals.

Figure 42:
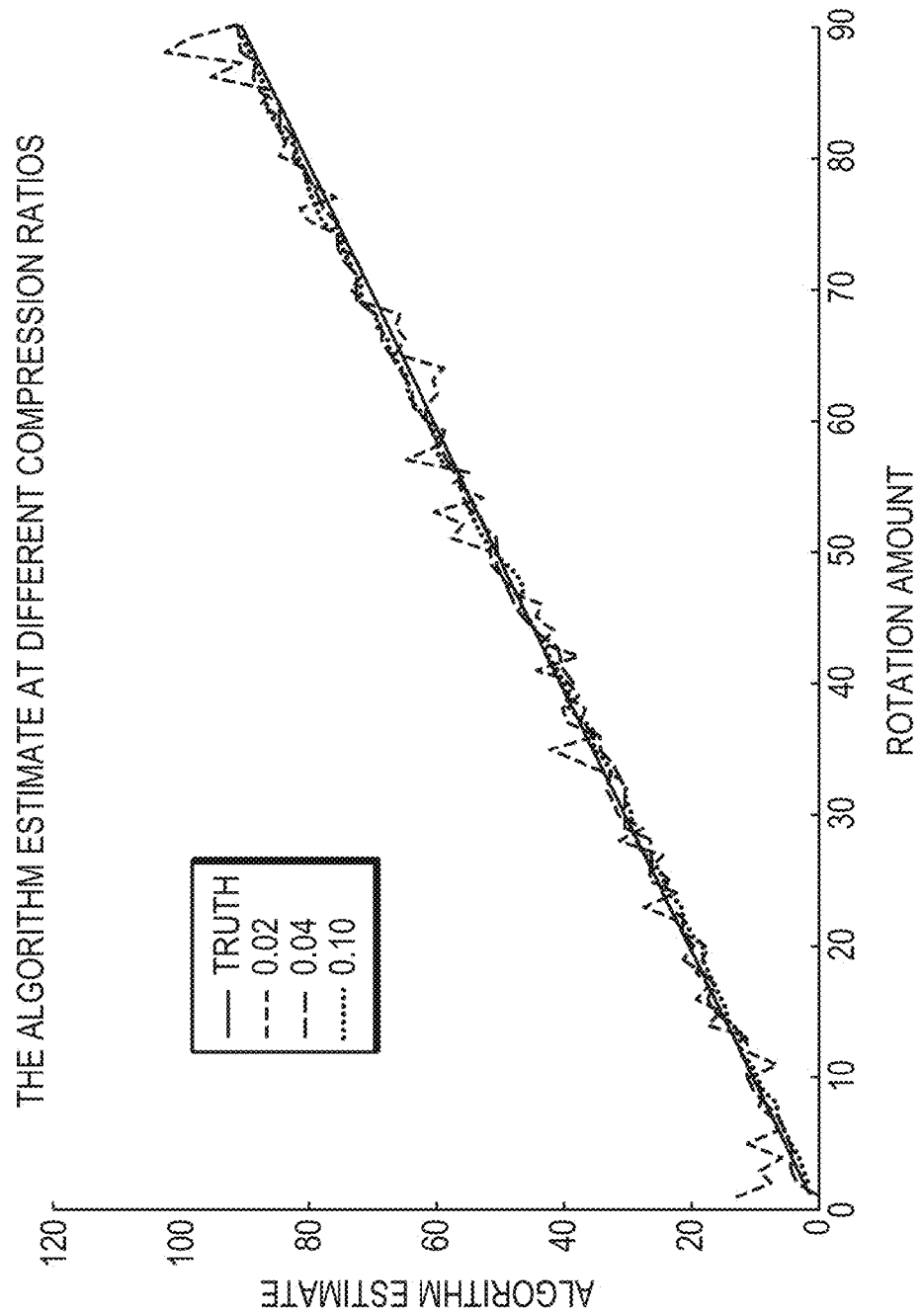
FIG. 42 illustrates results of applying an embodiment of a compressive sensing method for rotation determination to the test image of FIG. 41 for various fold sizes according to aspects of the present invention.

FIG. 42 shows the ground truth rotation and the outputs of an implementation of our compressive sensing method at various compression ratios of 0.02, 0.04 and 0.10 (corresponding to various fold sizes) across the different rotation amounts we perform for the experiment. The results show that the output generated by compressive sensing converges to ground truth as the compression ratio increases (that is, less compression).

FIGS. 43A to 43C show additional results. In FIG. 43A, the L2 or mean squared error of our compressive sensing implementation output versus the ground truth rotation amount is plotted as a function of dimensionality reduction (compression ratio). Performance stabilizes very quickly at low compression rates. Above approximately 3-4% compression ratio all the way to the unfolded version, results are about the same and performance stabilizes very quickly. It should be noted that although the error stabilizes quickly, it does not converge to zero. The error for the unfolded case of no dimensionality reduction can be seen in FIG. 43B.

Another interesting observation is the effect of the histogram size N on the results. In some embodiments, higher histogram sizes may lead to less error because we have higher angle resolution. However, there may be an upper bound since histogram mass can be spread out so much that correlation values become too weak to properly discern the rotation amounts. FIG. 43C shows the mean squared error as a function of compression ratio for a number of different histogram sizes. The results are very similar across different N. Various embodiments of compressive sensing for rotation determination may be configured to use different values of the histogram size parameter.

9. CONCLUSION

Various embodiments of compressive sensing methods disclosed herein may be implemented on hardware, software or a combination thereof. For example, some embodiments may be implemented on one or more apparatuses disclosed herein. Some embodiments may be implemented on one or more computer systems or one or more features of the computer systems as described herein. Various embodiments of compressive sensing apparatuses may include one or more computer systems or features of computer systems.

Figure 44:
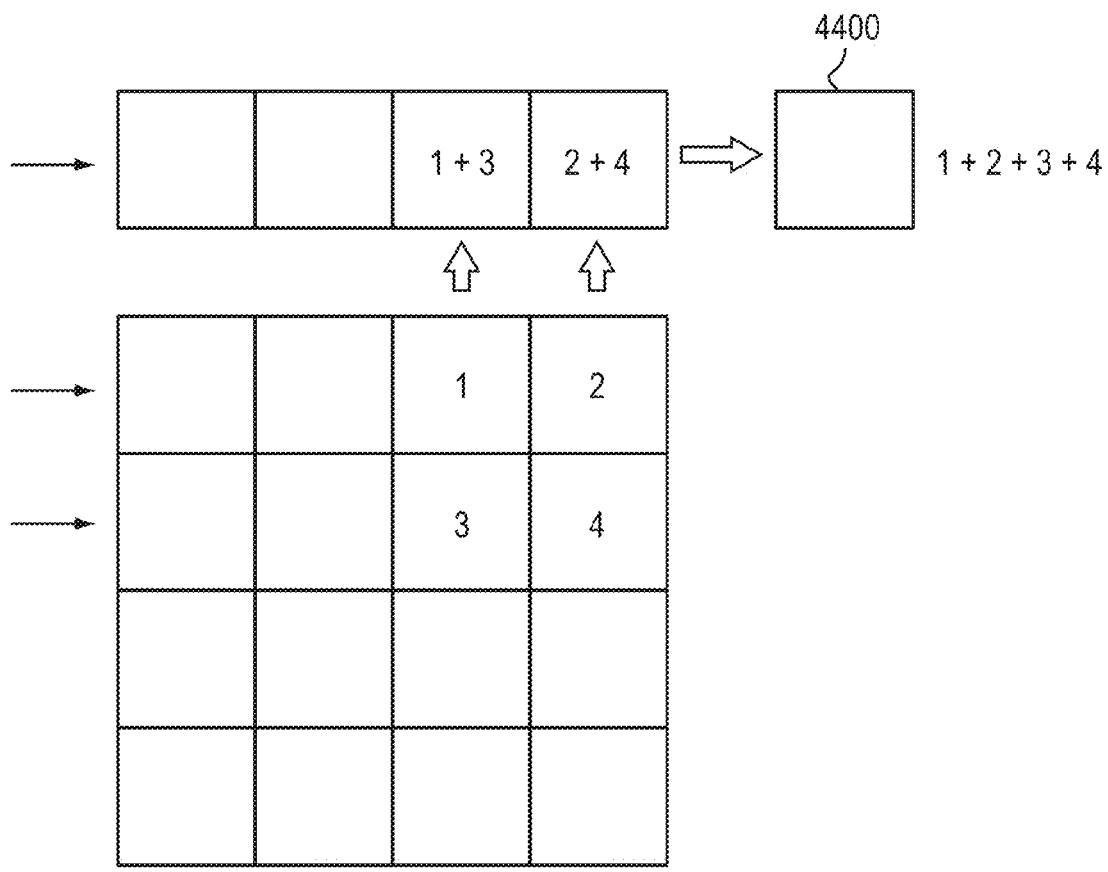
FIG. 44 illustrates one example of an implementation of folding using a focal plane array according to aspects of the present invention.
Figure 45:
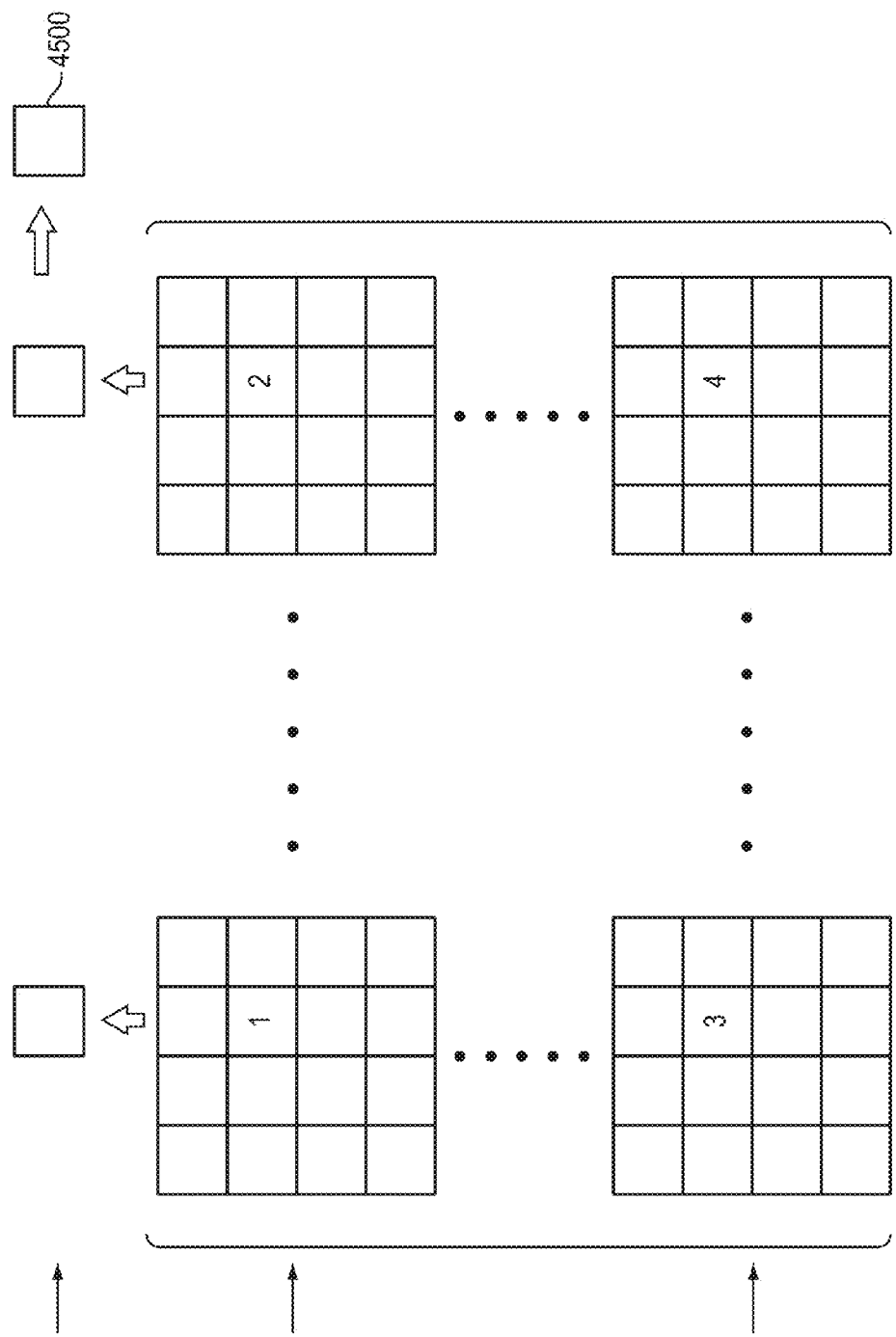
FIG. 45 illustrates another example of an implementation of folding using a focal plane array according to aspects of the present invention.

Various embodiments of compressive sensing systems disclosed herein may include efficient hardware implementations of folding. Power savings from working with dimensionally reduced signals may thereby be gained. In some embodiments, focal plane technology may be used to implement folding. Folding may be implemented by structured binning using a focal plane array. FIGS. 44 and 45 illustrate examples of folding using focal plane arrays. In each case, various pixels are shown to be summed to generate a summed pixel of a fold, such as pixels 4400 and 4500. Other optical implementations of folding may also be used in various embodiments.

Advantages of various methods and systems disclosed herein include efficient and precise recovery of features in the original scene without reconstructing the entire image of the scene, digitization at the encoder at an extremely low rate that beats other known methods and systems, and simple encoders amenable to hardware implementation.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An apparatus for compressive sensing comprising:
   a lens;
   a focal plane array (FPA) coupled to the lens so as to receive an image, the FPA being configured to generate a compressed image at least in part by folding the image, the compressed image including at least one folded image; and
   a decoder configured to receive the compressed image and to recover at least one feature of the image based on the compressed image and without reconstructing the image.

2. An apparatus for compressive sensing comprising:
   a lens;
   a focal plane array (FPA) coupled to the lens so as to receive an image, the FPA being configured to generate a compressed image at least in part by generating a hashed image by applying a hashing function to the image and applying an error correcting code to the hashed image; and
   a decoder configured to receive the compressed image and to recover at least one feature of the image based on the compressed image and without reconstructing the image.

3. The apparatus of claim 2, wherein the hashing function is a pairwise independent hashing function.

4. The apparatus of claim 2, wherein the error correcting code includes at least one of the Chinese Remainder Theorem (CRT) code and the Reed Solomon code.

5. The apparatus of claim 1, further comprising a digitizer configured to receive the compressed image and to output a digitized compressed image, and wherein the decoder is further configured to receive the digitized compressed image and to recover the at least one feature of the image based on the digitized compressed image.

6. The apparatus of claim 1, wherein the decoder is further configured to recover the at least one feature of the image at least in part by:
   generating a plurality of feature vectors based on the compressed image;
   thresholding the plurality of feature vectors to generate a plurality of thresholded feature vectors;
   clustering the plurality of thresholded feature vectors to generate a plurality of clusters; and
   decoding at least one cluster of the plurality of clusters.

7. The apparatus of claim 1, wherein the at least one feature includes at least one of a corner, a muzzle flash, and a star in the received image.

8. The apparatus of claim 1, wherein the FPA is further configured to receive at least two images and generate at least two compressed images at least in part by folding the at least two images, and wherein the decoder is further configured to recover the at least one feature based on the at least two compressed images.

9. The apparatus of claim 8, wherein the at least one feature includes at least one of a rotation between the at least two images and a translation between the at least two images.

10. A method of compressive sensing, comprising:
    receiving, by a focal plane array (FPA) coupled to a lens, an image to provide a received image;
    folding the received image to generate at least one folded image, folding the received image including superimposing a plurality of non-overlapping subsections of the image to generate the at least one folded image; and
    recovering from the at least one folded image, by at least one processor coupled to the FPA, at least one feature of the image without reconstructing the received image.

11. The method of claim 10, wherein folding the received image includes:
    generating a hashed image by applying a hashing function to the received image; and
    applying an error correcting code to the hashed image.

12. The method of claim 10, wherein the at least one feature includes at least one of a corner, a muzzle flash, and a star in the received image.

13. The method of claim 10, wherein receiving the image includes receiving at least two images, and wherein folding the received image includes folding the at least two images to generate at least two folded images.

14. The method of claim 13, wherein recovering the at least one feature includes recovering, based on the at least two folded images, at least one of a rotation between the two images and a translation between the two images.

15. The method of claim 10, further comprising digitizing, by a digitizer, the at least one folded image to generate a corresponding at least one digitized folded image, and wherein recovering from the at least one folded image includes recovering from the corresponding at least one digitized folded image.

16. An apparatus for compressive sensing, comprising:
    a memory;
    at least one processor coupled to the memory, the at least one processor configured to:
      receive a compressed image, the compressed image being compressed at least in part by folding an original image, such that the compressed image includes at least one folded image;
      generate a plurality of feature vectors based on the compressed image;
      threshold the plurality of feature vectors to produce a plurality of thresholded feature vectors;
      cluster the plurality of thresholded feature vectors to generate a plurality of clusters; and
      recover at least one feature of the original image by decoding at least one cluster of the plurality of clusters.

17. The apparatus of claim 16, wherein the at least one feature includes at least one of a corner, a muzzle flash, and a star in the original image.

18. The apparatus of claim 2, further comprising a digitizer configured to receive the compressed image and to output a digitized compressed image, and wherein the decoder is further configured to receive the digitized compressed image and to recover the at least one feature of the image based on the digitized compressed image.

19. The apparatus of claim 2, wherein the decoder is further configured to recover the at least one feature of the image at least in part by:
   generating a plurality of feature vectors based on the compressed image;
   thresholding the plurality of feature vectors to generate a plurality of thresholded feature vectors;
   clustering the plurality of thresholded feature vectors to generate a plurality of clusters; and
   decoding at least one cluster of the plurality of clusters.

20. The apparatus of claim 2, wherein the FPA is further configured to receive at least two images and generate at least two compressed images, and wherein the decoder is further configured to recover the at least one feature based on the at least two compressed images.

21. The apparatus of claim 20, wherein the at least one feature includes at least one of a rotation between the at least two images and a translation between the at least two images.

* * * * *